(12) United States Patent
Michiyama et al.

(10) Patent No.: US 8,901,480 B2
(45) Date of Patent: Dec. 2, 2014

(54) OPTICAL SENSOR HAVING A BLOCKING FILM DISPOSED OVER LIGHT RECEIVING ELEMENTS ON A SEMICONDUCTOR SUBSTRATE VIA A LIGHT TRANSPARENT FILM FOR DETECTING AN INCIDENT ANGLE OF LIGHT

(75) Inventors: Katsunori Michiyama, Toyota (JP); Takamitsu Ookura, Kariya (JP); Noboru Endoh, Anjo (JP); Yasuaki Makino, Okazaki (JP); Takanori Makino, Ogaki (JP); Jyun Ishihara, Kariya (JP)

(73) Assignee: DENSO CORPORATION, Kariya (JP)

( * ) Notice: Subject to any disclaimer, the term of this patent is extended or adjusted under 35 U.S.C. 154(b) by 149 days.

(21) Appl. No.: 13/637,545

(22) PCT Filed: Sep. 5, 2011

(86) PCT No.: PCT/JP2011/004949
§ 371 (c)(1),
(2), (4) Date: Sep. 26, 2012

(87) PCT Pub. No.: WO2012/032753
PCT Pub. Date: Mar. 15, 2012

(65) Prior Publication Data
US 2013/0037700 A1    Feb. 14, 2013

(30) Foreign Application Priority Data

| | | |
|---|---|---|
| Sep. 10, 2010 | (JP) | 2010-203294 |
| Sep. 10, 2010 | (JP) | 2010-203295 |
| Sep. 15, 2010 | (JP) | 2010-206974 |
| Nov. 10, 2010 | (JP) | 2010-252170 |
| Jan. 6, 2011 | (JP) | 2011-1100 |
| Jan. 6, 2011 | (JP) | 2011-1101 |
| Jan. 6, 2011 | (JP) | 2011-1102 |
| Jan. 6, 2011 | (JP) | 2011-1103 |
| Jan. 27, 2011 | (JP) | 2011-15417 |

(51) Int. Cl.
| | |
|---|---|
| *H01J 5/02* | (2006.01) |
| *H01L 31/0216* | (2014.01) |
| *G01J 1/02* | (2006.01) |
| *G01J 1/06* | (2006.01) |
| *G01J 1/44* | (2006.01) |
| *H01L 27/146* | (2006.01) |
| *H01L 27/144* | (2006.01) |

(52) U.S. Cl.
CPC ......... *H01L 31/02164* (2013.01); *G01J 1/0266* (2013.01); *G01J 1/06* (2013.01); *G01J 1/44* (2013.01); *H01L 27/14605* (2013.01); *H01L 27/14623* (2013.01); *H01L 27/14625* (2013.01); *H01L 27/1446* (2013.01)
USPC .......................................... 250/239; 250/216

(58) Field of Classification Search
USPC ........ 250/239, 216, 214.1, 221, 203.4, 208.1; 356/121–138, 450, 620, 139.02
See application file for complete search history.

(56) References Cited

U.S. PATENT DOCUMENTS

| | | | |
|---|---|---|---|
| 5,117,744 A | 6/1992 | Zimmer et al. | |
| 5,483,060 A | 1/1996 | Sugiura et al. | |
| 5,602,384 A | 2/1997 | Nunogaki et al. | |
| 6,297,740 B1 | 10/2001 | Hill et al. | |
| 6,521,882 B1 | 2/2003 | Sumiya et al. | |
| 6,597,287 B1 | 7/2003 | Steinel | |
| 6,875,974 B2 | 4/2005 | Muesch et al. | |
| 8,619,249 B2 * | 12/2013 | Meijer et al. | 356/138 |
| 2007/0002407 A1 | 1/2007 | Kageyama et al. | |
| 2007/0120982 A1 | 5/2007 | Oita et al. | |
| 2009/0235920 A1 | 9/2009 | Wang | |
| 2009/0295640 A1 | 12/2009 | Shimizu | |
| 2010/0013969 A1 | 1/2010 | Ui | |
| 2010/0238430 A1 | 9/2010 | Meijer et al. | |

FOREIGN PATENT DOCUMENTS

| | | |
|---|---|---|
| GB | 2270230 A | 3/1994 |
| JP | S54-103073 A | 8/1979 |
| JP | 63-23607 U | 2/1988 |
| JP | 63-116458 A | 5/1988 |
| JP | 02-081449 A | 3/1990 |
| JP | 3052208 A | 3/1991 |
| JP | 5235404 A | 9/1993 |
| JP | 6147978 A | 5/1994 |
| JP | 713518 A | 1/1995 |
| JP | 743208 A | 2/1995 |
| JP | 8145788 A | 6/1996 |
| JP | 8313341 A | 11/1996 |
| JP | 915040 A | 1/1997 |
| JP | 11205659 A | 7/1999 |
| JP | 2000-236478 A | 8/2000 |
| JP | 2001174325 A | 6/2001 |
| JP | 2001237404 A | 8/2001 |
| JP | 2004226110 A | 8/2004 |
| JP | 2005-249478 A | 9/2005 |
| JP | 200680937 A | 3/2006 |
| JP | 2006-093292 A | 4/2006 |
| JP | 2007207789 A | 8/2007 |
| JP | 2007-243744 A | 9/2007 |
| JP | 2009150699 A | 7/2009 |
| JP | 2009-282406 A | 12/2009 |
| JP | 2010112808 A | 5/2010 |
| JP | 2010134042 A | 6/2010 |

OTHER PUBLICATIONS

Office Action mailed Aug. 19, 2014 issued in corresponding JP patent application No. 2011-001101 (and English translation).
Office Action mailed Jan. 7, 2014 issued in corresponding JP patent application No. 2010-203294 (and English translation).
Office Action mailed Jan. 7, 2014 issued in corresponding JP patent application No. 2011-001100 (and English translation).
Office Action mailed Jan. 7, 2014 issued in corresponding JP patent application No. 2011-001101 (and English translation).
Office Action mailed Jan. 14, 2014 issued in corresponding JP patent application No. 2010-203295 (and English translation).
Office Action mailed Apr. 22, 2014 issued in corresponding JP patent application No. 2010-252170 (and English translation).
Office Action mailed Aug. 6, 2013 issued in corresponding JP patent application No. 2011-015417 (and English translation).
Office Action mailed Sep. 3, 2013 issued in corresponding JP patent application No. 2010-252170(and English translation).
International Search Report of the International Searching Authority mailed Dec. 6, 2011 for the corresponding international application No. PCT/JP2011/004949 (with English translation).
Office Action mailed Jul. 29, 2014 issued in corresponding JP patent application No. 2011-001100 (and English translation).
Office Action mailed Aug. 5, 2014 issued in corresponding JP patent application No. 2010-203294 (and English translation).
Office Action mailed Jan. 7, 2014 issued in corresponding JP patent application No. 2010-001100 (and English translation).
Office Action mailed Jan. 7, 2014 issued in corresponding JP patent application No. 2010-001101 (and English translation).

* cited by examiner

*Primary Examiner* — Que T Le
(74) *Attorney, Agent, or Firm* — Posz Law Group, PLC

(57) ABSTRACT

An optical sensor includes: first and second light receiving elements on a semiconductor substrate; a light blocking film over the semiconductor substrate via a light transmitting film; and first and second openings corresponding to the light receiving elements and disposed in the light blocking film. First and second virtual lines are defined to extend from the centers of the first and second light receiving elements and pass through the centers of the first and second openings, respectively. At least one of elevation angles and left-right angles of the first and second virtual lines are different. The photosensitive area of the first light receiving element is larger than the aperture area of the first opening. The photosensitive area of the second light receiving element is larger than the aperture area of the second opening.

54 Claims, 27 Drawing Sheets

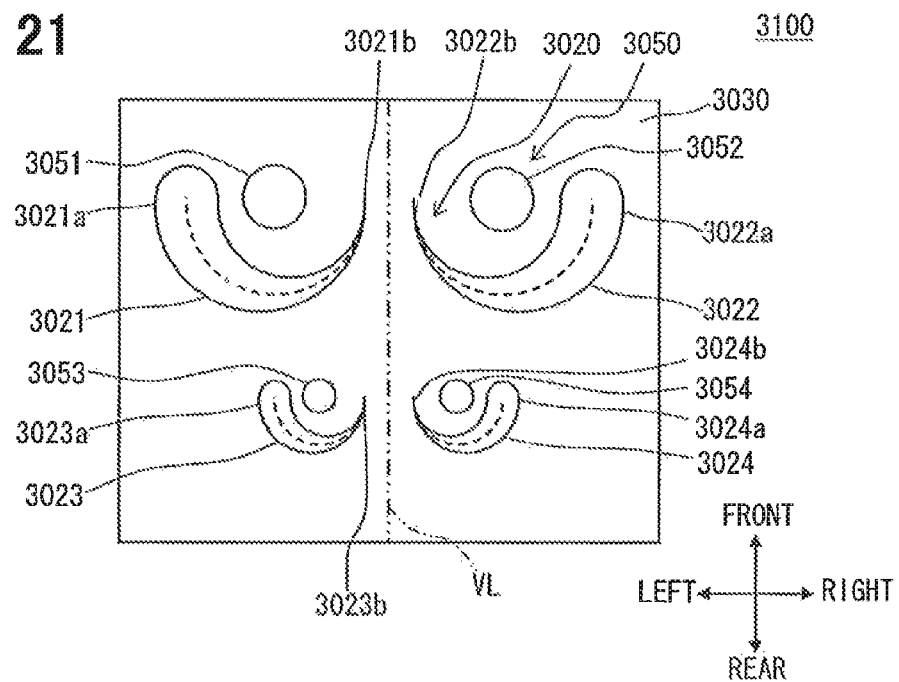
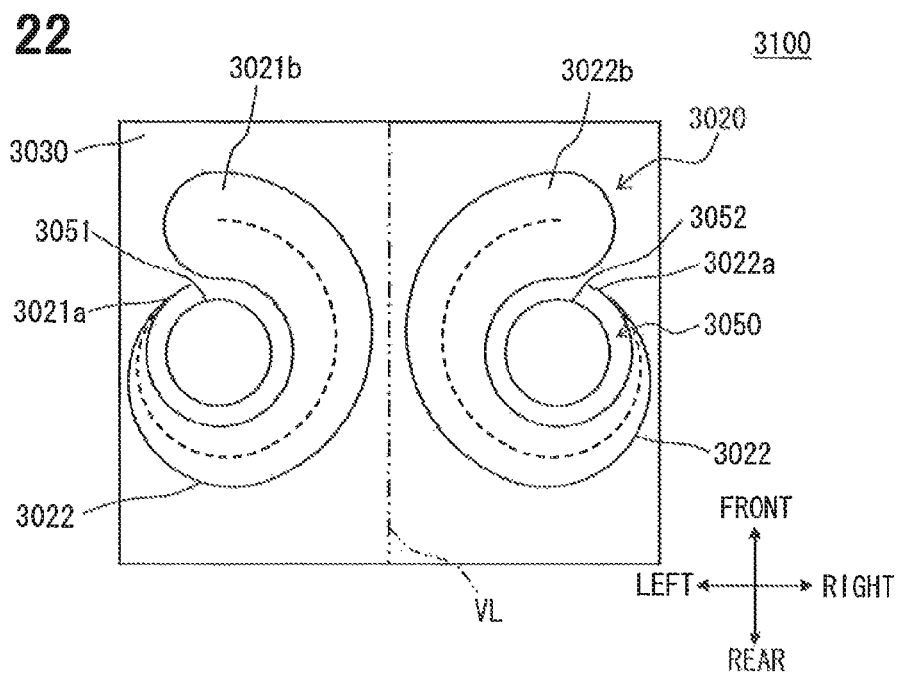

OPTICAL SENSOR HAVING A BLOCKING FILM DISPOSED OVER LIGHT RECEIVING ELEMENTS ON A SEMICONDUCTOR SUBSTRATE VIA A LIGHT TRANSPARENT FILM FOR DETECTING AN INCIDENT ANGLE OF LIGHT

CROSS REFERENCE TO RELATED APPLICATIONS

This application is based on Japanese Patent Applications No. 2010-203294 field on Sep. 10, 2010, No. 2010-203295 filed on Sep. 10, 2010, No. 2010-206974 filed on Sep. 15, 2010, No. 2010-252170 filed on Nov. 10, 2010, No. 2011-1100 filed on Jan. 6, 2011, No. 2011-1101 filed on Jan. 6, 2011, No. 2011-1102 filed on Jan. 6, 2011, No. 2011-1103 filed on Jan. 6, 2011, and No. 2011-15417 filed on Jan. 27, 2011, the disclosures of which are incorporated herein by reference.

TECHNICAL FIELD

The present invention relates to an optical sensor in which a plurality of light receiving elements each for converting light to an electric signal are formed on a semiconductor substrate, a light blocking film is formed over the surface of the semiconductor substrate where the light receiving elements are formed via a light transparent film, and openings for transmitting light corresponding to the respective light receiving elements are formed in the light blocking film.

BACKGROUND ART

Conventionally, as shown in, e.g., Patent Document 1, an optical sensor has been proposed in which a plurality of photodiodes are formed on a semiconductor substrate, a light transparent layer having a light transparent property is formed on the surface thereof where the photodiodes are formed, a light blocking mask having a light blocking property is formed on the upper surface of the light transparent layer, and a plurality of light propagation areas are formed in the light blocking mask. In the optical sensor, by the light propagation areas of the light blocking mask, the range of light incident on the light receiving surface of each of the photodiodes, especially the elevation angle thereof is defined.

In the optical sensor shown in Patent Document 1, as shown in FIG. 1 of Patent Document 1, the area of the light receiving surface of each of the photodiodes is substantially the same as that of each of the light propagation areas. Accordingly, the angle range (directivity) of the light incident on the light receiving surface of each of the photodiodes is narrow, which may cause the problem that light having a given angle cannot be detected with the photodiode. Therefore, in the case of the structure of the optical sensor described in Patent Document 1, it may be difficult to detect the intensity of light (amount of incident light) or the angles (elevation angle and light-right angle) thereof based on an output signal from each of the photodiodes.

Also, in the optical sensor shown in Patent Document 1, the one-layer light blocking mask is formed on the upper surface of the light transparent layer. In the case of this configuration, light incident from a given one of the light propagation areas may be incident on the photodiode which does not correspond to the given light propagation area via the light transparent layer. As a result, an output signal from the photodiode may include a light output (disturbance output) from the unintended light propagation area.

Also, in the optical sensor shown in Patent Document 1, the two paired photodiodes are adjacent in a right-left direction, and the range of light incident on the light receiving surface of each of the two photodiodes is defined by the one of the light propagation areas located over the two photodiodes. Accordingly, when light is incident on the optical sensor from the left side, an output signal from the right photodiode is larger than an output signal from the left photodiode. Conversely, when light is incident on the optical sensor from the right side, the output signal from the left photodiode is larger than the output signal from the right photodiode. Therefore, by comparing the output signals from the two paired photodiodes with each other, it is possible to detect from which one of the left and right sides light is incident.

In the configuration described above, it is possible to calculate a value (first value) by dividing the output signal from the left photodiode by the total sum of the output signals from the two paired photodiodes, calculate a value (second value) by dividing the output signal from the right photodiode by the total sum of the output signals from the two paired photodiodes, determine a ratio between the two values, and thereby detect how much light is incident on the optical sensor from the left side or from the right side. That is, the right-left ratio of light can be detected.

However, the right-left ratio has a property of varying in accordance with the elevation angle of light and, with only the right-left ratio, a precise incident direction (elevation angle and right-left angle) of light cannot be detected.

Moreover, when there is an angle of light particularly desired to be detected to meet a use purpose, the light propagation areas should be produced again according to the use purpose, which results in the problem of low versatility.

Also, in Patent Document 1, the light blocking mask is formed on the surface (right receiving surface) where the photodiodes are formed via the light transparent layer, and the light propagation areas are formed in the light blocking mask. Light coming obliquely from above and incident on the light receiving surface of each of the photodiodes is blocked by the light blocking mask, but the range in which the light is incident on the surface where the photodiodes are formed depends on the distance between the light receiving surface and the light propagation area. In Patent Document 1, the distance therebetween is determined by the thickness of the light transparent layer and, because the thickness is small, the range of the light incident on the surface where the photodiodes are formed is narrow.

This results in a case where, depending on the incident direction of light, the light is incident on the light receiving surface of the left photodiode, but is not incident on the light receiving surface of the right photodiode. In this case, the output signal from the right photodiode is zero so that the total sum of the output signals from the two photodiodes is equal to the output signal from the left photodiode, the first value is 1, and the second value is 0. Conversely, when the light is incident on the light receiving surface of the right photodiode but is not incident on the light receiving surface of the left photodiode, the output signal from the left photodiode is zero so that the total sum of the output signals from the two photodiodes is equal to the output signal from the right photodiode, the first value is 0, and the second value is 1. Thus, each of the values is constant (saturated) so that, even though it is possible to detect from which one of the left and right sides the light is incident, it is impossible to detect the right-left ratio of the light corresponding to the incident angles of the light.

Also, as shown in, e.g., Patent Document 2, a semiconductor device has conventionally been proposed in which a photosensor and a signal processing circuit are formed in a semiconductor chip. In this semiconductor device, over the photosensor and a signal processing circuit, a first light-transmissive insulating film, a light-transmissive interlayer insulating film, a light blocking film having a window opened therein to expose a light receiving surface, and a light-transmissive chip protecting film are successively stacked in layers, and the other layers stacked on the light receiving surface of the first light-transmissive insulating film are removed to expose the first light-transmissive insulating film. This allows the intensity of light incident on the semiconductor device to be accurately detected even when the intensity of the light is extremely low. In addition, when the light is incident on the multilayer film, the light advances while being reflected and transmitted between the layers before reaching the photosensor so that the light incident on the photosensor undergoes intensity variations due to interference. However, since the other layers stacked on the light receiving surface of the first light-transmissive insulating film have been removed, the light incident on the photosensor is inhibited from including the intensity variations due to interference.

The amount of light (intensity of light) incident on the photosensor depends on the incident angles of the light. However, the semiconductor device shown in Patent Document 2 does not have the function of detecting the incident angles of light. Consequently, the detected light intensity includes intensity variations in accordance with the incident angles of the light so that the accuracy of detection of the light intensity has presented a problem.

Also, as shown in, e.g., Patent Document 3, an optical sensor has conventionally been proposed which includes light receiving elements each for outputting a signal in accordance with the amount of light, and a light-amount changing member supported over the light receiving elements to change the amount of light to each of the light receiving elements in accordance with the incident angles of the light. To each of the light receiving elements, a current-voltage conversion circuit including an operational amplifier and laser trimming resistors is connected. By adjusting the resistance value of each of the laser trimming resistors, the gain of an output signal from each of the light receiving elements is adjusted.

As described above, in the optical sensor shown in Patent Document 3, the current-voltage conversion circuit is connected to each of the light receiving elements, and the resistance values of the laser trimming resistors, the number of which is the same as that of the light receiving elements, are adjusted by laser trimming. Accordingly, the problem of increased cost may occur.

Also, as shown in, e.g., Patent Document 4, an optical sensor has conventionally been proposed which includes a light receiving means in which a plurality of light receiving elements are arranged in the form of a matrix, a defining means for defining the range of radiation of incident light radiated toward the plurality of light receiving elements in accordance with the incident angles of light incident on the light receiving means, and an amplifying means for amplifying a detection signal outputted from each of the plurality of light receiving elements with an amplification factor set based on the position of the light receiving element, and outputting the amplified detection signal. As shown in FIGS. 1 to 3 of Patent Document 4, a cover is provided over the light receiving means, and has a light blocking plate (defining means) having one light passing hole formed in the middle thereof. The optical sensor has a configuration in which the aperture area of the light passing hole is larger than light receiving area of each of the light receiving elements, and light incident on the light receiving means through the light passing hole is incident on the plurality of light receiving elements.

As described above, in the optical sensor shown in Patent Document 4, the one light passing hole corresponds to the plurality of light receiving elements, and the aperture area is larger than the light receiving area. Accordingly, the angle range (directivity) of light incident on the light receiving surface of each of the light receiving elements is wide so that a difference is less likely to occur between the directivity characteristics of the respective light receiving elements. As a result, when the incident angles of light are to be detected based on respective output signals from the plurality of light receiving elements, the accuracy of detection of the incident angles may present a difficulty.

PRIOR ART DOCUMENTS

Patent Documents

Patent Document 1: U.S. Pat. No. 6,875,974
Patent Document 2: Japanese Unexamined Patent Publication No. S63-116458
Patent Document 3: Japanese Patent No. 3882378
Patent Document 4: Japanese Unexamined Patent Publication No. 2005-249478

SUMMARY OF INVENTION

The present disclosure has been achieved in view of the foregoing problems, and a first object thereof is to provide an optical sensor in which the directivity is widened to inhibit the detection of the intensity and angles of light from becoming difficult. A second object thereof is to provide an optical sensor in which an output signal from each of light receiving elements is inhibited from including a disturbance output. A third object thereof is to provide an optical sensor having improved accuracy of detection of light intensity. A fourth object thereof is to provide an optical sensor in which the left/right ratio of light is inhibited from being saturated. A fifth object thereof is to provide an optical sensor in which a cost increase is inhibited, while the gain of an output signal from each of light receiving elements is adjusted. A sixth object thereof is to provide an optical sensor device having improved accuracy of detection of the incident direction of light. A seventh object thereof is to provide an optical sensor in which the directivity is narrowed to allow an improvement in the accuracy of detection of the incident angles of light. An eighth object thereof is to provide an optical sensor having improved versatility.

According to a first aspect of the present disclosure, an optical sensor includes: a plurality of light receiving elements disposed on one surface side of a semiconductor substrate and converting light to an electric signal; a light transparent film disposed on the one surface of the semiconductor substrate and having a light transparent property; a light blocking film disposed on the one surface of the semiconductor substrate via the light transparent film and having a light blocking property; and a plurality of openings disposed in the light blocking film for introducing light into respective light receiving elements. The light receiving elements include a first light receiving element and a second light receiving element. The openings include a first opening corresponding to the first light receiving element and a second opening corresponding to the second light receiving element. A first virtual line is defined so as to extend from a center of the first light receiving element and to pass through a center of the first opening. A second virtual line is defined so as to extend from a center of the second light receiving element and to pass through a center of the second opening. The first virtual line and the second virtual line are different in at least one of an elevation angle and a right-left angle. A light receiving area of the first light receiving element is larger than an aperture area of the first opening, and a light receiving area of the second light receiving element is larger than an aperture area of the second opening.

According to the optical sensor described above, the virtual lines connecting the centers of the plurality of light receiving elements and the centers of the openings corresponding to the respective light receiving elements are different in at least one of the elevation angles thereof and the left-right angles thereof. This allows a plurality of output signals having different values including the intensity and angles of light to be obtained. In addition, the photosensitive areas of the light receiving elements are larger than the aperture areas of the corresponding openings. Accordingly, the angle range (directivity) of light incident on the light receiving surface of each of the light receiving elements is wider than in a configuration in which the photosensitive area and the aperture area are equal, and the problem that light having a given angle cannot be detected with the light receiving elements is inhibited from occurring. In this manner, it is suppressed that the detection of the intensity of light (amount of incident light) and the angles (elevation angle and left-right angle) thereof based on the output signal from each of the light receiving elements becomes difficult.

Alternatively, each of the light blocking film and the light transparent film may have a multilayer structure. An opening disposed in each layer of the light blocking film defines the elevation angle of light. An aperture area of an opening disposed in each layer of the light blocking film gradually increases with approach to the semiconductor substrate. This inhibits light incident from a given one of the openings from being incident on the light receiving element other than the light receiving element corresponding to the given opening. As a result, the output signal from each of the light receiving elements is inhibited from including a disturbance output from the unintended incident light. Also, the aperture area of the opening formed in each of the layers of the light blocking films increases with approach to the formation surface of the semiconductor substrate. Therefore, unlike in a configuration in which the aperture areas of the openings in the respective layers of the light blocking films are equal or a configuration in which the aperture areas decrease with approach to the formation surface, it is possible to inhibit the directivity of light from being narrowed by the opening formed in each layer of the light blocking film.

According to a second aspect of the present disclosure, an optical sensor includes: a plurality of light receiving elements disposed on one surface side of a semiconductor substrate and converting light to an electric signal; a light blocking film disposed over the light receiving elements on the semiconductor substrate via a light transparent film; a plurality of openings for transmitting light disposed in the light blocking film and corresponding to the light receiving elements, respectively; and a light blocking portion. Each opening defines an elevation angle of light. The elevation angle is an angle between a line parallel with a light receiving surface of a corresponding light receiving element and a traveling direction of light. The light blocking portion prevents light incident from one of the openings corresponding to a respective light receiving element from entering into another light receiving element adjacent to the respective light receiving element. The light blocking portion is disposed in the light transparent film between the openings adjacent to each other.

According to the optical sensor described above, the light blocking portion is formed so as to span a region across which the mutually adjacent openings oppose each other. This inhibits light incident from a given one of the openings from being incident on the light receiving element which does not correspond to the given opening. Therefore, the output signal from each of the light receiving elements is inhibited from including a light output (disturbance output) from the unintended opening.

According to a third aspect of the present disclosure, an optical sensor includes: a plurality of light receiving elements disposed on one surface side of a semiconductor substrate and converting light to an electric signal; a light blocking film disposed over the light receiving elements on the semiconductor substrate via a light transparent film; and a plurality of openings for transmitting light disposed in the light blocking film and corresponding to the light receiving elements, respectively. The light receiving elements include a light receiving element for detecting an intensity of light, and a light receiving element for detecting an incident angle of light. Each of the light transparent film and the light blocking film located over the light receiving element for detecting the intensity of light is removed.

According to the optical sensor described above, each of the light transmitting film and the light blocking film which are located over the light receiving element for detecting the intensity of light has been removed. This allows the intensity of light incident on the semiconductor substrate to be detected with excellent accuracy even when the intensity of light is extremely weak. In addition, an output signal from the light receiving element for detecting the intensity of light is inhibited from including the effect of interference of light resulting from the reflection of light between the individual layers formed over the one surface of the semiconductor substrate. The optical sensor described above also includes the light receiving elements each for detecting the incident angle of light. This allows the intensity of light to be detected based on the output signal from the light receiving element for detecting the intensity of light and output signals from the light receiving elements each for detecting the incident angle of light. Therefore, the detected intensity of light is inhibited from including intensity variations in accordance with the incident angle of light. As a result, the accuracy of detection of the intensity of light is improved.

According to a fourth aspect of the present disclosure, an optical sensor includes: a plurality of light receiving elements disposed on one surface side of a semiconductor substrate and converting light to an electric signal; a light blocking film disposed over the light receiving elements on the semiconductor substrate via a light transparent film; and a plurality of openings disposed in the light blocking film and corresponding to the light receiving elements, respectively. The plurality of light receiving elements include a pair of the light receiving elements, which are located line-symmetrical with respect to a virtual line. The virtual line is disposed along the one surface side of the semiconductor substrate. A pair of the openings corresponding to the pair of the light receiving elements are located line-symmetrical with respect to the virtual line. Each of the pair of the light receiving elements has a recessed shape, which extends from one end of the virtual line toward the other end of the virtual line, and is recessed in a middle of the recessed shape. The recessed shape has a lateral width, which increases with distance from one end portion of the recessed shape toward the other end portion of the recessed shape. Each of the pair of the openings provides a projected portion, which is prepared by projecting a respective opening by light, incident on the one surface side of the semiconductor substrate, onto the one surface side of the semiconductor substrate. At least one part of the projected portion is located in a region enclosed by a corresponding light receiving element and a line connecting between one end portion of the corresponding light receiving element and the other end portion of the corresponding light receiving element.

In the following, for purposes of easier description, a direction along the virtual line is shown as a front-rear direction, and a direction which intersects the front-rear direction and in which the pair of light receiving elements and the pair of openings are arranged is shown as a left-right direction. Also, a side frontward of a reference line parallel with the left-right direction and passing through the pair of openings is shown as a front side, and a side rearward of the reference line is shown as a rear side. Of the pair of light receiving elements, the light receiving element located on the left side is shown as a left light receiving element and the light receiving element located on the right side is shown as a right light receiving element. According to the optical sensor described above, the pair of light receiving elements and the pair of openings are each line-symmetrical with respect to the front-rear direction, and the individual openings correspond to the individual light receiving elements on a one-to-one basis. Each of the light receiving elements is formed in the recessed shape extending from the front to the rear, while being recessed in the middle therebetween. At least one part of the projected portion of each of the openings is located in the region enclosed by the corresponding light receiving element and the line connecting the one end portion of the light receiving element and the other end portion thereof. As a result, light incident on the optical sensor from the rear side is not necessarily incident on each of the pair of light receiving elements, but light incident on the optical sensor from the front side is incident on each of the pair of light receiving elements. For example, when light is incident on the optical sensor from the right front side, the light is incident on the respective left rear portions of the left light receiving element and the right light receiving element and, when light is incident on the optical sensor from the left front side, the light is incident on the respective right rear portions of the left light receiving element and the right light receiving element. This inhibits the light from the front side from being incident only on one of the pair of light receiving elements, and inhibits the output signal from each of the light receiving elements from becoming zero. In addition, the lateral width of each of the pair of light receiving elements increases with distance from one end portion thereof toward the other end portion thereof. Accordingly, when, e.g., light is incident on the optical sensor from the right front side, the photosensitive areas of the light incident on the respective left rear portions of the left light receiving element and the right light receiving element are different so that the output signals from the respective light receiving elements are different. The same holds true in the reverse situation. When light is incident on the optical sensor from the left front side, the photosensitive areas of the light incident on the respective right rear portions of the left light receiving element and the right light receiving element are different so that the output signals from the respective light receiving elements are different. Accordingly, unlike in a configuration in which the lateral width of each of the pair of light receiving elements is constant, a value (first value) obtained by dividing the output signal from the left light receiving element by the total sum of the output signals from the two light receiving elements is different from a value (second value) obtained by dividing the output signal from the right light receiving element by the total sum of the output signals from the two light receiving elements. Therefore, by determining a ratio between the two values, it is possible to detect how much light is incident on the optical sensor from the left side or how much light is incident on the optical sensor from the right side. That is, it is possible to detect the left/right ratio of the light. As shown above, according to the optical sensor described above, the output signal from each of the pair of light receiving elements is inhibited from becoming zero. Since the output signals therefrom are different, the left/right ratio of light is inhibited from being saturated. Note that, when light is incident on the optical sensor from the front side, the photosensitive areas of the light incident on the respective rear portions of the left light receiving element and the right light receiving element are the same so that the two values described above are equal.

Alternatively, the plurality of light receiving elements may include at least two pairs of the light receiving elements. The openings include two pairs of the openings corresponding to the at least two pairs of the light receiving elements. Further, a distance between one of one pair of the light receiving elements and a respective opening corresponding to the one of the one pair of the light receiving elements may be different from a distance between one of the other pair of the light receiving elements and a respective opening corresponding to the one of the other pair of the light receiving elements. The elevation angle of light incident on each of the light receiving elements depends on the distance between the light receiving element and the opening. Accordingly, by comparing the respective output signals from the one light receiving element and the other light receiving element with each other in the foregoing, it is possible to detect the elevation angle of the light incident on the optical sensor. In addition, the at least two pairs of the light receiving elements are formed on the semiconductor substrate. Therefore, unlike in a configuration in which one pair of light receiving elements and one independent light receiving element are formed on a semiconductor substrate, at least two pairs of output signals having different elevation angle characteristics can be obtained. This improves the accuracy of detection of elevation angles.

According to a fifth aspect of the present disclosure, an optical sensor includes: a plurality of light receiving elements for storing charges corresponding to an amount of received light; a defining portion for defining incident angles of light incident on respective light receiving surfaces of the light receiving elements such that the incident angles of light are different; a storing portion electrically connected to each of the light receiving elements, storing the charges outputted from the light receiving elements, and converting stored charges to a voltage; a plurality of transfer switches arranged between respective light receiving elements and the storing portion; a reset portion for resetting the charges stored in the storing portion; and a control portion for controlling opening and closing of each of the transfer switches and driving of the reset portion. The control portion adjusts an interval between the opening and closing of each of the transfer switches so that the amount of the charges outputted from each of the light receiving elements to the storing portion is adjusted.

Thus, according to the optical sensor described above, the interval between the opening and closing of each of the transfer switches is adjusted to thereby adjust the amount of the charges outputted from each of the light receiving elements to the storing portion, i.e., the gain of the output signal from the light receiving element. Accordingly, compared to a configuration in which a current-voltage conversion circuit including an operational amplifier and laser trimming resistors is connected to each of the light receiving elements and the resistance values of the laser trimming resistors are adjusted, the gain of the output signal from each of the light receiving elements can be adjusted, while a cost increase is suppressed.

Alternatively, the reset portion may be a reset switch disposed between the storing portion and a power source. The control portion inputs a reset signal for controlling opening and closing of the reset switch to the reset switch. The control portion inputs, a transfer signal for controlling the opening and closing of the transfer switches together with the reset signal, to each of the transfer switches. The amount of charges outputted from each of the light receiving elements depends on the interval between the opening and closing of the transfer switch. However, the amount of charges outputted from each of the light receiving elements and stored in the storing portion depends not only on the interval between the opening and closing of the transfer switch, but also on a timing for the opening/closing of the reset switch. In the case described above, to each of the transfer switches, the transfer signal is inputted together with the reset signal. When the reset signal is outputted from the control portion, the light receiving element and the storing portion are electrically connected via the transfer switch, and the storing portion and the power source are electrically connected via the reset switch. The charges stored in the light receiving element are outputted (transferred) to the storing portion but, since the voltage across the storing portion is forced to be equal to a power source voltage, the charges outputted from the light receiving element are not stored in the storing portion. Thus, at the timing at which the reset signal is outputted from the control portion, each of the light receiving element and the storing portion is in a state where no charge is stored therein. When the outputting of the reset signal is completed, the transfer switch is brought into an open state and charges start to be stored again in the light receiving element. A time for the storage is from the outputting of the reset signal till the transfer switch is brought again into the open state. When the transfer signal is outputted from the control portion before the next reset signal is outputted, the charges stored in the light receiving element for the storage time are transferred to the storing portion. At this timing, the storing portion is not electrically connected to the power source so that the charges outputted from the light receiving element are stored in the storing portion. Thus, the amount of the charges stored in the storing portion depends on the storage time. Accordingly, by adjusting the storage time in each of the light receiving elements, it is possible to adjust the gain of the output signal from the light receiving element.

According to a sixth aspect of the present disclosure, an optical sensor includes: a plurality of light receiving elements for storing charges corresponding to an amount of received light; a defining portion for defining incident angles of light incident on respective light receiving surfaces of the light receiving elements such that the incident angles of light are different; a common wiring electrically connected commonly to each of the light receiving elements; a plurality of transfer switches arranged between the light receiving elements and the common wiring, respectively; a reset portion for resetting the charges stored in each of the light receiving elements; and a control portion for controlling opening and closing of each of the transfer switches and driving of the reset portion. The control portion adjusts the opening and closing of each of the transfer switches and the driving of the reset portion so that the amount of the charges outputted from each of the light receiving elements to the common wiring is adjusted.

The time (storage time) during which charges are stored in each of the light receiving elements corresponds to a time during which the reset portion does not drive and the transfer switch is in the open state. Therefore, by adjusting the opening and closing of the transfer switch and the driving of the reset portion as in the optical sensor described above, the amount of charges outputted from the light receiving element to the common wiring, i.e., the gain of the output signal from the light receiving element can be adjusted. Accordingly, compared to a configuration in which a current-voltage conversion circuit including an operational amplifier and laser trimming resistors is connected to each of the light receiving elements and the resistance values of the laser trimming resistors are adjusted, the gain of the output signal from each of the light receiving elements can be adjusted, while a cost increase is suppressed.

Alternatively, the reset portion may be reset switches disposed between the light receiving elements and a ground, respectively. The control portion outputs, reset signals for controlling opening and closing of the reset switches at different times, to the reset switches corresponding to the light receiving elements, respectively. The control portion simultaneously outputs, transfer signals for controlling opening and closing of the transfer switches, to the transfer switches corresponding to the light receiving elements, respectively. The storage time corresponds to a time during which each of the reset switches and the transfer switches is in the open state. Accordingly, by outputting the reset signals from the control portion to the reset switches corresponding to the respective light receiving elements with different timings and outputting the transfer signals from the control portion to the transfer switches corresponding to the respective light receiving elements with the same timing, it is possible to adjust the amount of charges outputted from each of the light receiving elements to the common wiring, i.e., the gain of the output signal from the light receiving element. In addition, since the transfer signals are outputted from the control portion to the transfer switches corresponding to the respective light receiving elements with the same timing, the output signals from the respective light receiving elements with adjusted gains are simultaneously outputted to the common wiring. As a result, the output signals with adjusted gains from the respective light receiving elements are subjected to an addition in the common wiring, and a signal resulting from the addition is outputted from the common wiring. This simplifies the circuit configuration of the optical sensor, and suppresses a cost increase.

According to a seventh aspect of the present disclosure, an optical sensor device includes: an optical sensor; and an angle calculating unit. The optical sensor includes: a plurality of light receiving elements disposed on a semiconductor substrate and converting light to an electric signal; a light transparent film disposed over the light receiving elements on the semiconductor substrate and having a light transparent property; a light blocking film disposed on the light transparent film and having a light blocking property; and a plurality of openings disposed in the light blocking film, corresponding to the light receiving elements, respectively, and defining angles of light incident on light receiving surfaces of the light receiving elements, respectively. The angle calculating unit calculates elevation angles of light and right-left angles of light based on output signals from the light receiving elements, respectively. The plurality of light receiving elements include a plurality of groups of light receiving elements having the right-left angles of light equal to each other, and the elevation angles of light different from each other. The plurality of light receiving element groups have different right-left angles. The angle calculating unit compares intensities of the output signals from the light receiving elements with each other so that the light receiving element outputting the most strong output signal is specified. The angle calculating unit specifies the angle of the light incident on the light receiving surface of a specified light receiving element.

Thus, according to the device described above, the plurality of light receiving element groups are formed of the plurality of light receiving elements having the same left-right angle of light defined by the corresponding openings, and the different elevation angles thereof. Also, the left-right angles of the plurality of light receiving element groups are different. As a result, the amounts of the light incident on the respective light receiving elements are different, and the output signal from the light receiving element having the light receiving surface on which light is incident at an angle equal to the angle of light incident on the semiconductor substrate or closest thereto is maximum. Therefore, by comparing the intensities of the output signals from the respective light receiving elements, the light receiving element outputting the most intense output signal is specified. By specifying the angle of light incident on the light receiving surface of the specified light receiving element, it is possible to detect the incident direction (elevation angle and left-right angle) of the light incident on the semiconductor substrate. This improves the accuracy of detection of the incident direction of light. Note that the elevation angle of light is an angle formed by a direction parallel with the light receiving surface of each of the light receiving elements and a direction in which light advances and the left-right angle of light is an angle around a vertical line vertical to the light receiving surface.

According to an eighth aspect of the present disclosure, an optical sensor includes: a plurality of light receiving elements disposed on one surface side of a semiconductor substrate and converting light to an electric signal; a light blocking film disposed over one surface of the semiconductor substrate via a light transparent film; and a plurality of openings transmitting light, disposed in the light blocking film, and corresponding to the respective light receiving elements. At least one of elevation angles and right-left angles of three virtual lines, which connect centers of three light receiving elements and centers of the openings corresponding to the three light receiving elements, are different. A light receiving area of each of the light receiving elements is substantially the same as an aperture area of the corresponding opening.

According to the optical sensor described above, at least three output signals having mutually different values including the intensities and angles of light can be obtained. Therefore, the incident angles of light can be detected. In addition, the photosensitive area of each of the light receiving elements is generally the same as the aperture area of the corresponding opening. Accordingly, compared to a configuration in which one opening corresponds to a plurality of light receiving elements and the aperture area is larger than the photosensitive area, the angle range (directivity) of light incident on the light receiving surface of each of the light receiving elements is narrowed. As a result, the directivity characteristic of each of the light receiving elements is improved so that, when the incident angle of light is detected based on the output signal from each of the light receiving elements, the accuracy of detection of the incident angle of light is improved. Note that the elevation angle mentioned above is an angle formed by a line parallel with the light receiving surface of the light receiving element and a direction in which light advances, and the left-right angle mentioned above is an angle around a reference point at the semiconductor substrate. Note that the wording "generally the same" is for clarifying the fact that, when it is attempted to manufacture the optical sensor such that the light receiving elements have exactly the same photosensitive areas and the openings have exactly the same aperture areas, the light receiving elements having exactly the same photosensitive areas and the openings having exactly the same aperture areas cannot be produced due to a manufacturing error, and accordingly the manufacturing error is included. Therefore, the wording "generally the same" shows that the same is included therein, and the range of inclusion is about the range of the manufacturing error.

According to a ninth aspect of the present disclosure, an optical sensor includes: a plurality of light receiving elements; a plurality of defining portions for defining incident angles of light incident on light receiving surfaces of the respective light receiving elements such that the incident angles of light are different from each other; a calculating portion for calculating the incident angles of light based on output signals from the light receiving elements; a plurality of selection switches provided between the respective light receiving elements and the calculating portion; and a control portion for controlling each of the selection switches to open and close.

Thus, according to the optical sensor described above, an arbitrary light receiving element can be selected. Therefore, even when there is an angle of light particularly desired to be detected, it is sufficient to merely rewrite the settings of the control portion based on the use purpose thereof. This improves versatility compared to a configuration in which the defining portions are produced again based on the use purpose thereof.

BRIEF DESCRIPTION OF DRAWINGS

The above and other objects, features and advantages of the present disclosure will become more apparent from the following detailed description made with reference to the accompanying drawings. In the drawings:

FIG. 21 is a plan view showing a variation of the optical sensor;

FIG. 22 is a plan view showing a variation of the optical sensor;

EMBODIMENTS FOR CARRYING OUT INVENTION

First Embodiment

Figure 1:
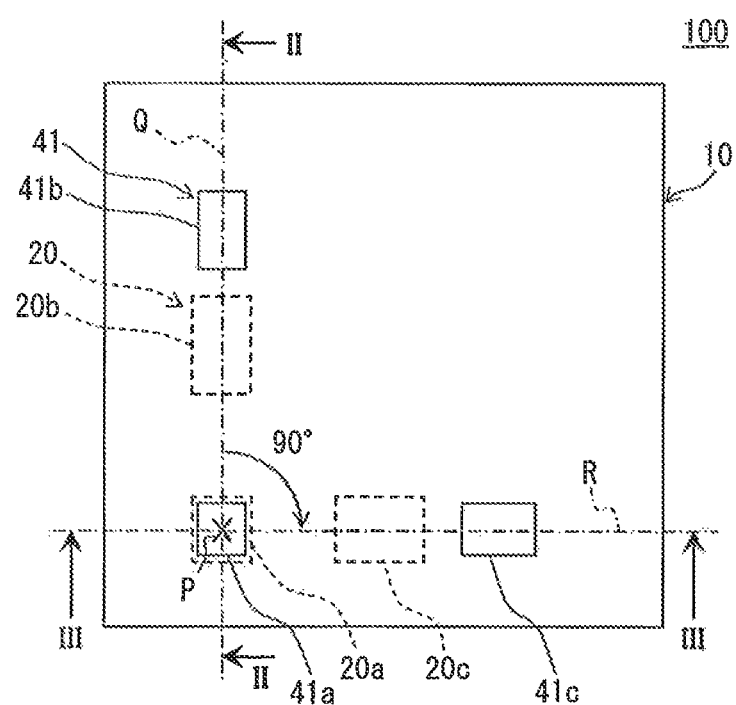
FIG. 1 is a plan view of an optical sensor according to a first embodiment.
Figure 2:
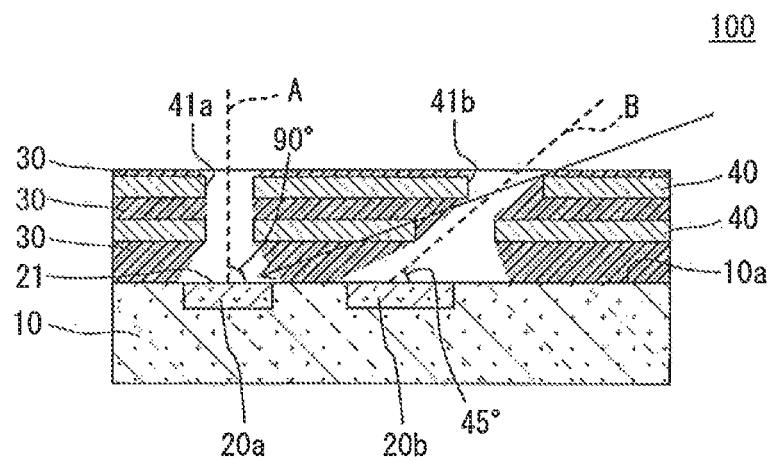
FIG. 2 is a cross-sectional view along the line II-II of FIG. 1.
Figure 3:
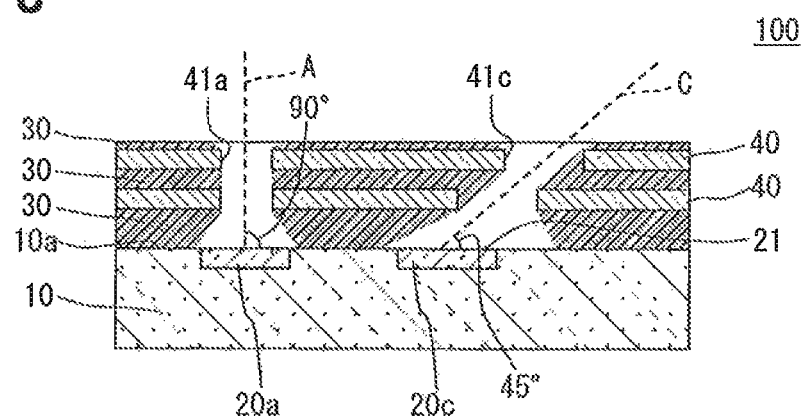
FIG. 3 is a cross-sectional view along the line III-III of FIG. 1.
Figure 4:
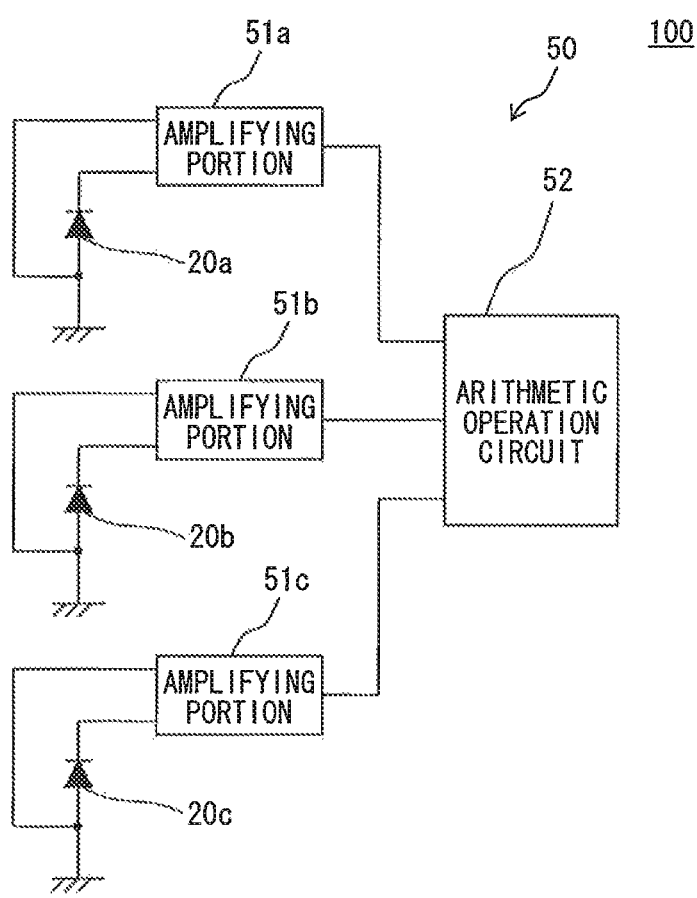
FIG. 4 is a circuit diagram for illustrating a calculating portion.
Figure 5A:
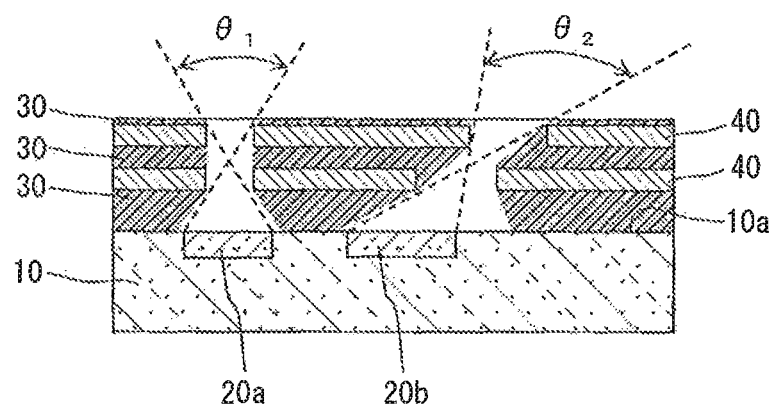
FIG. 5A is a cross-sectional view showing the angle range of light of the present embodiment.
Figure 5B:
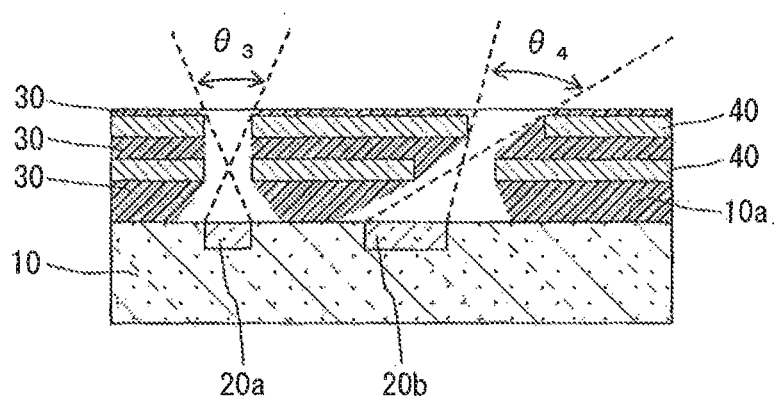
FIG. 5B is a cross-sectional view showing the angle range when the light receiving area of a light receiving element is equal to the aperture area of an opening corresponding thereto.

FIG. 1 is a plan view showing a schematic configuration of an optical sensor according to a first embodiment. FIG. 2 is a cross-sectional view along the line II-II of FIG. 1. FIG. 3 is a cross-sectional view along the line III-III of FIG. 1. FIG. 4 is a schematic circuit diagram for illustrating a calculating portion. FIG. 5A is a cross-sectional view showing the angle range of light of the present embodiment, and FIG. 5B is a cross-sectional view showing the angle range when the light receiving area of a light receiving element is equal to the aperture area of an opening corresponding thereto. Note that, in FIG. 1, light receiving elements 20a to 20c described later are shown by the broken lines and, in FIGS. 2 and 3, the ranges of light incident, in light transparent films, on a formation surface 10a via openings 41a to 41c are shown as the hollow voids. In FIGS. 1 and 3, a calculating portion 50 is not shown.

As shown in FIGS. 1 to 4, an optical sensor 100 includes, as main portions thereof, a semiconductor substrate 100, light receiving elements 20, the light transparent films 30, light blocking films 40, and a calculating portion 50. On one surface side of the semiconductor substrate 10, the light receiving elements 20 are formed. Over the formation surface 10a thereof where the light receiving elements 20 are formed, the light transparent films 30 are formed and, in the light transparent films 30, the light blocking films 40 are formed. In the light blocking films 40, openings 41 for transmitting light are formed and, via the openings 41, light is incident on the light receiving elements 20. The light receiving elements 20 are electrically connected to the calculating portion 50 so that an output signal from each of the light receiving elements 20 is processed by the calculating portion 50. In the following, a schematic configuration of the main portions 10 to 50 of the optical sensor 100 is shown first, and then the characteristic feature of the optical sensor 100 and the operation/effect thereof will be described.

The semiconductor substrate 10 is formed in a rectangular shape, and the light receiving elements 20 described above and electronic elements (not shown) forming the calculating portion 50 shown in FIG. 4 are formed thereon. These electronic elements are electrically connected via a wiring pattern (not shown) formed in the semiconductor substrate 10.

Each of the light receiving elements 20 is for converting light to an electric signal. Each of the light receiving elements 20 according to the present embodiment is a photodiode having a PN junction. As shown in FIGS. 1 to 3, the three light receiving elements 20a to 20c are formed on the semiconductor substrate 10.

The light transparent films 30 are made of a material having a light transparent property and an insulating property. Examples of a material having such properties include an interlayer insulating film $SiO_2$ used in a semiconductor process. As shown in FIGS. 2 and 3, the light transparent films 30 are formed in multiple layers over the formation surface 10a. In the present embodiment, the three-layer light transparent films 30 are formed over the formation surface 10a.

The light blocking films 40 are made of a material having a light blocking property and an electrically conductive property. Examples of a material having such properties include aluminum. As shown in FIGS. 2 and 3, each of the light blocking films 40 is formed between the two layers of the light transparent films 30, and the multi-layer light blocking films 40 are formed over the formation surface 10a via the light transparent films 30. In the present embodiment, the two-layer light blocking films 40 are formed in the light transparent films 30, and the openings 41a to 41c corresponding to the respective light receiving elements 20a to 20c are formed in each of the layers of the light blocking films 40. In the present embodiment, the aperture areas of the openings 41a to 41c formed in each of the layers of the light blocking films 40 are equal. The openings 41a to 41c in each of the layers define the elevation angles of light formed by lines parallel with light receiving surfaces 21 of the respective light receiving elements 20a to 20c and a direction in which light advances. Note that the light blocking films 40 are electrically connected to the wiring pattern formed in the semiconductor substrate 10 to also function as wiring electrically connecting the individual electronic elements, though not shown.

The calculating portion 50 is for calculating the amount of light incident on the optical sensor 100 and the elevation angle and right-left angle thereof based on the output signals from the respective light receiving elements 20a to 20c. As shown in FIG. 4, the calculating portion 50 includes amplifying portions 51a to 51c for amplifying the output signals from the respective light receiving elements 20a to 20c and an arithmetic operation portion 52 for performing an arithmetic operation on output signals from the amplifying portions 51a to 51c to calculate the amount of the light incident on the optical sensor 100 and the elevation angle and right-left angle thereof.

Next, the characteristic feature of the optical sensor 100 according to the present embodiment and the operation/effect thereof will be described. As shown in FIG. 1, the first light receiving element 20a is located at a reference point P of the semiconductor substrate 10 represented by the cross mark. The second light receiving element 20b is located on a reference line Q passing through the reference point P and parallel with the formation surface 10a. The third light receiving element 20c is located on a rotation line R obtained by clockwise 90 degrees rotating the reference line Q around the reference point P as the center of the rotation. The first opening 41a corresponding to the first light receiving element 20a is located at the reference point P. The second opening 41b corresponding to the second light receiving element 20b is located on the rotation line Q. The third opening 41c corresponding to the third light receiving element 20c is located on the rotation line R. If an angle (right-left angle) around the reference point P is defined as an angle formed by the reference line Q and any line passing through the reference point P, the right-left angle of light incident on the light receiving surface 21 of each of the first light receiving element 20a and the second light receiving element 20b is 0 degree, while the right-left angle of light incident on the light receiving surface 21 of the third light receiving element 20c is 90 degrees.

As shown in FIGS. 1 to 3, the center of the first light receiving element 20a and the center of the first opening 41a are located at the reference point P, and the angle (elevation angle) formed by a first virtual line A connecting the respective centers thereof and the formation surface 10a is 90 degrees. On the other hand, the center of the second light receiving element 20b and the center of the second opening 41b are apart from each other on the reference line Q so as to locate the second light receiving element 20b closer to the reference point P, and the elevation angle of a second virtual line B connecting the respective centers thereof is 45 degrees. In addition, the center of the third light receiving element 20c and the center of the third opening 41c are apart from each other on the rotation line R so as to locate the third light receiving element 20c closer to the reference point P, and the elevation angle of a third virtual line C connecting the respective centers thereof is 45 degrees.

In this manner, the elevation angle of the first virtual line A is 90 degrees, the right-left angle thereof is 0 degree, the elevation angle of the second virtual line B is 45 degrees, the right-left angle thereof is 0 degree, the elevation angle of the third virtual line C is 45 degrees, and the right-left angle thereof is 90 degrees. Accordingly, the angle range (directivity) of light incident on the light receiving surface 21 of the first light receiving element 20a includes the elevation angle of 90 degrees and the right-left angle of 0 degree, the directivity of the second light receiving element 20b includes the elevation angle of 45 degrees and the right-left angle of 0 degree, and the directivity of the third light receiving element 20c includes the elevation angle of 45 degrees and the right-left angle of 90 degrees. Thus, in the case of the foregoing configuration, the three output signals which are different in at least either one of elevation angle and right-left angle can be obtained. Therefore, by performing an arithmetic operation on these three output signals in the calculating portion 50, it is possible to detect the intensity of light (amount of incident light) and the angles (elevation angle and right-left angle) thereof.

In addition, as shown in FIGS. 2, 3, 5A, and 5B, the light receiving areas of the respective elements 20a to 20c are larger than the aperture areas of the corresponding openings 41a to 41c. Accordingly, as shown in FIGS. 5A and 5B, the angle range (directivity) of light incident on each of the light receiving surfaces 21, which is defined by an angle θ formed by the two lines shown as the broken lines, is wider than in a configuration in which the light receiving areas and the aperture areas are equal. That is, an angle $θ_1$ is larger than an angle $θ_3$, and an angle $θ_2$ is larger than an angle $θ_4$. As a result, the problem that light having a given angle cannot be detected with the light receiving elements 20a to 20c is inhibited from occurring, and it is suppressed that the detection of the intensity of light (amount of incident light) and the angles (elevation angle and right-left angle) thereof becomes difficult.

In the present embodiment, the light blocking films 40 are formed in multiple layers in the light transparent films 30 and, between the adjacent openings 41, the multi-layer light blocking films 40 are formed. Accordingly, compared to a configuration in which openings are formed in a one-layer light blocking film, the ranges of light incident on the semiconductor substrate 10 can be narrowed. This inhibits, e.g., light having the elevation angle shown by the solid-line arrow in FIG. 2 from being incident on the first light receiving element 20a which does not correspond to the second opening 41b via the second opening 41b. As a result, it is suppressed that an output signal from each of the light receiving elements 20 includes a disturbance output from the unintended incident light.

The present embodiment has shown the example in which the three light receiving elements 20a to 20c are formed on the semiconductor substrate 10. However, the number of the light receiving elements 20 is not limited to that in the foregoing example as long as the number thereof is more than one. In addition, when each of the number of the light receiving elements 20 and the number of the openings 41 corresponding thereto is not less than four, it is sufficient as long as virtual lines connecting the respective centers of the plurality of light receiving elements 20 and those of the openings 41 corresponding thereto are different in at least either one of elevation angle and right-left angle. For example, it is also possible to adopt a configuration in which four light receiving elements 20a to 20d are formed on the semiconductor substrate 10, as shown in FIG. 6, or a configuration in which eight light receiving elements 20a to 20h are formed on the semiconductor substrate 10, as shown in FIG. 7.

Figure 6:
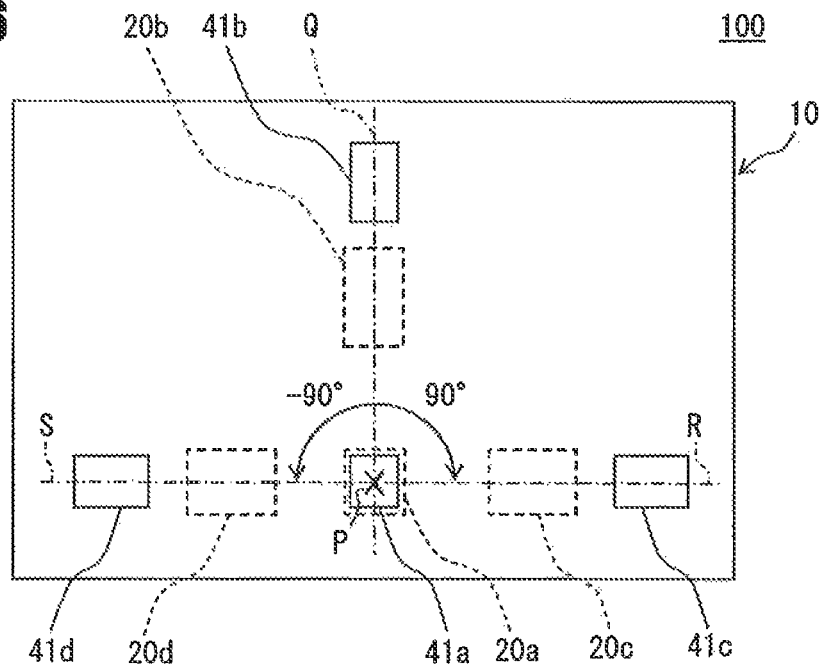
FIG. 6 is a plan view for illustrating a variation of the optical sensor.

In a variation shown in FIG. 6, the fourth light receiving element 20d and the fourth opening 41d are formed on a rotation line S obtained by counterclockwise 90 degrees (−90 degrees) rotating the reference line Q around the reference point P as the center of the rotation. To locate the fourth light receiving element 20d closer to the reference point P, the center of the fourth light receiving element 20d and the center of the fourth opening 41d are apart from each other on the rotation line S, and the elevation angle of a fourth virtual line (not shown) connecting the respective centers thereof is 45 degrees. Accordingly, the elevation angle of the fourth virtual line is 45 degrees and the right-left angle thereof is −90 degrees, and the directivity of the fourth light receiving element 20d include the elevation angle of 45 degrees and the right-left angle of −90 degrees. FIG. 6 is a plan view for illustrating the variation of the optical sensor.

Figure 7:
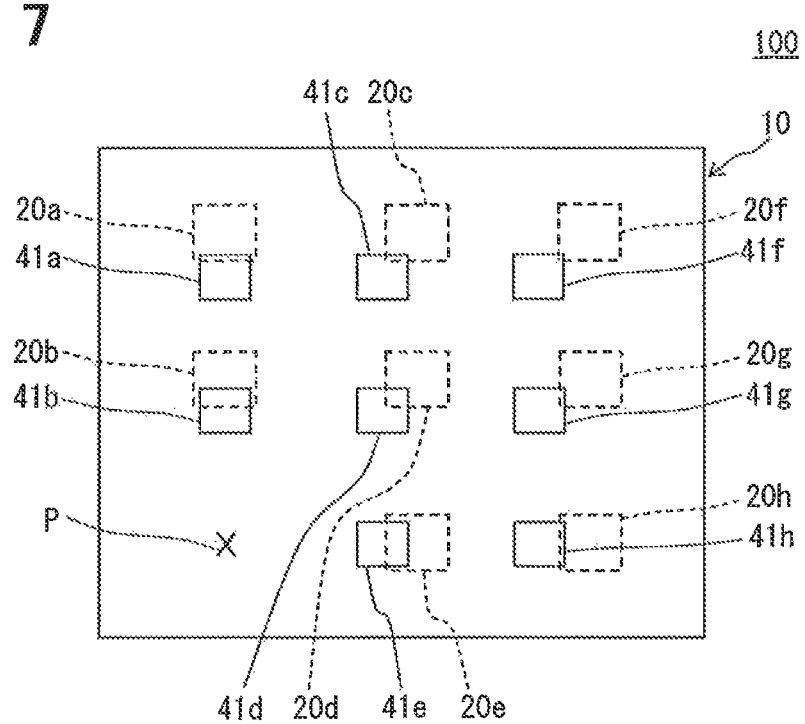
FIG. 7 is a plan view for illustrating a variation of the optical sensor.

On the other hand, in a variation shown in FIG. 7, to locate the openings 41 closer to the reference point P, the light receiving elements 20 and the openings 41 are located on a plurality of virtual lines (not shown) radially extending from the reference point P so that the elevation angles defined by openings 41a to 41h corresponding to the respective light receiving elements 20a to 20h are different. The configuration shown in FIG. 7 allows light incident from the reference point P side to be detected with the eight light receiving elements 20 having different directivities. In this manner, it is possible to increase the accuracy of detection of the amount of light incident from the reference point P side and the elevation angle and right-left angle thereof. FIG. 7 is a plan view for illustrating the variation of the optical sensor.

Figure 8:
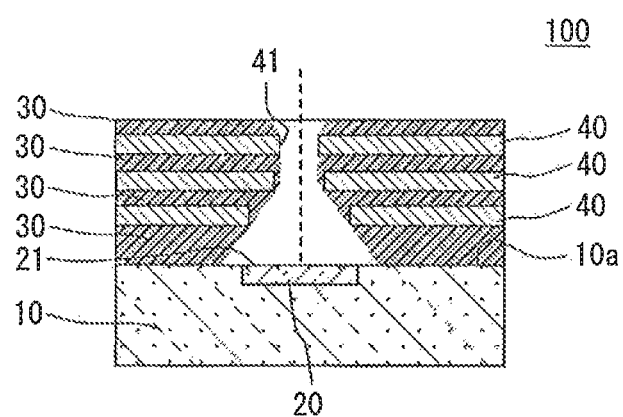
FIG. 8 is a cross-sectional view showing a variation of the opening.

The present embodiment has shown the example in which the light transparent films 30 are in three layers, and the light blocking films 40 are in two layers. However, the respective numbers of the layers of the light transparent films 30 and the light blocking films 40 are not limited to those in the foregoing example. For example, as shown in FIG. 8, it is also possible to adopt a configuration in which the light transparent films 30 are in four layers, and the light blocking films 40 are in three layers.

Also, the present embodiment has shown the example in which the aperture areas of the openings 41 in the respective layers of the light blocking films 40 are equal. However, the aperture areas of the openings 41 in the respective layers may also be different. For example, as shown in FIG. 8, the aperture areas of the openings 41 in the respective layers may also increase with approach to the formation surface 10a. In other words, the aperture area of the opening 41 closer to the formation surface 10a may also be larger than the aperture area of the opening 41 farther away from the formation surface 10a. According to the configuration, unlike in a configuration in which the aperture areas of the openings 41 in the respective layers of the light blocking films 40 are equal or in a configuration in which the aperture areas decrease with approach to the formation surface 10a, the openings 41 formed in the respective layers of the light blocking films 40 inhibit the directivity of light from being significantly narrowed (the ranges of light incident on the formation surface 10a from becoming smaller than the light receiving areas of the light receiving surfaces 21). FIG. 8 is a cross-sectional view showing a variation of the openings. Note that, in FIG. 8, the ranges of light incident, in the light transparent films 30, on the formation surface 10a via the openings 41 are shown as hollow voids.

The present embodiment has shown the example in which the light blocking films 40 are made of a material having a light blocking property and an electrically conductive property. However, in the case where the individual electronic elements formed on the semiconductor substrate 10 need not be electrically connected by the light blocking films 40, the light blocking films 40 may also be formed of a material having a light absorbing property.

Second Embodiment

Figure 9:
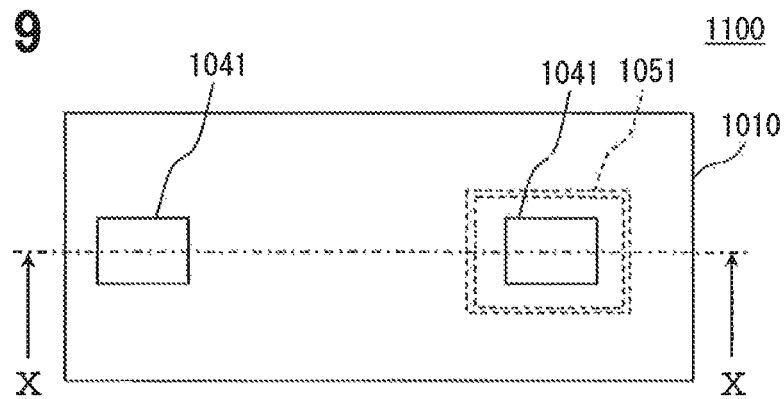
FIG. 9 is a plan view of an optical sensor according to a second embodiment.
Figure 10:
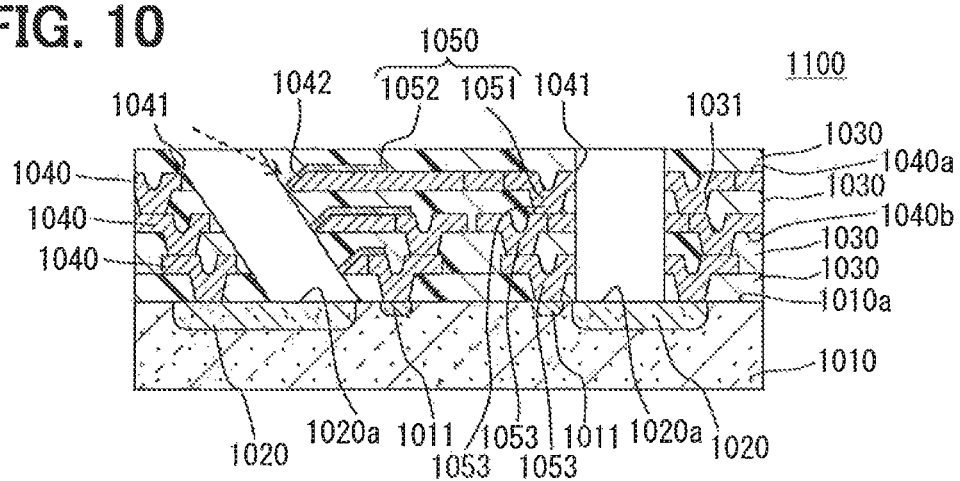
FIG. 10 is a cross-sectional view of the optical sensor along the line X-X of FIG. 9.

FIG. 9 is a plan view showing a schematic configuration of an optical sensor according to a second embodiment. FIG. 10 is a cross-sectional view along the line X-X of FIG. 9. Note that, in FIG. 9, edges forming the openings 41 described later are shown by the solid lines, and light blocking walls 51 are shown by the broken lines.

As shown in FIGS. 9 and 10, an optical sensor 1100 includes, as main portions thereof, a semiconductor substrate 1010, light receiving elements 1020, light transparent films 1030, light blocking films 1040, and light blocking portions 1050. On one surface side of the semiconductor substrate 1010, the light receiving elements 1020 are formed. Over a formation surface 1010a thereof where the light receiving elements 1020 are formed, the light transparent films 1030 are formed and, in the light transparent films 1030, the light blocking films 1040 and the light blocking portions 1050 are formed. In the light transparent films 1030, openings 1041 for transmitting light are formed and, via the openings 1041, light is incident on the light receiving elements 1020. Note that, in FIG. 10, the ranges of the light transparent films 1030 in which light is incident are shown as hollow voids.

The semiconductor substrate 1010 is formed in a rectangular shape, and the light receiving elements 1020 described above and electronic elements (not shown) forming a circuit for processing output signals from the light receiving elements 1020 are formed thereon. These electronic elements are electrically connected via a wiring pattern 1011 formed in the semiconductor substrate 1010. Note that, as will be described later, the light blocking films 1040 are made of a material having an electrically conductive property such that parts of the light blocking films 1040 perform the function of electrically connecting the individual electronic elements described above.

Each of the light receiving elements 1020 is for converting light to an electric signal. Each of the light receiving elements 1020 according to the present embodiment is a photodiode having a PN junction. As shown in FIG. 10, the plurality of light receiving elements 1020 are formed at predetermined space intervals on the semiconductor substrate 1010.

The light transparent films 1030 are made of a material having a light transparent property and an insulating property. Examples of a material having such properties include silicon dioxide $SiO_2$. As shown in FIG. 10, the light transparent films 1030 are formed in multiple layers over the formation surface 1010a. In each of the light transparent films 1030 except for the light transparent film 1030 located at an uppermost position, a through hole 1031 is formed to extend through the semiconductor substrate 1010 in a thickness direction thereof. Each of the through holes 1031 is filled with a conductive member 1053 described later. In the present embodiment, the four light transparent films 1030 are formed over the formation surface 1010a, and the through holes 1031 are formed in the three respective light transparent films 1030 closer to the formation surface 1010a.

The light blocking films 1040 are made of a material having a light blocking property and an electrically conductive property. Examples of a material having such properties include aluminum. As shown in FIG. 10, each of the light blocking films 1040 is formed between the two layers of the light transparent films 1030, and the multi-layer light blocking films 1040 are formed over the formation surface 1010a via the light transparent films 1030. In the present embodiment, the three-layer light blocking films 1040 are formed in the light transparent films 1030, and the openings 1041 corresponding to the light receiving elements 1020 are formed in each of the layers of the light blocking films 1040.

In the present embodiment, the aperture areas of the openings 1041 formed in each of the layers of the light blocking films 1040 are equal. The openings 1041 in each of the layers define the elevation angles of light formed by lines parallel with light receiving surfaces 1020a of the light receiving elements 1020 and a direction in which light advances. In addition, a part of an end portion 1042 forming the edge of the opening 1041 is inclined so as to face a direction in which light is incident, and the individual layers of the light blocking films 1040 are connected to each other via light blocking walls 1051 described later.

Each of the light blocking portions 1050 performs the function of preventing light incident from the opening 1041 corresponding to a given one of the light receiving elements 1020 from being incident on the light receiving element 1020 adjacent thereto. The light blocking portion 1050 includes the light blocking wall 1051 and a light absorbing film 1052, and is formed between the opening 1041 in the light transparent films 1030 corresponding to the given light receiving element 1020 and the opening 1041 corresponding to the light receiving element 1020 adjacent thereto. Note that, as shown by the broken lines in FIG. 9, the light blocking wall 1051 is formed in each of the light transparent films 1030 so as to have a generally annular plan shape and surround the periphery of the opening 1041 corresponding to one of the light receiving elements 1020. Thus, a part of the light blocking wall 1051 is formed so as to span a region across which the adjacent openings 1041 oppose each other, and the region across which the adjacent openings 1041 oppose each other is traversed by the light blocking wall 1051.

Each of the light blocking walls 1051 is formed of the conductive material 1053 filling the through hole 1031. The conductive materials 1053 are made of the same material as that of the light blocking films 1040, and integrally coupled to the light blocking films 1040. Consequently, the respective layers of the light blocking films 1040 are mechanically and electrically connected via the light blocking walls 1051. Also, in the present embodiment, as shown in FIG. 10, the conductive member 1053 filling the through hole 1031 of the light transparent film 1030 closest to the formation surface 1010a is electrically connected to the wiring pattern 1011. As a result, the light blocking films 1040 and the wiring pattern 1011 are electrically connected via the conductive members 1053 (light blocking walls 1051), and a part of each of the light blocking films 1040 is adapted to perform the function of electrically connecting the individual electronic elements formed on the semiconductor substrate 1010.

The light absorbing films 1052 are made of a material having a property of absorbing light. Examples of a material having such a property include carbon. As shown in FIG. 10, each of the light absorbing films 1052 is formed over an upper surface 1040a of each of the light blocking films 1040 and an end portion 1042 forming the edge of the opening 1041.

Next, the operation/effect of the optical sensor 1100 according to the present embodiment will be described. As described above, each of the light blocking walls 1051 is formed in the light transparent film 1030 so as to span the region across which the openings 1041 adjacent to each other oppose each other. This inhibits light incident from a given one of the openings 1041 from being incident on the light receiving element 1020 which does not correspond to the given opening 1041. Therefore, the output signal from each of the light receiving elements 20 is inhibited from including a light output (disturbance output) from the unintended opening 1041.

As shown in FIG. 9, by the light blocking wall 1051, each of the three light transparent films 1030 closer to the formation surface 1010a is shielded from light between a given one of the light receiving elements 1020 and the light receiving element 1020 adjacent thereto. As a result, it is possible to completely block light between the given light receiving element 1020 and the light receiving element 1020 adjacent thereto using the light blocking walls 51.

In the present embodiment, each of the light blocking walls 1051 is formed in the light transparent film 1030 to have a generally annular plan shape and surround the periphery of the opening 1041 corresponding to one of the light receiving elements 1020. This inhibits light incident in the opening 1041 surrounded by the light blocking wall 1051 from being incident on the light receiving element 1020 which does not correspond to the opening 1041. In addition, light incident in the opening 1041 (the opening 1041 on the left side of the paper surface) different from the opening 1041 surrounded by the light blocking wall 1051 is inhibited from being incident on the light receiving element 1020 corresponding to the opening 1041 surrounded by the light blocking wall 1051. Furthermore, light incident from the edge side of the semiconductor substrate 1010 is inhibited from being incident on the light receiving element 1020 corresponding to the opening 1041 surrounded by the light blocking wall 1051.

Each of the light blocking films 1040 and the light blocking walls 1051 (conductive members 1053) has an electrically conductive property, and a part of the light blocking wall 1053 is electrically connected to the wiring pattern 1011. This allows the electronic elements formed on the semiconductor substrate 1010 to be electrically connected via the light blocking walls 1051 and the light blocking films 1040.

Each of the light blocking portions 1050 has the light absorbing film 1052 having the property of absorbing light, and the light absorbing film 1052 is formed on the upper surface of the light blocking film 1040. This inhibits light incident on the light transparent film 1030 via the openings 1041 from being repeatedly reflected by the interface between the light transparent film 1030 and the semiconductor substrate 1010 and by the interfaces between the light transparent films 1030 and the light blocking films 1040 and propagating in the light transparent films 1030. As a result, it is suppressed that light incident from a given one of the openings 1041 is incident on the light receiving element 1020 which does not correspond to the given opening 1041 and that the output signal from each of the light receiving elements 1020 includes a disturbance output.

Also, in the present embodiment, the light absorbing film 1052 is formed on the end portion 1042 forming the edge of each of the openings 1041 in the light blocking films 1040. When light (e.g., the light shown by the broken-line arrow in FIG. 10) having an elevation angle smaller than the elevation angle defined by the opening 1041 in each of the layers of the light blocking films 1040 is incident in the opening 1041, a part of the light is incident on the end portion 1042 mentioned above. Therefore, as shown in the present embodiment, by forming the light absorbing film 1052 on the end portion 1042, it is possible to inhibit disturbance light from propagating in the light transparent films 1030.

In the present embodiment, a part of the end portion 1042 is inclined so as to face a direction in which light is incident, and the light absorbing film 1052 is formed on the inclined end portion 1042. As a result, the area of the end portion 1042 on which light is incident increases so that the propagation of the disturbance light in the light transparent films 1030 is more effectively inhibited. Furthermore, since the end portion 1042 described above is inclined so as to face the direction in which light is incident, it is possible to direct a portion of light incident on the end portion 1042, which is not absorbed by the light absorbing film 1052 but is reflected, in an outward direction (e.g., the direction opposite to that of the broken-line arrow). This more effectively inhibits the disturbance light from propagating in the light transparent films 1030.

Over the formation surface 1010a of the semiconductor substrate 1010, the light transparent films 1030 are formed and, in the light transparent films 1030, the light blocking films 1040 are formed in multiple layers. In the respective layers of the light blocking films 1040, the openings 1041 for transmitting light corresponding to the respective light receiving elements 1020 are formed. Accordingly, by the openings 1041 formed in the respective layers of the light blocking films 1040, the range of light incident on the semiconductor substrate 1010 is narrowed. This inhibits light incident from a given one of the openings 1041 from being incident on the light receiving element 1020 which does not correspond to the given opening 1041. As a result, the output signal from each of the light receiving elements 1020 is more effectively inhibited from including the disturbance output.

The present embodiment has shown the example in which the light transparent films 1030 are formed over the formation surface 1010a of the semiconductor substrate 1010, and the light blocking films 1040 are formed in multiple layers in the light transparent films 1030. However, it may also be possible to form the one-layer light blocking film 1040. In this case, each of the through holes 1031 is formed so as to extend from the formation surface 1010a and reach the one-layer light blocking film 1040. The through hole 1031 is filled with the conductive member 1053 to form the light blocking wall 1051.

Figure 11:
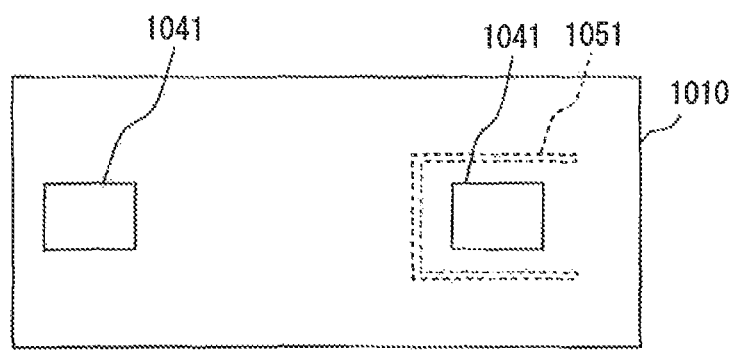
FIG. 11 is a plan view showing a variation of the optical sensor.
Figure 12:
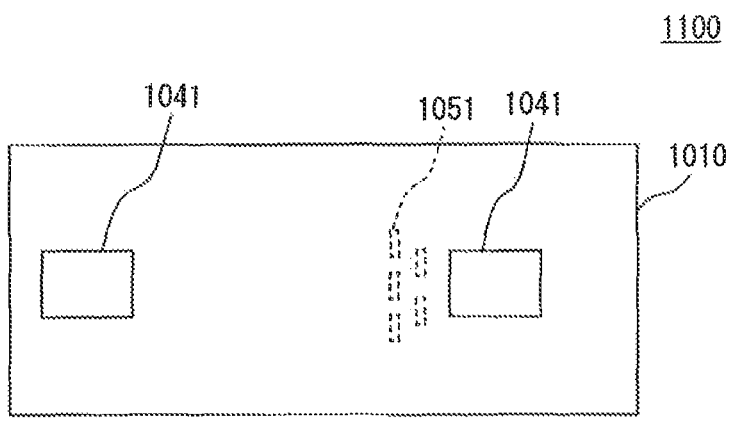
FIG. 12 is a plan view showing a variation of the optical sensor.

The present embodiment has shown the example in which, as shown by the broken lines in FIG. 9, the light blocking wall 1051 is formed in each of the light transparent films 1030 to have a generally annular plan shape so as to surround the periphery of the opening 1041 corresponding to one of the light receiving elements 1020. However, the shape of the light blocking wall 1051 and the position where the light blocking wall 1051 is formed are not limited to those in the foregoing example. For example, as shown in FIG. 11, it may also be possible to form the light blocking wall 1051 having a generally U-shaped plan shape in the region including the portions of the light transparent films 1030 located between the openings 1041 corresponding to any two of the light receiving elements 1020, and surrounding parts of the light transparent films 1030 located around the opening 1041 corresponding to one of the light receiving elements 1020. Alternatively, as shown in FIG. 12, it may also be possible to form the plurality of light blocking walls 1051 each having a generally rectangular plan shape in the portions of the light transparent films 1030 located between the openings 1041 corresponding to any two of the light receiving elements 1020, and thereby allow the plurality of light blocking walls 1051 to traverse the region across which the adjacent openings 1041 oppose each other. FIGS. 11 and 12 are plan views showing variations of the optical sensor.

The present embodiment has shown the example in which a part of the end portion 1042 forming the edge of the opening 1041 is inclined so as to face the direction in which light is incident. However, it may also be possible that the entire end portion 1042 is inclined so as to face the direction in which light is incident.

The present embodiment has shown the example in which the light absorbing film 1052 is formed on the upper surface 1040a of each of the light blocking films 1040. However, it is sufficient for the light absorbing film 1052 to be formed on a surface of the light blocking film 1040. For example, the light absorbing film 1052 may also be formed on a lower surface 1040b of each of the light blocking films 1040.

The present embodiment has shown the example in which the aperture areas of the openings 1041 in the respective layers are equal. However, the aperture areas of the openings 1041 in the respective layers may also be different. For example, the aperture areas of the openings 1041 in the respective layers may also be reduced with approach to the formation surface 1010a.

The present embodiment has shown the example in which the light blocking films 1040 are made of a material having a light blocking property and an electrically conductive property. However, in the case where the individual electronic elements formed on the semiconductor substrate 1010 need not be electrically connected by the light blocking films 1040, the light blocking films 1040 may also be formed of a material having a light absorbing property.

Third Embodiment

Figure 13:
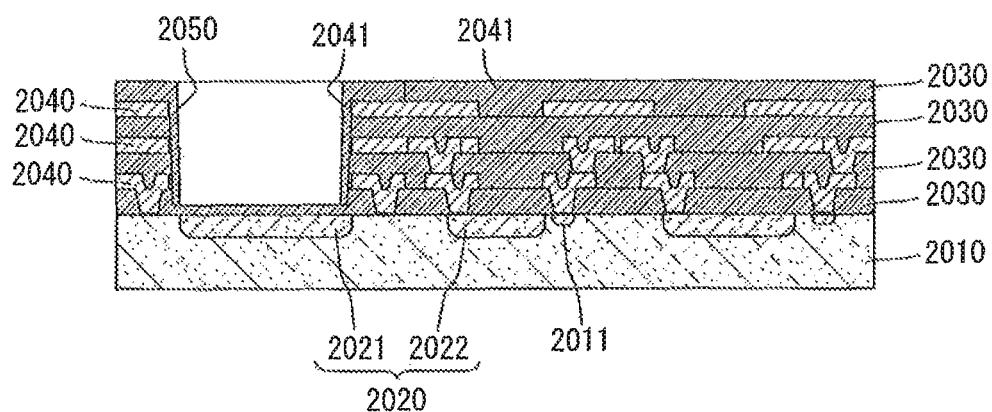
FIG. 13 is a cross-sectional view of an optical sensor according to a third embodiment.
Figure 14:
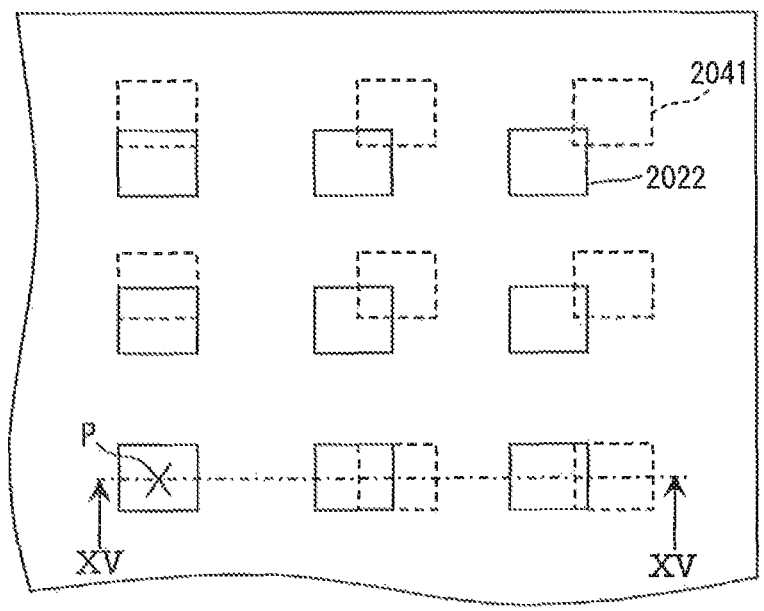
FIG. 14 is a plan view for illustrating the respective positions of light receiving elements for detecting the incident angles of light and openings.
Figure 15:
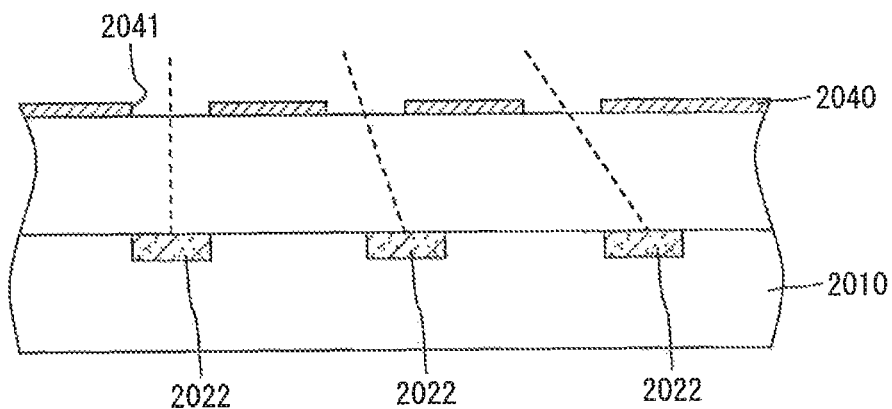
FIG. 15 is a cross-sectional view of the optical sensor along the line XV-XV of FIG. 14.

FIG. 13 is a cross-sectional view showing a schematic configuration of an optical sensor according to a third embodiment. FIG. 14 is a plan view for illustrating the respective positions of light receiving elements for detecting the incident angles of light and openings. FIG. 15 is a cross-sectional view along the line XV-XV of FIG. 14. Note that, in FIG. 14, light receiving elements 2022 for detecting the incident angles of light described later are shown by the broken lines and, in FIG. 15, layers 2030 to 2040 are simplified. In FIG. 15, the virtual lines connecting the centers of the respective light receiving elements 2022 for detecting the incident angles of light and the centers of openings 2041 corresponding to the respective light receiving elements 2022 are shown by the broken lines.

As shown in FIGS. 13 to 15, an optical sensor 2100 includes, as main portions thereof, a semiconductor substrate 2010, light receiving elements 2020, the light transparent films 2030, and the light blocking films 2040. On one surface side of the semiconductor substrate 2010, the light receiving elements 2020 are formed. Over a formation surface thereof where the light receiving elements 2020 are formed, the light transparent films 2030 are formed and, in the light transparent films 2030, the light blocking films 2040 are formed. In the light blocking films 2040, the openings 2041 for transmitting light are formed and, via the openings 2041, light is incident on the light receiving elements 2020. The light receiving elements 2020 are electrically connected to a calculating portion (not shown) so that an output signal from each of the light receiving elements 2020 is processed in the calculating portion. The calculating portion calculates the intensity of light incident on the optical sensor 2100 and the elevation angle and right-left angle thereof based on output signals from light receiving elements 2021 and 2022 described later. In the following, a schematic configuration of the main portions 2010 to 2040 of the optical sensor 2100 is shown first, and then the characteristic feature of the optical sensor 2100 and the operation/effect thereof will be described.

The semiconductor substrate 2010 is formed in a rectangular shape, and the light receiving elements 2020 described above and electronic elements (not shown) forming the calculating portion described above are formed thereon. These electronic elements are electrically connected via a wiring pattern 2011 formed in the semiconductor substrate 2010.

Each of the light receiving elements 2020 is for converting light to an electric signal, and the light receiving element 2021 (hereinafter shown as the intensity light receiving element 2021) for detecting the intensity of light and the light receiving elements 2022 (hereinafter shown as the angle light receiving element 2022) for detecting the incident angles of light are formed on the semiconductor substrate 2010. Each of the light receiving elements 2021 and 2022 is a photodiode having a PN junction, and the light receiving area of the intensity light receiving element 2021 is larger than the light receiving area of each of the angle light receiving elements 2022.

The light transparent films 2030 are made of a material having a light transparent property and an insulating property. Examples of a material having such properties include a silicon oxide. As shown in FIG. 13, the light transparent films 2030 are formed in multiple layers over the formation surface of the semiconductor substrate 2010. In the present embodiment, the four-layer light transparent films 2030 are formed over the formation surface, and the light transparent film 2030 located immediately over the formation surface corresponds to a protective film.

The light blocking films 2040 are made of a material having a light blocking property and an electrically conductive property. Examples of a material having such properties include aluminum. As shown in FIG. 13, each of the light blocking films 2040 is formed between the two layers of the light transparent films 2030, and the multi-layer light blocking films 2040 are formed over the formation surface of the semiconductor substrate 2010 via the light transparent films 2030. In the present embodiment, the three-layer light blocking films 2040 are formed in the light transparent films 2030, and the openings 2041 corresponding to the respective light receiving elements 2021 and 2022 are formed in the respective layers of the light blocking films 2040. In the present embodiment, the aperture areas of the opening 2041 formed in the respective light blocking films 2040 are equal. The openings 2041 in each of the layers define the elevation angles of light formed by lines parallel with the light receiving surfaces of the respective light receiving elements 2021 and 2022 and a direction in which light advances. As shown in FIG. 13, the light blocking films 2040 are electrically connected to the wiring pattern 2011, and also perform the function of wires electrically connecting the electronic elements formed on the semiconductor substrate 2010.

As shown in FIGS. 14 and 15, the angle light receiving elements 2022 and the openings 2041 are located on a plurality of virtual lines (not shown) radially extending from the reference point P represented by the cross mark. With distance from the reference point P, the spaced-apart distances between the angle light receiving elements 2022 and the openings 2041 are longer. Due to this configuration, the elevation angles defined by the openings 2041 corresponding to the respective angle light receiving elements 2022 are different, and nine output signals which are different in at least one of elevation angle and right-left angle are obtained. The calculating portion detects the angles (elevation angle and right-left angle) of light based on the nine output signals, and detects the intensity of light based on the detected angles of light and an output signal from the intensity light receiving element 2021. Specifically, the calculating portion calculates a ratio between the nine output signals from the angle light receiving elements 22 to calculate the incident angles of light, and calculates the intensity of light based on the calculated incident angles of light and the output signal from the intensity light receiving element 2021.

Next, the characteristic feature of the optical sensor 2100 according to the present embodiment and the operation/effect thereof will be described. As shown in FIG. 13, the three layers of the four-layer light transparent films 2030 located over the intensity light receiving element 2021 for detecting the intensity of light and all the three layers of the light blocking films 2040 have been removed and, on the light receiving surface of the intensity light receiving element 2021, only the one-layer light transparent film 2030 is formed. This allows the intensity of light incident on the semiconductor substrate 2010 to be detected with excellent accuracy even when the intensity of light is extremely weak. In addition, the output signal from the intensity light receiving element 2021 is inhibited from including the effect of interference of light resulting from the reflection of the light between the individual layers formed over the formation surface of the semiconductor substrate 2010. Moreover, in the present embodiment, the incident angles of light are calculated based on the output signals from the angle light receiving elements 2022, and the intensity of light is calculated based on the calculated incident angles of light and on the output signal from the intensity light receiving element 2021. Therefore, the intensity of light is inhibited from including intensity variations in accordance with the incident angles of light, and the accuracy of detection of the light intensity is improved.

As described above, of the light receiving elements 2021 and 2022, only the intensity light receiving element 2021 is in a state where the light transparent films 2030 have been removed therefrom. In other words, the angle light receiving elements 2022 are in a state where the light transparent films 2030 have not been removed therefrom. Since the angle light receiving elements 2022 compare the respective outputs from the plurality of angle light receiving elements 2022 with each other and output the angles (relative values) of light, even when the angle light receiving elements 2022 receive the effect of interference of light described above, as long as each of the angle light receiving elements 2022 has received the same influence, outputs therefrom have no problem. Therefore, the angle light receiving elements 2022 have been brought into a state where they are intentionally not exposed, and the light transparent films 2030 are left. On the other hand, the intensity light receiving element 2021 does not output such relative values as outputted from the angle detecting elements 2022, but outputs an absolute value. Therefore, influence resulting from the effect of interference of light inhibits an improvement in the accuracy of detection of the light intensity. Accordingly, in the present embodiment, only the intensity light receiving element 2021 is in an exposed state. Thus, the characteristic feature of the present embodiment does not lie in the mere fact that, in the optical sensor 2100 having the plurality of light receiving elements 2021 and 2022, any of the light receiving elements is in an exposed state, but in the fact that only the intensity light receiving element 2021 is in the exposed state.

In the present embodiment, the light receiving area of the intensity light receiving element 2021 is larger than the light receiving area of each of the angle light receiving elements 2022. This allows an increase in the amount of light incident on the intensity light receiving element 2021.

The light receiving surfaces of the light receiving elements 2021 and 2022 are covered with the light transparent films 2030. This prevents the light receiving surfaces from being exposed to the outside so that the durability of each of the light receiving elements 2021 and 2022 is improved.

In the present embodiment, the light blocking films 2040 are formed in multiple layers in the light transparent films 2030 and, between the openings 2041 adjacent to each other, the multilayer light blocking films 2040 are formed. This inhibits light incident from a given one of the openings 2041 from being incident on the light receiving element 2020 other than the light receiving element 2020 corresponding to the given opening 2041. As a result, the output signal from each of the light receiving elements 2020 is inhibited from including a disturbance output.

Figure 16:
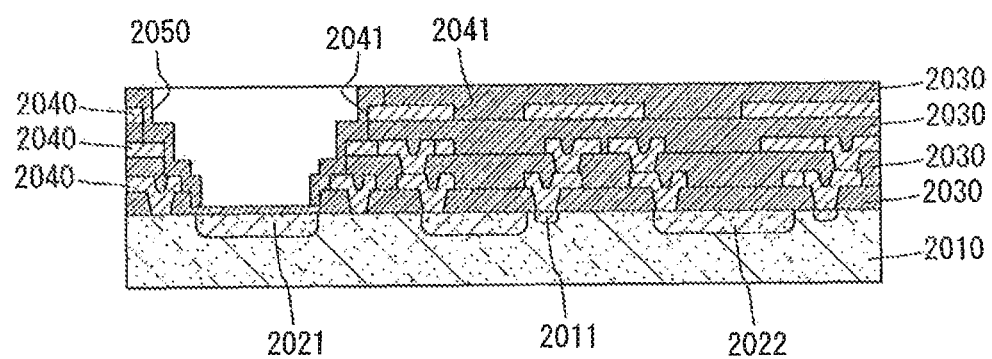
FIG. 16 is a cross-sectional view for illustrating a variation of the optical sensor.

As shown in FIG. 13, in the present embodiment, a recessed portion 2050 using the light receiving surface of the intensity light receiving element 2021 as the bottom surface thereof and using both the light transparent films 2030 and the light blocking films 2040 as the side walls thereof is formed, and the aperture area of the recessed portion 2050 is constant. However, as shown in FIG. 16, it is also possible to adopt a configuration in which the side walls of the recessed portion 2050 are inclined such that the aperture area of the recessed portion 2050 gradually increases upward over the intensity light receiving element 2021. This increases the amount of light incident on the intensity light receiving element 2021. FIG. 16 is a cross-sectional view for illustrating a variation of the optical sensor.

As shown in FIG. 13, the present embodiment has shown the example in which the one intensity light receiving element 2021 is formed on the semiconductor substrate 2010. However, it may also be possible that a plurality of the intensity light receiving elements 2021 are formed on the semiconductor substrate 2010. In that case, it may also be possible to vary the thickness of the light transparent film 2030 located immediately over the formation surface and performing the function of the protective film in the plurality of intensity light receiving elements 2021 and thereby vary the spectral sensitivity characteristic of each of the intensity light receiving elements 2021. Alternatively, it may also be possible to vary the thickness of the diffusion layer of each of the intensity light receiving elements 2021, which are the photodiodes each having the PN junction, and thereby vary the spectral sensitivity characteristic of each of the intensity light receiving elements 2021.

The present embodiment has shown the example in which the nine angle light receiving elements 2022 are formed on the semiconductor substrate 2010. However, the number of the angle light receiving elements 2022 is appropriate as long as it is not less than 3, and is not limited to the number in the foregoing example.

The present embodiment has shown the example in which the light transparent films 2030 are in four layers, and the light blocking films 2040 are in three layers. However, the respective numbers of the layers of the light transparent films 2030 and the light blocking films 2040 are not limited to those in the foregoing example. For example, it is also possible to adopt a structure in which the light transparent films 2030 are in three layers, and the light blocking films 2040 are in two layers.

The present embodiment has shown the example in which the light blocking films 2040 are made of a material having a light blocking property and an electrically conductive property. However, in the case where the individual electronic elements formed on the semiconductor substrate 2010 need not be electrically connected by the light blocking films 2040, the light blocking films 2040 may also be formed of a material having a light absorbing property.

Fourth Embodiment

Figure 17:
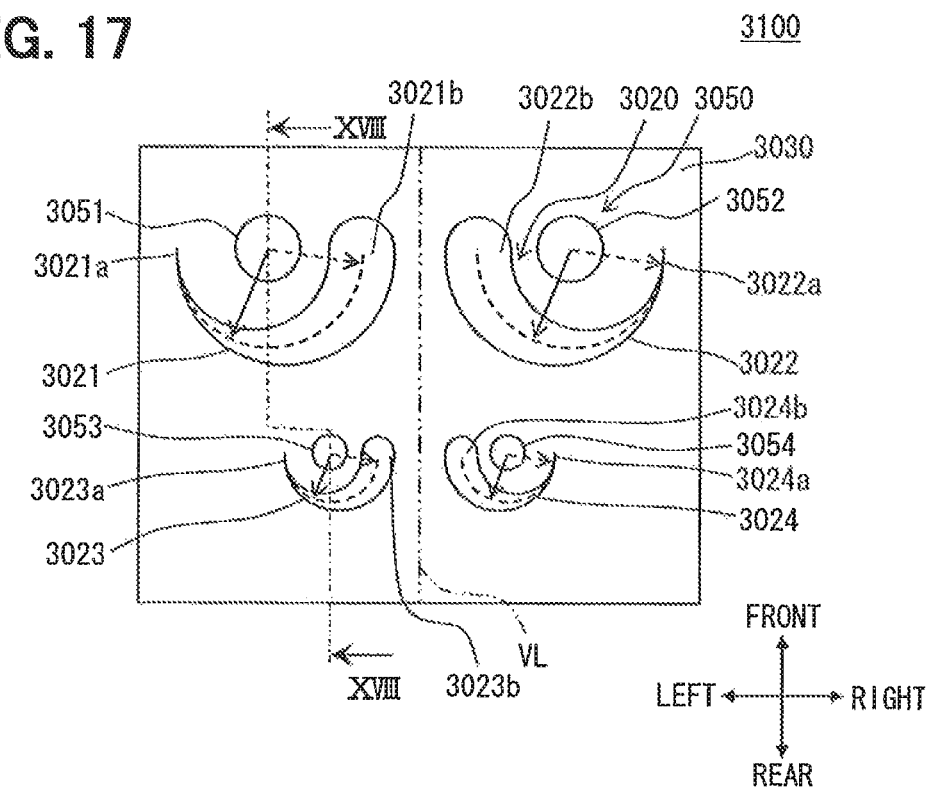
FIG. 17 is a plan view of an optical sensor according to a fourth embodiment.
Figure 18:
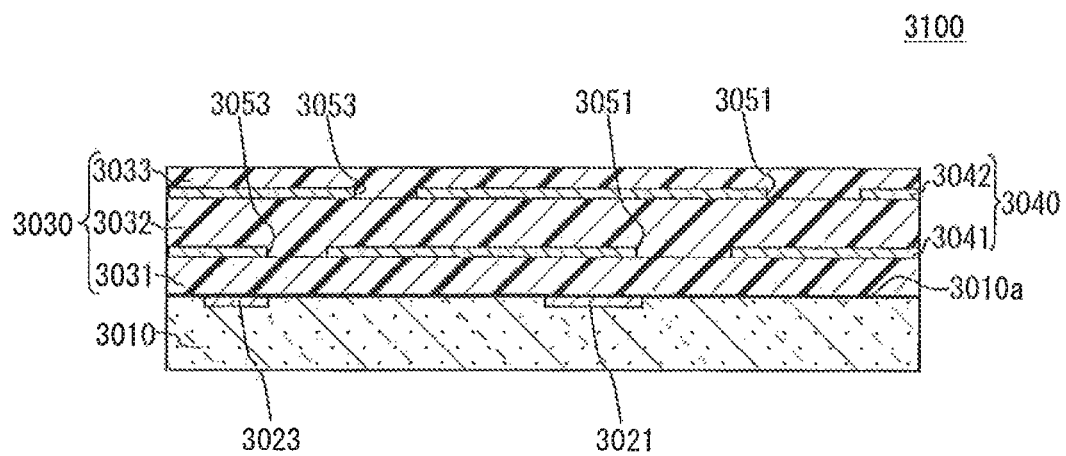
FIG. 18 is a cross-sectional view of the optical sensor along the line XVIII-XVIII of FIG. 17.
Figure 19:
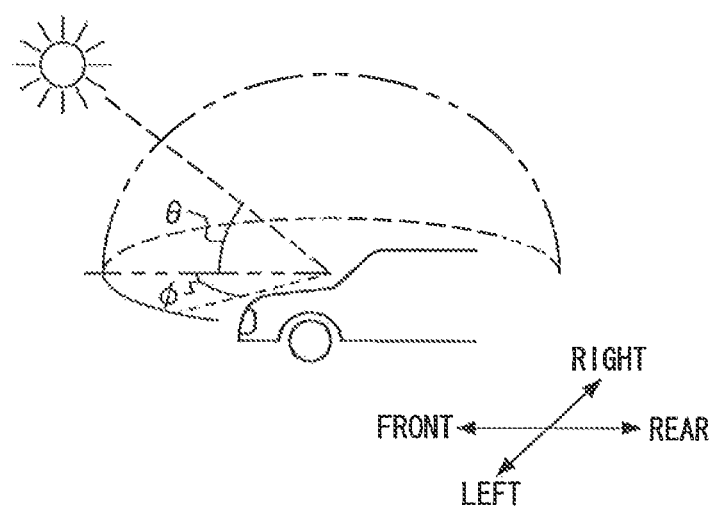
FIG. 19 is a schematic view for illustrating an elevation angle and an azimuth angle.
Figure 20:
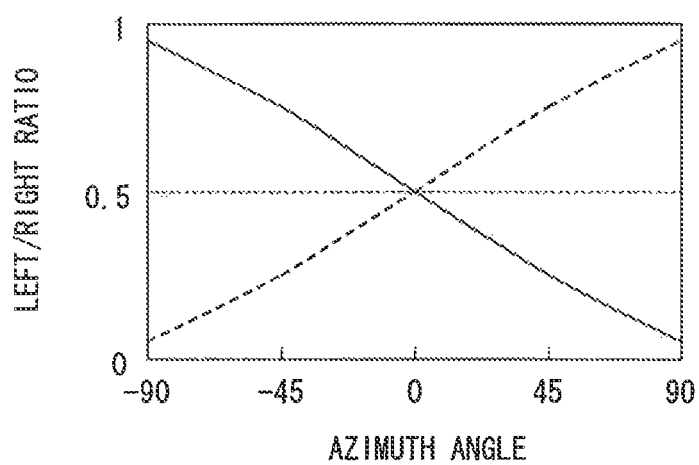
FIG. 20 is a graph diagram showing a right-left ratio.

FIG. 17 is a plan view showing a schematic configuration of an optical sensor according to a fourth embodiment. FIG. 18 is a cross-sectional view along the line XVIII-XVIII of FIG. 17. FIG. 19 is a schematic view for illustrating an elevation angle and an azimuth angle. FIG. 20 is a graph diagram showing a right-left ratio. Note that, in FIG. 17, light receiving elements 3021 to 3024 and openings 3051 to 3054, which will be described later, are shown by the solid lines, and a line defining respective positions where the light receiving elements 3021 to 3024 and the openings 3051 to 3054 are formed is shown by the two-dot-dash line as a virtual line VL. In the following, a direction extending along a formation surface 3010a where light receiving elements 3020 described later are formed and through a vehicle between the front and rear thereof is shown as a front-rear direction, and a direction extending along the formation surface 3010a and through the vehicle between the left and right thereof is shown as a right-left direction. Note that the virtual line VL mentioned above extends along the front-rear direction.

An optical sensor 3100 is mounted on the front panel of the vehicle, and used mainly for detecting the position of the sun. As shown in FIGS. 17 and 18, the optical sensor 3100 includes, as main portions thereof, a semiconductor substrate 3010, the light receiving elements 3020, light transparent films 3030, light blocking films 3040, and openings 3050. On one surface side of the semiconductor substrate 3010, the light receiving elements 3020 are formed. Over the formation surface 3010a where the light receiving elements 3020 are formed, the light transparent films 3030 are formed and, in the light transparent films 3030, the light blocking films 3040 are formed. In the light blocking films 3040, the openings 3050 for transmitting light are formed and, via the openings 3050, light is incident on the light receiving elements 3020. The optical sensor 3100 includes a calculating portion for processing output signals from the light receiving elements 3020, though not shown. The calculating portion approximately calculates the elevation angle of light incident on the optical sensor 3100 and the azimuth angle thereof. In the following, a schematic configuration of the main portions 3010 to 3050 of the optical sensor 3100 is shown first, and then the characteristic feature of the optical sensor 3100 will be described.

The semiconductor substrate 3010 is formed in a rectangular shape, and the light receiving elements 3020 described above and electronic elements (not shown) forming the calculating portion are formed thereon. These electronic elements are electrically connected via a wiring pattern (not shown) formed in the semiconductor substrate 3010.

Each of the light receiving elements 3020 is for converting light to an electric signal. Each of the light receiving elements 3020 according to the present embodiment is a photodiode having a PN junction, and formed over the formation surface 3010a side of the semiconductor substrate 3010. On the formation surface 3010a, the two pairs of light receiving elements 3021 to 3024 are formed. The light receiving elements 3021 and 3022 are paired up, while the light receiving elements 3023 and 3024 are paired up. These light receiving elements 3021 to 3024 are the characteristic feature of the optical sensor 3100, and therefore will be described later in detail.

The light transparent films 3030 are made of a material having a light transparent property and an insulating property. Examples of a material having such properties include an interlayer insulating film $SiO_2$ used in a semiconductor process. As shown in FIG. 18, the light transparent films 3030 are formed in multiple layers over the formation surface 3010a. In the present embodiment, light transparent films 3031 to 3033 are stacked in three layers over the formation surface 3010a.

The light blocking films 3040 are made of a material having a light blocking property and an electrically conductive property. Examples of a material having such properties include aluminum. As shown in FIG. 18, each of the light blocking films 3040 is formed between the two layers of the light transparent films 3030, and the multi-layer light blocking films 3040 are formed over the formation surface 3010a via the light transparent films 3030. In the present embodiment, two blocking films 3041 and 3042 are formed in the light transparent films 3030, and the openings 3050 are formed in each of the light blocking films 3041 and 3042. Note that the light blocking films 3040 are electrically connected to the wiring pattern formed in the semiconductor substrate 3010 to also function as wiring electrically connecting the individual electronic elements, though not shown.

The openings 3050 are for defining light incident on the light receiving elements 3020. In each of the light blocking films 3041 and 3042, the two pairs of openings 3051 to 3054 are formed. The openings 3051 and 3052 are paired up, while the openings 3053 and 3054 are paired up. The openings 3051 to 3054 are the characteristic feature of the optical sensor 3100, and therefore will be described later in detail.

The calculating portion is for approximately calculating the elevation angle of external light incident on the optical sensor 3100 (vehicle) and the azimuth angle thereof based on the output signals from the light receiving elements 3020. In other words, the calculating portion is for calculating the approximate height of the sun and to what degree the sun is located in either a leftward or rightward direction from the vehicle (right-left ratio). The approximate height of the sun is calculated by comparing output signals from the unpaired light receiving elements 3021 and 3023 or from the unpaired light receiving elements 3022 and 3024 with each other. The right-left ratio is calculated by determining a ratio between a value (first value) obtained by dividing the output signal from the first light receiving element 3021 by the total sum of the output signals from the two light receiving elements 3021 and 3022 and a value (second value) obtained by dividing the output signal from the second light receiving element 3022 by the total sum of the output signals from the two light receiving elements 3021 and 3022. Alternatively, the right-left ratio is calculated by determining a ratio between a value (third value) obtained by dividing the output signal from the third light receiving element 3023 by the total sum of the output signals from the two light receiving elements 3023 and 3024 and a value (fourth value) obtained by dividing the output signal from the fourth light receiving element 3024 by the total sum of the output signals from the two light receiving elements 3023 and 3024. The reason for this will be described when the operation/effect of the optical sensor 3100 is described. Note that, as shown in FIG. 19, an elevation angle θ shows an upward angle from a horizontal plane, and an azimuth angle φ shows an angle around the vehicle.

Next, the characteristic feature of the optical sensor 3100 according to the present embodiment will be described. As shown in FIG. 17, the paired light receiving elements 3021 and 3022 are line-symmetrical with respect to the virtual line VL, and the paired light receiving elements 3023 and 3024 are line-symmetrical with respect to the virtual line VL. The first light receiving element 3021 and the third light receiving element 3023 are located leftward from the virtual line VL, while the second light receiving element 3022 and the fourth light receiving element 3024 are located rightward from the virtual line VL. Each of the light receiving elements 3021 to 3024 is formed in a recessed shape (generally letter-C shape) extending from the front to the rear, while being recessed in the middle portion therebetween. The lateral widths of the light receiving elements 3021 to 3024 continuously increase with distance from end portions 3021a to 3024a thereof farther away from the virtual line VL toward end portions 3021b to 3024b thereof closer to the virtual line VL. The end portions 3021b to 3024b have linear shapes, and lines (lines shown as the broken lines in FIG. 17) passing through the respective middles of the lateral widths of the light receiving elements 3021 to 3024 exhibit arc shapes each having a predetermined radius. Consequently, the overall shape of each of the light receiving elements 3021 to 3024 has a horn-like shape. Note that the center angle of a fan formed by the line connecting the line forming the arc and the center of the arc is 180 degrees. Each of the lateral widths described above shows a length in a direction intersecting the line (line passing through the middle of the lateral width) forming the arc. In the present embodiment, the paired light receiving elements 3021 and 3022 are larger than the paired light receiving elements 3023 and 3024.

As shown in FIG. 17, the paired openings 3051 and 3052 are line-symmetrical with respect to the virtual line VL, and the paired openings 3053 and 3054 are line-symmetrical with respect to the virtual line VL. Each of the openings 3051 to 3054 of the light blocking film 3042 farther away from the formation surface 3010a has a circular shape, while the openings 3051 to 3054 formed in the light blocking film 3041 have shapes corresponding to the respective shapes of the light receiving elements 3021 to 3024, though not shown. That is, each of the openings 3051 to 3054 formed in the light blocking film 3041 has a horn-like shape.

Also, as shown in FIG. 17, parts of the projected portions of the openings 3051 to 3054 projected on the formation surface 3010a by light intersecting the formation surface 3010a are located in regions enclosed by the corresponding light receiving elements 3021 to 3024 and the lines connecting the end portions 3021a to 3024a of the light receiving elements 3021 to 3024 and the end portions 3021b to 3024b thereof. Further, in the present embodiment, the centers of the projected portions of the openings 3051 to 3054 are located at the centers of the arcs shown by the broken lines, and the distances between the centers of the openings 3051 to 3054 and the middles of the lateral widths of the light receiving elements 3021 to 3024 are constant. In addition, as shown in FIGS. 17 and 18, the distances between the paired light receiving elements 3021 and 3022 and the openings 3051 and 3052 corresponding thereto are different from the distances between the paired light receiving elements 3023 and 3024 and the openings 3053 and 3054 corresponding thereto.

Next, the operation/effect of the optical sensor 3100 according to the present embodiment will be described. As described above, each of the light receiving elements 3021 to 3024 is formed in the recessed shape extending from the front to the rear, while being recessed in the middle portion therebetween, and the center angle of the fan formed by the line connecting the line passing through the middle of the lateral width of each of the light receiving elements 3021 to 3024 and forming the arc and the center of the arc is 180 degrees. As a result, light incident on the optical sensor 3100 (vehicle) from the rear side is not incident on each of the light receiving elements 3021 to 3024, but light incident on the optical sensor 3100 from the front side is incident on the rear portion of each of the light receiving elements 3021 to 3024 via the openings 3051 to 3054. Thus, the light incident on the optical sensor 3100 from the front side is entirely included in the detection range. Therefore, the light from the front side is inhibited from being incident on only one of the paired light receiving elements 3021 and 3022 (3023 and 3024), and the output signal from each of the light receiving elements 3021 to 3024 is inhibited from becoming 0.

Also, as described above, the respective lateral widths of the light receiving elements 3021 to 3024 continuously increase with distance from the end portions 3021a to 3024a thereof toward the end portions 3021b to 3024b thereof. Accordingly, when, e.g., light is incident from the right front side as shown by the solid-line arrows in FIG. 17, the light is incident on the left rear portions of the respective light receiving elements 3021 to 3024 via the openings 3051 to 3054. The area where the light is received is larger in the second light receiving element 3022 than in the first light receiving element 3021, and larger in the fourth light receiving element 3024 than in the third light receiving element 3023. On the other hand, when light is incident from the left front side as shown by the broken-line arrows in FIG. 17, the magnitude relationships associated with the area where light is received are reversed. That is, the area where the light is received is larger in the first light receiving element 3021 than in the second light receiving element 3022, and larger in the third light receiving element 3023 than in the fourth light receiving element 3024. As a result, when light is incident from the right front side, the output signal from the second light receiving element 3022 is larger than the output signal from the first light receiving element 3021, and the output signal from the third light receiving element 3023 is larger than the output signal from the fourth light receiving element 3024. Conversely, when light is incident from the left front side, the output signal from the first light receiving element 3021 is larger than the output signal from the second light receiving element 3022, and the output signal from the fourth light receiving element 3024 is larger than the output signal from the third light receiving element 3023.

Therefore, by determining a ratio between the first value and the second value or a ratio between the third value and the fourth value, which is defined in the description of the calculating portion, it is possible to detect how much light is incident on the optical sensor 3100 from the left side or how much light is incident on the optical sensor 3100 from the right side. That is, the right-left ratio of light can be calculated. It can be seen that, when the ratio between the first value and the second value is, e.g., 2:3, the sun is positioned rightward from the front side to a degree corresponding to the value and, when the ratio therebetween is, e.g., 8:1, the sun is positioned leftward from the front side to a degree corresponding to the value. For reference, the azimuth angle characteristic of the right-left ratio calculated by the optical sensor 3100 is shown in FIG. 20. The abscissa axis of the graph shown in FIG. 20 shows the azimuth angle, and the ordinate axis thereof shows the right-left ratio. The first value is represented by the sold line, and the second value is represented by the broken line. From this, is can be seen that, in the case of the optical sensor 3100 according to the present invention, even when the azimuth angle is ±90 degrees, the right-left ratio is not saturated.

As shown above, according to the present invention, each of the output signals from the paired light receiving elements 3021 and 3022 (3023 and 3024) is inhibited from becoming 0. Since the respective output signals therefrom are different, the right-left ratio of light is inhibited from being saturated. Note that, when light is incident on the vehicle from straight ahead thereof, the light receiving areas of light incident on the respective rear portions of the paired light receiving elements 3021 and 3022 (3023 and 3024) are the same so that each of the first value and the second value (the third value and the fourth value) is 0.5 and equal to each other. In this case, the right-left ratio is 1:1.

In the present embodiment, the two pairs of light receiving elements 3021 to 3024 are formed on the semiconductor substrate 3010, and the two pairs of openings 3051 to 3054 corresponding thereto are formed in the light blocking films 3040. In the configuration, unlike in a configuration in which one pair of light receiving elements are formed on a semiconductor substrate, at least two right-left ratios can be calculated so that the accuracy of detection of the right-left ratios is improved.

In the present embodiment, the distances between the paired light receiving elements 3021 and 3022 and the openings 3051 and 3052 corresponding thereto are different from the distances between the paired light receiving elements 3023 and 3024 and the openings 3053 and 3054 corresponding thereto. Accordingly, the elevation angles of light incident on the light receiving surfaces of the light receiving elements, which are defined by the positions where the light receiving elements and the openings are formed, are different in the unpaired light receiving elements 3021 and 3023 (3022 and 3024) (see FIG. 18). Therefore, by comparing the output signals from the two light receiving elements 3021 and 3023 (3022 and 3024) with each other and detecting the higher output signal, it is possible to calculate the approximate height of the sun. Also, unlike in a configuration in which one pair of light receiving elements and one independent light receiving element are formed on a semiconductor substrate, at least two pairs of output signals having different elevation angle characteristics can be obtained so that the accuracy of detection of the elevation angles is improved.

In the present embodiment, the lines passing though the middles of the lateral widths of the respective light receiving elements 3021 to 3024 exhibit the arc shapes each having the predetermined radius and, at the centers of the arcs, the centers of the projected portions of the openings 3051 to 3054 are located. Accordingly, the distances between the centers of the openings 3051 to 3054 and the middles of the lateral widths of the light receiving elements 3021 to 3024 are constant. Therefore, even when the direction of light incident from the front side changes, the amounts of light incident on the respective light receiving surfaces of the paired light receiving elements 3021 and 3022 (3023 and 3024) are dependent only on the lateral widths of the respective light receiving elements 3021 to 3024. As a result, when light incident from the front side has changed, the amounts of light incident on the respective light receiving surfaces of the paired light receiving elements 3021 and 3022 (3023 and 3024) are no longer dependent only on the lateral widths of the light receiving elements 3021 to 3024. Consequently, the accuracy of detection of the right-left ratio of light is inhibited from deteriorating.

In the present embodiment, the lateral widths of the respective light receiving elements 3021 to 3024 continuously increase with distance from the end portions 3021a to 3024a thereof toward the end portions 3021b to 3024b thereof. With the configuration, unlike with the configuration in which the light receiving elements 3021 to 3024 discontinuously widen with distance from the end portions 3021a to 3024a thereof toward the end portions 3021b to 3024b thereof, it is possible to bring the incidence angle characteristic of each of the output signals from the light receiving elements 3021 to 3024 closer to a linear shape.

In the present embodiment, the light blocking films 3040 are formed in multiple layers in the light transparent films 3030, and the elevation angles of light are defined by the openings 3051 to 3054 formed in the light blocking films 3041 and 3042. As a result, the two-layer light blocking films 3041 and 3042 are located between any two of the light receiving elements so that light incident from a given one of the openings is inhibited from being incident on the light receiving element other than the light receiving element corresponding to the given opening. This inhibits the output signal from each of the light receiving elements 3021 to 3024 from including noise.

In the present embodiment, the shapes of the respective openings 3051 to 3054 formed in the light blocking film 3041 correspond to the shapes of the respective light receiving elements 3021 to 3024. In the configuration, unlike in a configuration in which the shapes of the respective openings 3051 to 3054 formed in the light blocking film 3041 do not correspond to the shapes of the respective light receiving elements 3021 to 3024, the light blocking film 3041 is inhibited from blocking light incident on the light receiving elements 3021 to 3024.

The present embodiment has shown the example in which the optical sensor 3100 is mounted on the vehicle. However, the application of the optical sensor 3100 is not limited to that in the foregoing example.

The present embodiment has shown the example in which the two pairs of light receiving elements 3021 to 3024 are formed on the semiconductor substrate 3010. However, the number of the pairs of the paired light receiving elements 2020 is sufficient as long as the number thereof is not less than one, and is not limited to that in the foregoing example.

The present embodiment has shown the example in which the respective lateral widths of the light receiving elements 3021 to 3024 continuously increase with distance from the end portions 3021a to 3024a thereof to the end portions 3021b to 3024b thereof. However, it is also possible to adopt a configuration in which the lateral widths of the respective light receiving elements 3021 to 3024 discontinuously decrease with distance from the end portions 3021a to 3024a thereof toward the end portions 3021b to 3024b thereof. However, in this case, the incidence angle characteristic of each of the output signals from the light receiving elements 3021 to 3024 is far from a linear shape, and therefore a shape which continuously widens as shown in the present embodiment is preferred.

As described above, the present embodiment has shown the example in which the lateral widths of the respective light receiving elements 3021 to 3024 continuously increase with distance from the end portions 3021a to 3024a thereof toward the end portions 3021b to 3024b thereof. However, as shown in FIG. 21, it is also possible to adopt a configuration in which the lateral widths of the respective light receiving elements 3021 to 3024 continuously decrease with distance from the end portions 3021a to 3024a thereof toward the end portions 3021b to 3024b thereof. FIG. 21 is a plan view showing a variation of the optical sensor.

The present embodiment has shown the example in which, as shown in FIG. 17, the center angle of a fan formed by the line connecting the line passing through the middles of the lateral widths of the respective light receiving elements 3021 to 3024 and forming the arc and the center of the arc is 180 degrees. However, as shown in FIG. 22, the center angle may also be not less than 180 degrees. This allows a part of light incident on the optical sensor 3100 from the rear side thereof to be included in the detection range. FIG. 22 is a plan view showing a variation of the optical sensor.

Figure 23:
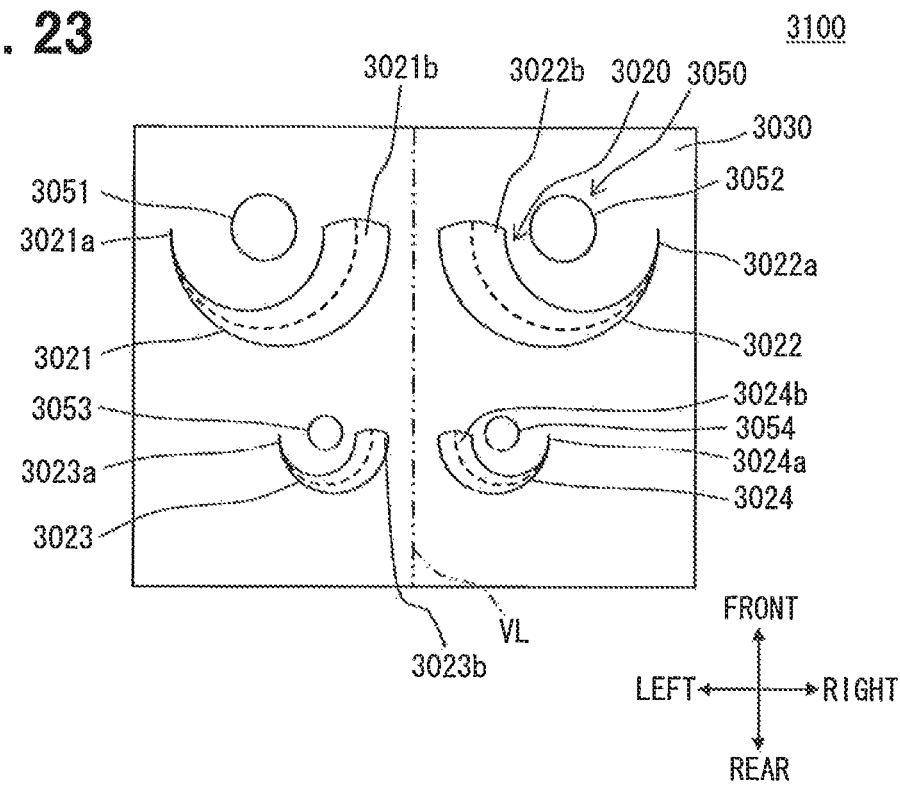
FIG. 23 is a plan view showing a variation of the optical sensor.

In the present embodiment, each of the end portions 3021b to 3024b has the linear shape, and the overall shape of each of the light receiving elements 3021 to 3024 is the horn-like shape. However, the overall shape of each of the light receiving elements 3021 to 3024 is not limited to that in the foregoing example. For example, as shown in FIG. 23, it may also be possible that each of the end portions 3021b to 3024b has a curved shape and the overall shape of each of the light receiving elements 302 to 3024 is a comma-like shape. Note that, in this case, the lateral widths of the respective end portions 3021b to 3024b start to decrease midway. The regions of the respective end portions 2021b and 3022b which start to narrow are located on the front side of the line connecting the two openings 3051 and 3052, and the regions of the respective end portions 2023b and 3024b which start to narrow are located on the front side of the line connecting the two openings 3053 and 3054. Therefore, light incident on the optical sensor 3100 from the front side is less likely to be incident on the regions which start to narrow midway, and the regions which start to narrow are less likely to contribute to the detection of the right-left ratio of the light incident from the front side. FIG. 23 is a plan view showing a variation of the optical sensor.

The present embodiment has shown the example in which the light transparent films 3030 are in three layers, and the light blocking films 3040 are in two layers. However, the respective numbers of the layers of the light transparent films 3030 and the light blocking films 3040 are not limited to those in the foregoing example. It is also possible to adopt a structure in which, e.g., the light transparent films 3030 are in four layers, and the light blocking films 3040 are in three layers.

The present embodiment has shown the example in which each of the openings 3051 to 3054 formed in the light blocking film 3041 has the horn-like shape. However, it is sufficient for the openings 3051 to 3054 formed in the light blocking film 3041 to have shapes corresponding to the shapes of the respective light receiving elements 3021 to 3024. The shapes of the respective openings 3051 to 3054 formed in the light blocking film 3041 are not limited to those in the foregoing example. For example, as in the light receiving elements 3021 to 3024 shown in FIG. 23, the openings 3051 to 3054 formed in the light blocking film 3041 may also have comma-like shapes.

The present embodiment has shown the example in which the light blocking films 3040 are made of a material having a light blocking property and an electrically conductive property. However, in the case where the individual electronic elements formed on the semiconductor substrate 3010 need not be electrically connected by the light blocking films 3040, the light blocking films 3040 may also be formed of a material having a light absorbing property.

In the present embodiment, the detection of the amount of solar radiation has not particularly been mentioned. However, it is possible to, e.g., compare the output signals from the unpaired light receiving elements 3021 and 3023 (3022 and 3024) with each other, and approximately calculate the amount of solar radiation based on the higher output signal.

Fifth Embodiment

Figure 24:
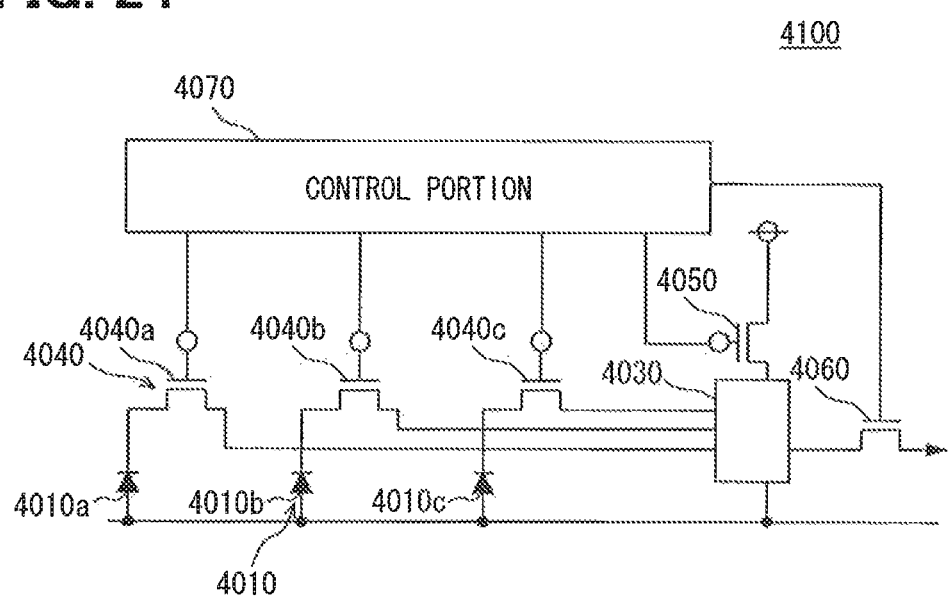
FIG. 24 is a circuit diagram showing a schematic configuration of an optical sensor device according to a fifth embodiment.
Figure 25:
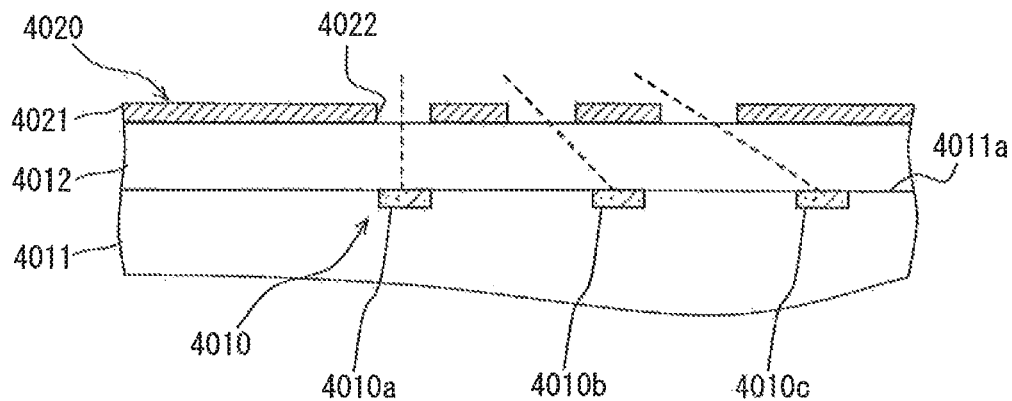
FIG. 25 is a cross-sectional view for illustrating a defining portion and light receiving elements.
Figure 26:
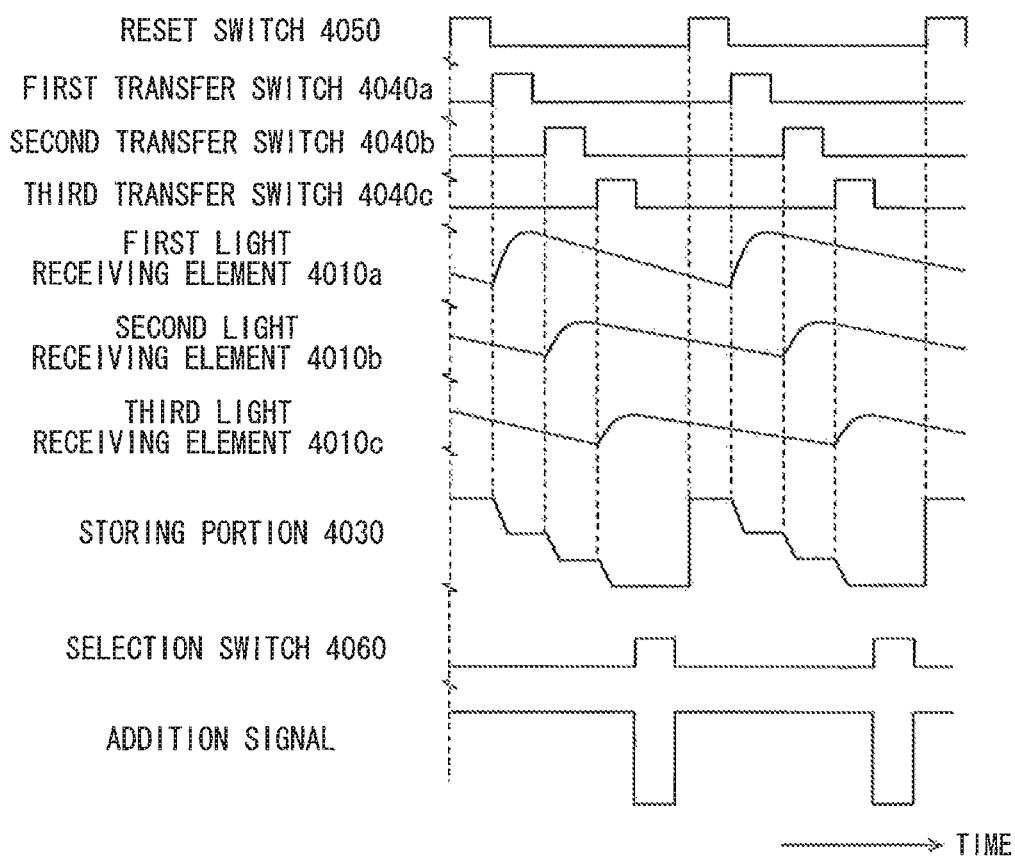
FIG. 26 is a timing chart for illustrating signals in the optical sensor.

FIG. 24 is a circuit diagram showing a schematic configuration of an optical sensor device. FIG. 25 is a cross-sectional view for illustrating a defining portion and light receiving elements. FIG. 26 is a timing chart for illustrating signals in an optical sensor. Note that, in FIG. 25, the virtual lines connecting the centers of light receiving elements 4010 and the centers of openings 4022 corresponding to the light receiving elements 4010 are shown as the broken lines.

As shown in FIGS. 24 and 25, an optical sensor 4100 includes, as main portions thereof, the light receiving elements 4010, a defining portion 4020, a storing portion 4030, transfer switches 4040, a reset switch 4050, a selection switch 4060, and a control portion 4070. When light is incident on the light receiving elements 4010, charges corresponding to the amount of the light are stored in each of the light receiving elements 4010. When each of the transfer switches 4040 is brought into a closed state, the charges stored in the light receiving element 4040 are inputted to the storing portion 4030 via the transfer switch 4040. The storing portion 4030 stores the charges transferred from the light receiving element 4010 and converts the stored charges to a voltage corresponding thereto. When the selection switch 4060 is brought into the closed state, the voltage resulting from the conversion in the storing portion 4030 is outputted to the outside via the selection switch 4060.

Each of the light receiving elements 4010 is for storing charges corresponding to the amount of received light, and is a photodiode having a PN junction. As shown in FIG. 25, the light receiving elements 4010 are formed on one surface 4011a side of a semiconductor substrate 4011. In the present embodiment, three light receiving elements 4010a to 4010c are shown as representative examples. On the one surface 4011a, a light transparent film 4012 is formed and, on the light transparent film 4012, the defining portion 4020 is formed. The light transparent film 4012 is made of a material having an insulating property and a light transparent property. Examples of a material having such properties include silicon dioxide $SiO_2$. In the semiconductor substrate 4011, the components 4030 to 4070 of the optical sensor 4100 are formed, though not shown. These components are electrically connected via a wiring pattern formed in the semiconductor substrate 4011.

The defining portion 4020 is for defining the incident angles of light such that the incident angles of the light incident on the light receiving surfaces of the respective light receiving elements 4010a to 4010c are different. The defining portion 4020 includes a light blocking film 4021 formed on the light transparent film 4012, and the openings 4022 for projecting light formed in the light blocking film 4021. The light blocking film 4021 is made of a material having a light blocking property and an electrically conductive property. Examples of a material having such properties include aluminum. As shown by the broken lines in FIG. 25, the lines connecting the centers of the light receiving surfaces of the respective light receiving elements 4010a to 4010c and the centers of the corresponding openings 4022 have different inclinations so that the incident angles of the respective light receiving elements 4010a to 4010c are different. In the present embodiment, by the openings 4022, the elevation angle of the first light receiving element 4010a is defined to 90 degrees, the elevation angle of the second light receiving element 4010b is defined to 45 degrees, and the elevation angle of the third light receiving element 4010c is defined to 30 degrees.

The storing portion 4030 is electrically connected to each of the light receiving elements 4010a to 4010c to store charges outputted from the light receiving elements 4010a to 4010c and convert the stored charges to a voltage. Specifically, the storing portion 4030 is a floating diffusion pump.

The transfer switches 4040 are for controlling the opening/closing of the connection between the light receiving elements 4010 and the storing portion 4030. The transfer switches 4040 include transfer switches 4040a to 4040c. The first transfer switch 4040a is provided between the first light receiving element 4010a and the storing portion 4030. The second transfer switch 4040b is provided between the second light receiving element 4010b and the storing portion 4030. The third transfer switch 4040c is provided between the third light receiving element 4010c and the storing portion 4030. The transfer switches 4040 according to the present embodiment are N-channel MOSFETs.

The reset switch 4050 is for controlling the opening/closing of the connection between the storing portion 4030 and a power source, and provided between the storing portion 4030 and the power source. The reset switch 4050 according to the present embodiment is an N-channel MOSFET, and corresponds to a reset portion.

The selection switch 4060 is for controlling the opening/closing of the connection between the output terminal of the storing portion 4030 and an external terminal (not shown), and provided between the storing portion 4030 and the external terminal. The selection switch 4060 according to the present embodiment is an N-channel MOSFET.

The control portion 4070 is for controlling the opening/closing of the switches 4040 to 4060, and is an address decoder. From the control portion 4070, pulse-like control signals are outputted to the respective switches 4040 to 4060. The control signals include transfer signals for controlling the opening/closing of the transfer switches 4040, a reset signal for controlling the opening/closing of the reset switch 4050, and a selection signal for controlling the opening/closing of the selection switch 4060. The pulse periods and duty ratios of the three respective control signals mentioned above are the same, but the pulse rising timings thereof are different.

Figure 27:
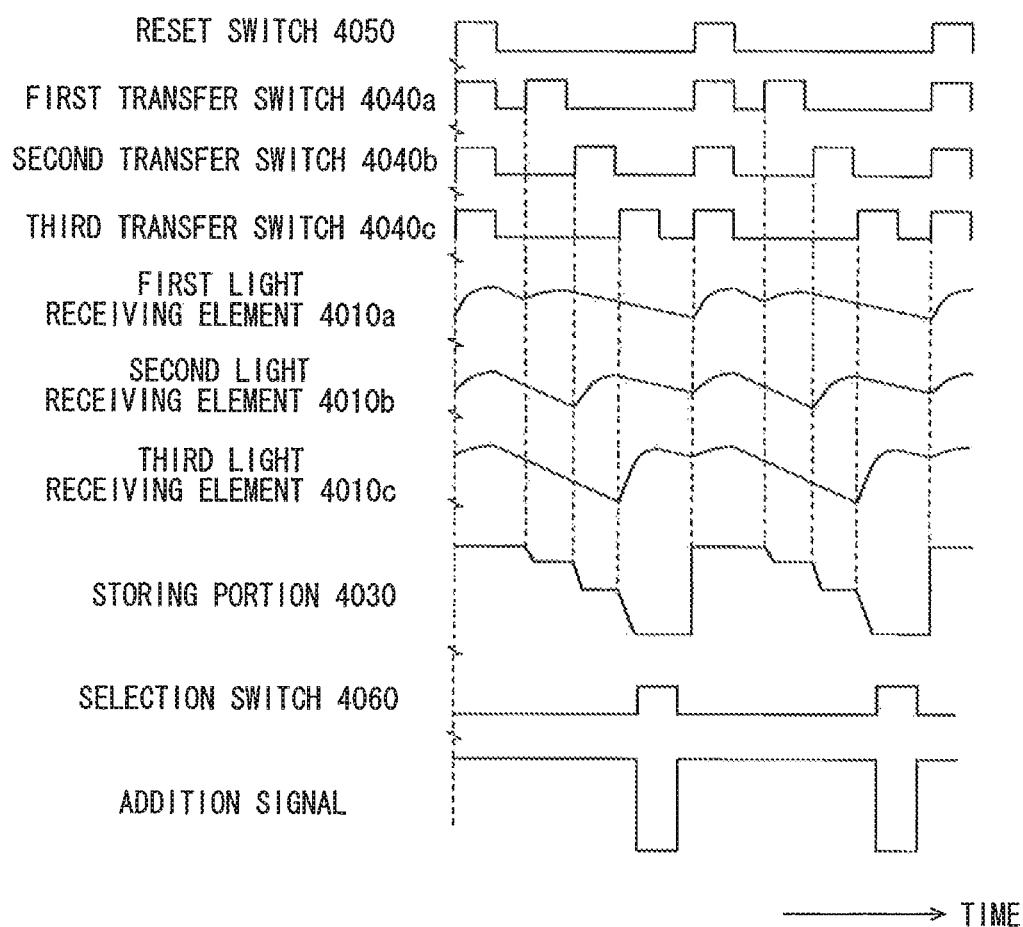
FIG. 27 is a timing chart for illustrating the signals in the optical sensor.

Next, the operation of the optical sensor 4100 will be described with reference to FIGS. 26 and 27. FIG. 26 is a timing chart when only the transfer signals are inputted to the transfer switches 4040. FIG. 27 is a timing chart when the transfer signals and the reset signal are inputted to the transfer switches 4040.

First, a description will be given to the case where only the transfer signals are inputted to the transfer switches 4040. In this case, the amount of charges outputted from each of the light receiving elements 4010a to 4010c depends on the interval between the opening and closing of each of the transfer switches 4040a to 4040c, and the amount of charges stored in the storing portion 4030 also depends on the interval between the opening and closing of each of the transfer switches 4040a to 4040c. A time period during which charges are stored in each of the light receiving elements 4010a to 4010c depends on the pulse period of the transfer signal, and the gain ratios of the output signals from the respective light receiving elements 4010a to 4010c are the same. The intensities of the output signals from the respective light receiving elements 4010a to 4010c depend on the elevation angle of light incident on the one surface 4011a of the semiconductor substrate 4011. For example, when light is incident on the one surface 4011a so as to be perpendicular to the one surface 4011a, the output signal from the first light receiving element 4010a is maximum, the output signal from the third light receiving element 4010c is minimum, and the output signal from the second light receiving element 4010b is intermediate therebetween.

As shown in FIG. 26, when a signal on a high voltage level (hereinafter referred to as a Hi signal) is inputted to the reset switch 4050, the storing portion 4030 is electrically connected to the power source via the reset switch 4050 so that the voltage across the storing portion 4030 is equal to a power source voltage. When the Hi signals of the transfer signals are inputted to the respective transfer switches 4040a to 4040c by the time when the Hi signal is inputted next time to the reset switch 4050, the light receiving elements 4010a to 4010c are electrically connected to the storing portion 4030 via the transfer switches 4040a to 4040c, and the charges stored in the light receiving elements 4010a to 4010c are outputted (transferred) to the storing portion 4030. As a result, the voltage across the storing portion 4030 drops from the power source voltage in accordance with the amount of the transferred charges. When the Hi signal of the selection signal is inputted to the selection switch 4060, the storing portion 4030 is electrically connected to the external terminal (not shown)

via the selection switch 4060, and a voltage corresponding to the amount of the charges is outputted to the outside. When the Hi signal of the reset signal is inputted again to the reset switch 4050 in this state, the voltage across the storing portion 4030 is forced to be equal to the power source voltage, and the charges stored in the storing portion 4030 become zero. In the following, by repeating the operation described above, a signal (addition signal) resulting from the addition of the output signals from the respective light receiving elements 4010a to 4010c is outputted to the outside.

Next, a description will be given to the case where not only the transfer signals, but also the reset signal is inputted to the transfer switches 4040. In this case, the amount of charges outputted from each of the light receiving elements 4010a to 4010c depends on the interval between the opening and closing of each of the transfer switches 4040a to 4040c. However, the amount of charges stored in the storing portion 4030 depends not only on the interval between the opening and closing of each of the transfer switches 4040a to 4040c, but also on a timing for the opening/closing of the reset switch 4050. As shown in FIG. 27, the time period during which charges are stored in each of the light receiving elements 4010a to 4010c includes a first storage time from the falling edge of the reset signal to the rising edge of each of the transfer signals and a second storage time from the falling edge of the transfer signal to the rising edge of the reset signal. The charges stored in each of the light receiving elements 4010a to 4010c during the second storage time of the two storage times are transferred to the storing portion 30 simultaneously with the inputting of the reset signal to each of the transfer switches 4040a to 4040c. However, since the storing portion 4030 is connected to the power source at this timing, the voltage across the storing portion 4030 is forced to be equal to the power source voltage so that no charge is stored in the storing portion 4030. Thus, during the second storage time, the charges stored in the light receiving elements 4010a to 4010c are not stored in the storing portion 4030. By contrast, during the first storage time, the charges stored in the light receiving elements 4010a to 4010c are stored in the storing portion 4030, which will be described below.

As shown in FIG. 27, when the Hi signal of the reset signal is inputted to the switches 4040 to 4050, the light receiving elements 4010a to 4010c are electrically connected to the storing portion 4030 via the transfer switches 4040a to 4040c, and the storing portion 4030 is electrically connected to the power source via the reset switch 4050. Since the voltage across the storing portion 4030 is equal to the power source voltage, the charges transferred from the light receiving elements 4010a to 4010c to the storing portion 4030 are not stored in the storing portion 4030. When the Hi signals of the transfer signals are inputted to the respective transfer switches 4040a to 4040c by the time when the Hi signal is inputted next time to the reset switch 4050, the light receiving elements 4010a to 4010c are electrically connected to the storing portion 4030 via the transfer switches 4040a to 4040c. As a result, the charges stored in the light receiving elements 4010a to 4010c during the first storage time are transferred to the storing portion 4030, and the voltage across the storing portion 4030 lowers from the power source voltage by a magnitude corresponding to the amount of the transferred charges. When the Hi signal of the selection signal is inputted to the selection switch 4060, the voltage corresponding to the amount of the charges is outputted from the storing portion 4030 to the outside. When the Hi signal of the reset signal is inputted again to the switches 4040 to 4050 in this state, the voltage across the storing portion 4030 is forced to be equal to the power source voltage, and the charges stored in the storing portion 4030 become zero, while the charges stored in the respective light receiving elements 4010a to 4010c also become zero. In the following, by repeating the operation described above, an addition signal resulting from the addition of the output signals from the respective light receiving elements 4010a to 4010c is outputted to the outside. Note that, in FIG. 27, the respective first storage times of the light receiving elements 4010a to 4010c are differentiated, and the gain ratios of the output signals from the respective light receiving elements 4010a to 4010c are differentiated.

Next, the operation/effect of the optical sensor 4100 will be described. As described above, by adjusting the interval (first storage time) between the opening and closing of each of the transfer switches 4040, the amount of charges outputted from each of the light receiving elements 4010 to the storing portion 4030, i.e., the gain of the output signal from each of the light receiving elements 4010 is adjusted. Accordingly, compared to a configuration in which a current-voltage conversion circuit including an operational amplifier and laser trimming resistors is connected to each of the light receiving elements and the resistance values of the laser trimming resistors are adjusted, the gain of the output signal from each of the light receiving elements 4010a to 4010c can be adjusted, while a cost increase is suppressed.

The selection switch 4060 is provided between the storing portion 4030 and the external terminal, and the opening/closing of the selection switch 4060 is controlled by the control portion 4070. This allows the timing with which the charges stored in the storing portion 4030 are outputted to be adjusted by the opening/closing of the selection switch 4060.

The light receiving elements 4010 are formed on the one surface 4011a side of the semiconductor substrate 4011, and the defining portion 4020 includes the light blocking film 4021 formed over the one surface 4011a via the light transparent film 4012, and the openings 4022 formed in the light blocking film 4021. Thus, the defining portion 4020 includes the thin film formed on the semiconductor substrate 4011. Therefore, compared to a configuration in which a shielding plate formed with an opening window or the like is provided over a semiconductor substrate, an increase in the scale of the optical sensor 4100 is suppressed.

In the present embodiment, as the representative examples, the three light receiving elements 4010a to 4010c are shown. However, it may also be possible that a larger number of the light receiving elements 4010 are formed on the semiconductor substrate 4010.

As shown in FIG. 25, the present embodiment has shown the example in which the light transparent film 4012 is in one layer, and the light blocking film 4021 is in one layer. However, the respective numbers of the layers of the light transparent films 4012 and the light blocking films 4021 are not limited to those in the foregoing example. For example, it is also possible to adopt a configuration in which, e.g., the light transparent films 4012 are in two layers, and the light blocking films 4021 are in two layers. Thus, if the light blocking films 21 are formed in multiple layers in the light transparent films 12, compared to the configuration in which the openings 4022 are formed in the one-layer light blocking film 4021, the range of light incident on the semiconductor substrate 4011 can be narrowed. This inhibits light incident from a given one of the openings 4022 from being incident on the light receiving element 4010 other than the light receiving element 4010 corresponding to the given opening 4022, and inhibits the output signal from each of the light receiving elements 4010 from including a light output (disturbance output) from the unintended opening 4022.

In the present embodiment, the relationships between the light receiving areas of the respective light receiving elements 4010a to 4010c and the aperture areas of the corresponding openings 4022 have not particularly been mentioned. However, for example, the light receiving areas of the respective light receiving elements 4010a to 4010c and the aperture areas of the corresponding openings 4022 may be equal to or different from each other. Alternatively, the aperture areas of the openings 4022 corresponding to the respective light receiving elements 4010a to 4010c may be set equal to or different from each other. In particular, when the aperture areas of the openings 4022 corresponding to the respective light receiving elements 4010a to 4010c are differentiated, the gain ratios of the output signals from the respective light receiving elements 4010a to 4010c can also be adjusted favorably with the aperture area ratios between the individual openings 4022.

The present embodiment has shown the example in which the respective duty ratios of the transfer signals, the reset signal, and the selection signal are the same. However, the respective duty ratios thereof may also be different. The selection signal may also have a pulse period different from those of the transfer signals and the reset signal.

Sixth Embodiment

Figure 28:
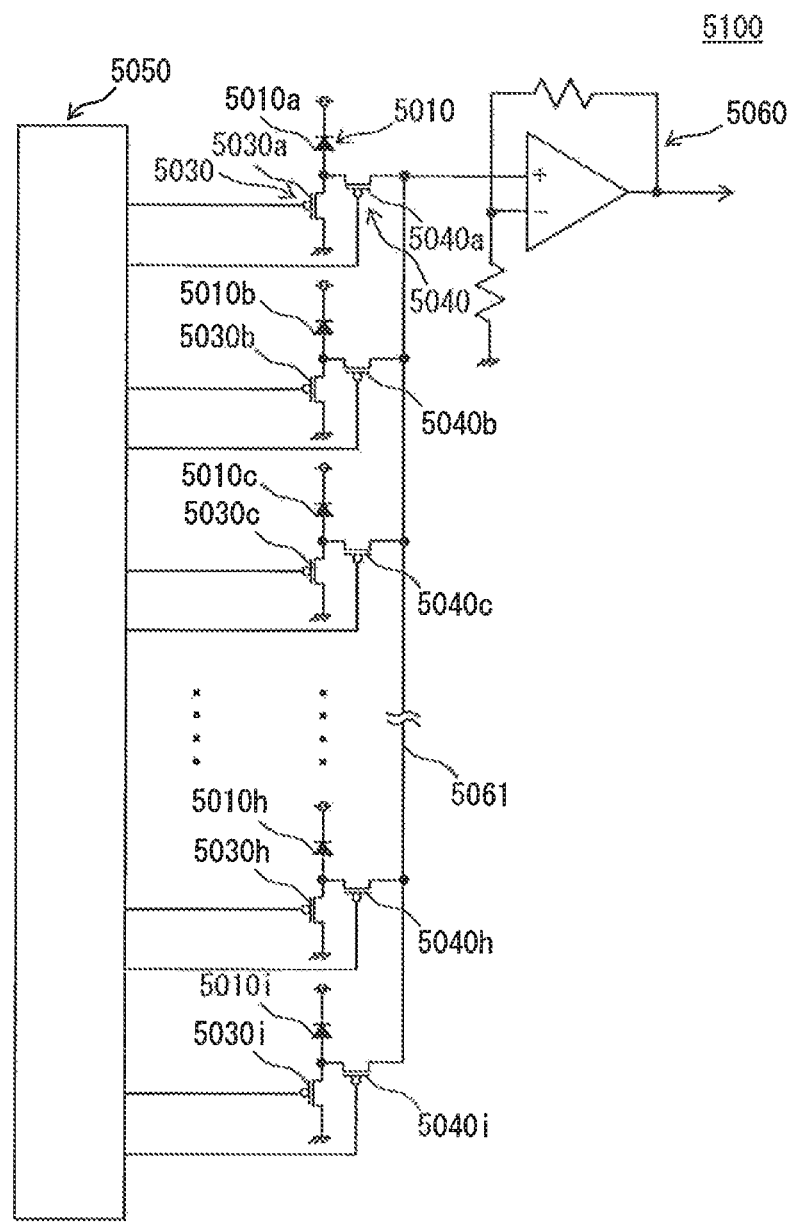
FIG. 28 is a circuit diagram showing a schematic configuration of an optical sensor device according to a sixth embodiment.
Figure 29:
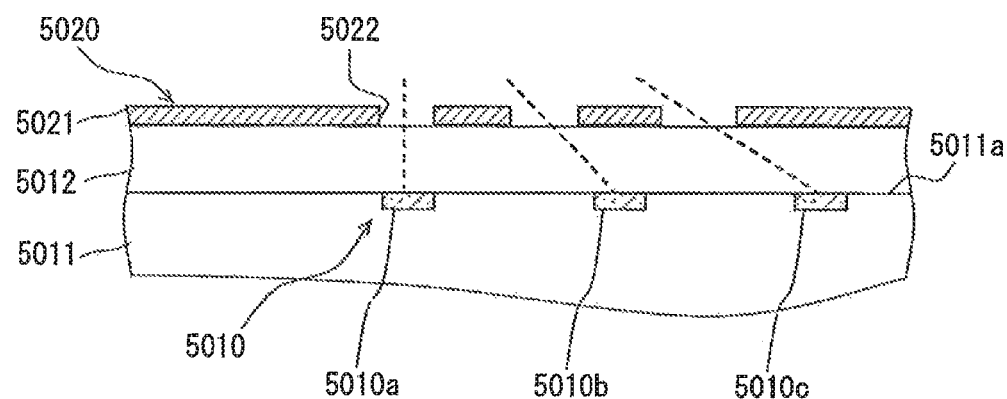
FIG. 29 is a cross-sectional view for illustrating a defining portion and light receiving elements.
Figure 30:
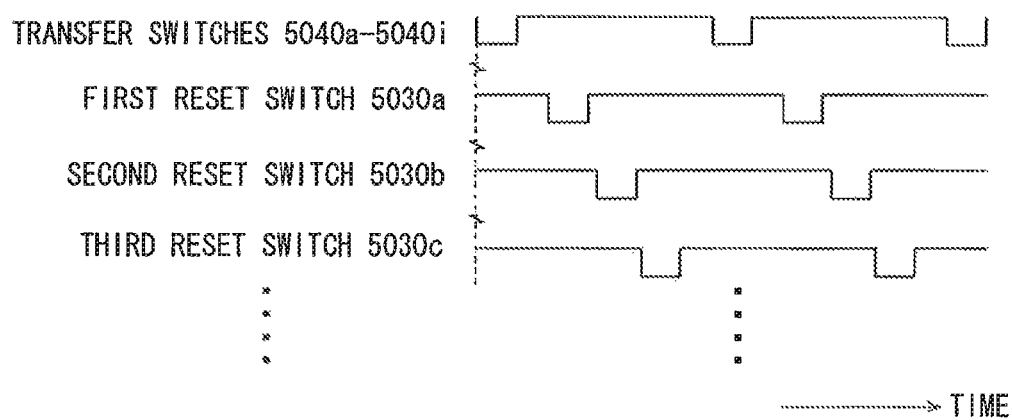
FIG. 30 is a timing chart for illustrating control signals.

FIG. 28 is a circuit diagram showing a schematic configuration of an optical sensor device. FIG. 29 is a cross-sectional view for illustrating a defining portion and light receiving elements. FIG. 30 is a timing chart for illustrating control signals. Note that, in FIG. 28, the illustration of a defining portion 5020 is not shown and, in FIG. 29, the virtual lines connecting the centers of light receiving elements 5010 and the centers of openings 5022 corresponding to the light receiving elements 5010 are shown as the broken lines.

As shown in FIGS. 28 and 29, an optical sensor 5100 includes, as main portions thereof, the light receiving elements 5010, the defining portion 5020, reset switches 5030, transfer switches 5040, a control portion 5050, and an amplifying circuit 5060. When light is incident on the light receiving elements 5010, charges corresponding to the amount of the light are stored in each of the light receiving elements 5010. When each of the transfer switches 4040 is brought into a closed state, the charges stored in the light receiving element 5010 are outputted to the amplifying portion 5060 via the transfer switch 5040. Note that, when the reset switches 5030 are brought into the closed state, the charges stored in the light receiving elements 5010 flow to the ground via the reset switch 5030, and the amount of charges stored in each of the light receiving elements 5010 becomes zero.

Each of the light receiving elements 5010 is for storing charges corresponding to the amount of received light, and is a photodiode having a PN junction. As shown in FIG. 28, the cathode electrode of each of the light receiving elements 5010 is connected to a power source, and the anode electrode thereof is connected to the ground via the reset switches 5030. As shown in FIG. 29, the light receiving elements 5010 are formed on one surface 5011a side of a semiconductor substrate 5011. In FIG. 29, three light receiving elements 5010a to 5010c are shown as representative examples. However, in the present embodiment, nine light receiving elements 5010a to 5010i are formed on the one surface 5011a side.

On the one surface 5011a, a light transparent film 5012 is formed and, on the light transparent film 5012, the defining portion 5020 is formed. The light transparent film 5012 is made of a material having an insulating property and a light transparent property. Examples of a material having such properties include silicon dioxide $SiO_2$. In the semiconductor substrate 5011, the components 5030 to 5060 of the optical sensor 5100 are formed, though not shown. These components are electrically connected via a wiring pattern formed in the semiconductor substrate 5011.

The defining portion 5020 is for defining the incident angles of light such that the incident angles of light incident on the light receiving surfaces of the respective light receiving elements 5010a to 5010i are different. The defining portion 5020 includes a light blocking film 5021 formed on the light transparent film 5012, and openings 5022 for projecting light formed in the light blocking film 5021. The light blocking film 5021 is made of a material having a light blocking property and an electrically conductive property. Examples of a material having such properties include aluminum. As shown by the broken lines in FIG. 29, the lines connecting the centers of the light receiving surfaces of the respective light receiving elements 5010a to 5010c and the centers of the corresponding openings 5022 have different inclinations so that the incident angles of the respective light receiving elements 5010a to 5010c are different. In the present embodiment, by the openings 5022, the elevation angle of the first light receiving element 5010a is defined to 90 degrees, the elevation angle of the second light receiving element 5010b is defined to 80 degrees, and the elevation angle of the third light receiving element 5010c is defined to 70 degrees. Note that, by the openings 5022, the elevation angle of the fourth light receiving element 5010d is defined to 60 degrees, the elevation angle of the fifth light receiving element 5010e is defined to 50 degrees, the elevation angle of the sixth light receiving element 5010f is defined to 40 degrees, the elevation angle of the seventh light receiving element 5010g is defined to 30 degrees, the elevation angle of the eighth light receiving element 5010h is defined to 20 degrees, and the elevation angle of the ninth light receiving element 5010i is defined to 10 degrees.

The reset switches 5030 are for controlling the opening and closing of the connection between the light receiving elements 5010 and the ground, and provided between the light receiving elements 5010 and the ground. As shown in FIG. 28, the reset switches 5030 include nine reset switches 5030a to 5030i, and the light receiving elements 5010a to 5010i are connected to the ground via the corresponding reset switches 5030a to 5030i. The reset switches 5030 according to the present embodiment are P-channel MOSFETs, and correspond to the reset portion.

The transfer switches 5040 are for controlling the opening and closing of the connection between the light receiving elements 5010 and the amplifying circuit 5060 (common wiring 5061), and provided between the middle points between the light receiving elements 5010 and the reset switches 5030 and the common wiring 5061. As shown in FIG. 28, the transfer switches 5040 include nine transfer switches 5040a to 5040i, and the light receiving elements 5010a to 5010i are connected to the common wiring 5061 via the corresponding transfer switches 5040a to 5040i. The transfer switches 5040 according to the present embodiment are P-channel MOSFETs.

The control portion 5050 is for controlling the opening and closing of the switches 5030 and 5040, and is an address decoder. From the control portion 5050, pulse-like control signals are outputted to the individual switches 5030 and 5040. The control signals include reset signals for controlling the opening and closing of the reset switches 5030, and transfer signals for controlling the opening and closing of the transfer switches 5040. The pulse periods and duty ratios of the two respective control signals are the same, but the pulse falling (rising) timings thereof are different.

The amplifying circuit 5060 is electrically connected to each of the light receiving elements 5010a to 5010i via the common wiring 5061, and performs the function of amplifying an addition signal resulting from the addition of output signals from the respective light receiving elements 5010a to 5010i, and outputting the amplified addition signal to the outside.

Next, the operation of the optical sensor 5100 will be described based on FIG. 30. In FIG. 30, to avoid complication, only three reset signals inputted to the three reset switches 5030a to 5030c of nine reset signals inputted to the nine reset switches 5030a to 5030i are shown. Since nine transfer signals inputted to the nine transfer switches 5040a to 5040i are the same, they are collectively shown as one transfer signal.

As described above, the reset switches 5030 and the transfer switches 5040 are P-channel MOSFETs. Accordingly, when a signal on a low voltage level (hereinafter referred to as a Lo signal) is inputted to each of the reset switches 5030, the light receiving element 5010 is connected to the ground via the reset switch 5030, and the charges stored in the light receiving element 5010 are reset. When the Lo signal is inputted to each of the transfer switches 5040, the light receiving element 5010 is connected to the common wiring 5061 via the transfer switch 5040, and the charges stored in the light receiving element 5010 are outputted to the common wiring 5061.

As described above, the pulse periods and duty ratios of the two respective control signals are the same, but the pulse falling (rising) timings thereof are different. It follows therefore that, in one pulse period of each of the transfer signals, there are two times during which charges are stored in the light receiving element 5010. The two times are a first storage time from the rising edge of the transfer signal to the falling edge of the reset signal, and a second storage time from the rising edge of the reset signal to the falling edge of the transfer signal. The first storage time is a time period from the timing with which each of the transfer switches 5040 shifts from the closed state to an open state to the timing with which the reset switch 5030 shifts from the open state to the closed state. The second storage time is a time period from the timing with which the reset switch 5030 shifts from the closed state to the open state to the timing with which the transfer switch 5040 shifts from the open state to the closed state.

As shown in FIG. 30, the transfer signals inputted to the respective transfer switches 5040a to 5040i are identical to each other, but the pulse falling (rising) timings of the reset signals inputted to the respective reset switches 5030a to 5030i are different. Accordingly, the total storage times (the sum of the first storage time and the second storage time) of the respective light receiving elements 5010a to 5010i are equal to each other, but the first storage times and the second storage times thereof are different.

The charges stored during the first storage time are reset since, when the Lo signal is inputted to each of the reset switches 5030, the light receiving element 5010 is connected to the ground via the reset switch 5030. Consequently, the charges stored during the first storage time are not outputted to the common wiring 5061. By contrast, the charges stored during the second storage time are outputted to the common wiring 5061 since, when the Lo signal is inputted to each of the transfer switches 5040, the light receiving element 5010 is connected to the common wiring 5061 via the transfer switch 5040. Thus, from each of the light receiving elements 5010a to 5010i, a signal (signal with an adjusted gain) corresponding to the amount of charges dependent on the second storage time is outputted.

As described above, the transfer signals inputted to the respective transfer switches 5040a to 5040i are the same. Therefore, the output signals with adjusted gains from the respective light receiving elements 5010a to 5010i are simultaneously outputted to the common wiring 5061 and subjected to an addition in the common wiring 5061. A signal resulting from the addition is outputted to the amplifying circuit 5060. Note that, in FIG. 30, the second storage times (first storage times) of the respective light receiving elements 5010a to 5010i are differentiated, and the gain ratios of the output signals from the respective light receiving elements 5010a to 5010i are differentiated.

Next, the operation/effect of the optical sensor 5100 will be described. As described above, by adjusting the opening and closing (second storage time) of the reset switches 5030 and the transfer switches 5040, the amount of charges outputted from each of the light receiving elements 5010a to 5010i to the common wiring 5061, i.e., the gain of the output signal from each of the light receiving elements 5010a to 5010i can be adjusted. Consequently, compared to a configuration in which a current-voltage conversion circuit including an operational amplifier and laser trimming resistors is connected to each of the light receiving elements and the resistance values of the laser trimming resistors are adjusted, the gain of the output signal from each of the light receiving elements 5010a to 5010i can be adjusted, while a cost increase is suppressed.

The transfer signals inputted to the respective transfer switches 5040a to 5040i are the same. Accordingly, the output signals with adjusted gains from the respective light receiving elements 5010a to 5010i are subjected to an addition in the common wiring 5061, and the signal resulting from the addition is outputted from the common wiring 5061. This simplifies the circuit configuration of the optical sensor 5100, and suppresses a cost increase.

The light receiving elements 5010 are formed on the one surface 5011a side of the semiconductor substrate 5011, and the defining portion 5020 includes the light blocking film 5021 formed over the one surface 5011a via the light transparent film 5012, and the openings 5022 formed in the light blocking film 5021. Thus, the defining portion 5020 includes the thin film formed on the semiconductor substrate 5011. Therefore, compared to a configuration in which a shielding plate formed with an opening window or the like is provided over a semiconductor substrate, an increase in the scale of the optical sensor 5100 is suppressed.

The present embodiment has shown the example in which the nine light receiving elements 5010a to 5010c are formed on the semiconductor substrate 5011. However, the number of the light receiving element 5010 is not limited to that in the foregoing example as long as the number thereof is not less than three.

As shown in FIG. 29, the present embodiment has shown the example in which the light transparent film 5012 is in one layer, and the light blocking film 5021 is in one layer. However, the respective numbers of the layers of the light transparent films 5012 and the light blocking films 5021 are not limited to those in the foregoing example. For example, it is also possible to adopt a configuration in which the light transparent films 5012 are in two layers, and the light blocking films 5021 are in two layers. Thus, if the light blocking films 5021 are formed in multiple layers in the light transparent films 5012, compared to the configuration in which the openings 5022 are formed in the one-layer light blocking film 5021, the range of light incident on the semiconductor substrate 5011 can be narrowed. This inhibits light incident from a given one of the openings 5022 from being incident on the light receiving element 5010 other than the light receiving element 5010 corresponding to the given opening 5022, and inhibits the output signal from each of the light receiving elements 5010 from including a light output (disturbance output) from the unintended opening 5022.

In the present embodiment, the relationships between the light receiving areas of the respective light receiving elements 5010a to 5010i and the aperture areas of the corresponding openings 5022 have not particularly been mentioned. However, for example, the light receiving areas of the respective light receiving elements 5010a to 5010i and the aperture areas of the corresponding openings 5022 may be equal to or different from each other. Alternatively, the aperture areas of the openings 5022 corresponding to the respective light receiving elements 5010a to 5010i may be set equal to or different from each other. In particular, when the aperture areas of the openings 5022 corresponding to the respective light receiving elements 5010a to 5010i are differentiated, the gain ratios of the output signals from the respective light receiving elements 5010a to 5010i can also be adjusted favorably with the aperture area ratios between the individual openings 5022.

The present embodiment has shown the example in which the respective duty ratios of the rest signals and the transfer signals are the same. However, the respective duty ratios thereof may also be different.

The present embodiment has shown the example in which the reset switches 5030 and the transfer switches 5040 are P-channel MOSFETs. However, as the reset switches 5030 and the transfer switches 5040, N-channel MOSFETs can also be adopted. In this case, the reset switches 5030 are connected between the cathode electrodes of the light receiving elements 5010 and the power source, and the transfer switches 5040 are provided between the middle points between the light receiving elements 5010 and the power source and the common wiring 5061. When each of the reset switches 5030 is brought into the closed state, the power source voltage is applied to the light receiving element 5010 to reset the charges stored in the light receiving element 5010. Note that the voltage levels of the control signals (the reset signals and the transfer signals) are reversed.

Seventh Embodiment

Figure 31:
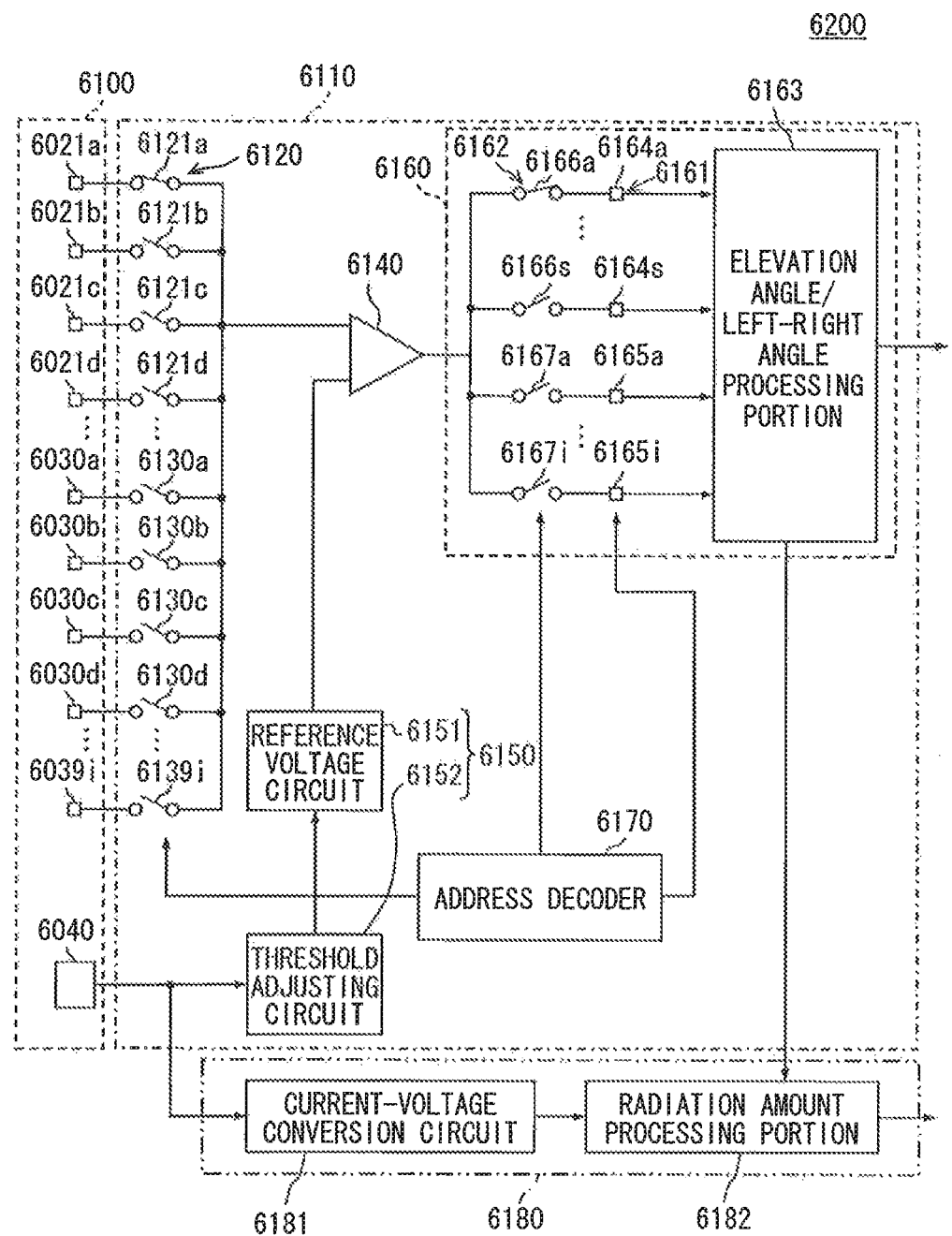
FIG. 31 is a circuit diagram showing a schematic configuration of an optical sensor device according to a seventh embodiment.
Figure 32:
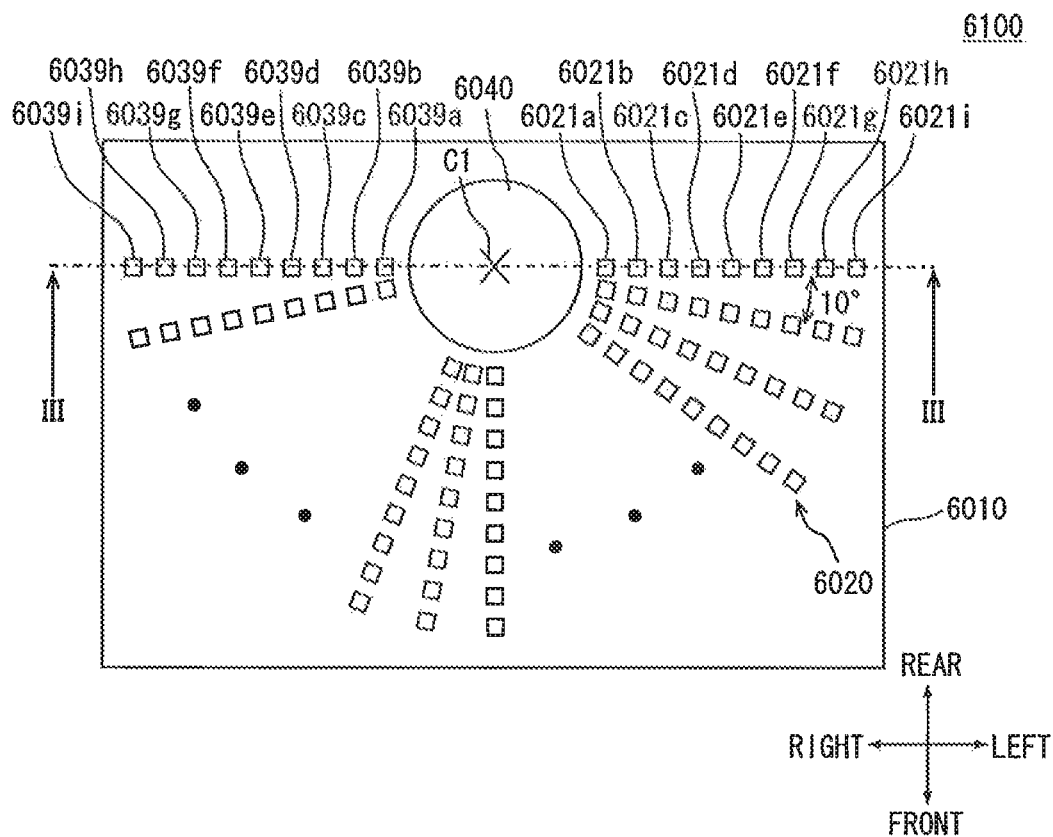
FIG. 32 is a top view showing a distribution of light receiving elements.
Figure 33:
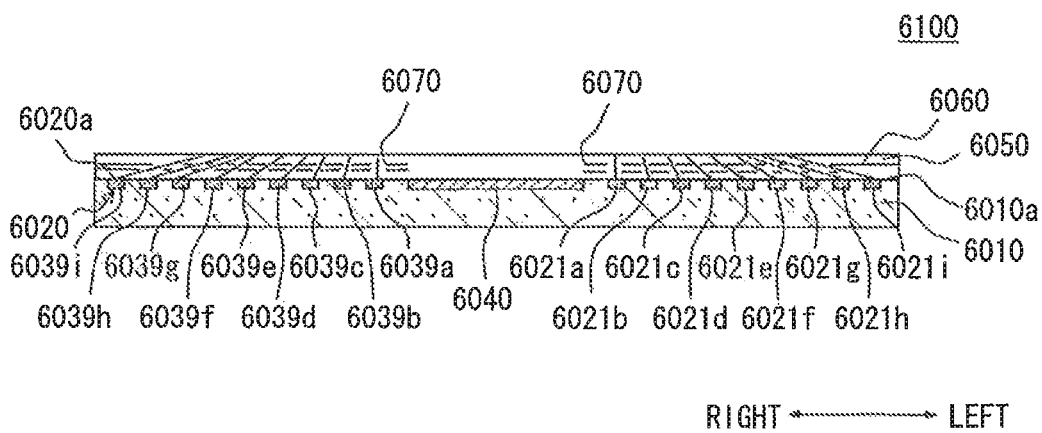
FIG. 33 is a cross-sectional view of an optical sensor device along the line XXXIII-XXXIII of FIG. 32.
Figure 34:
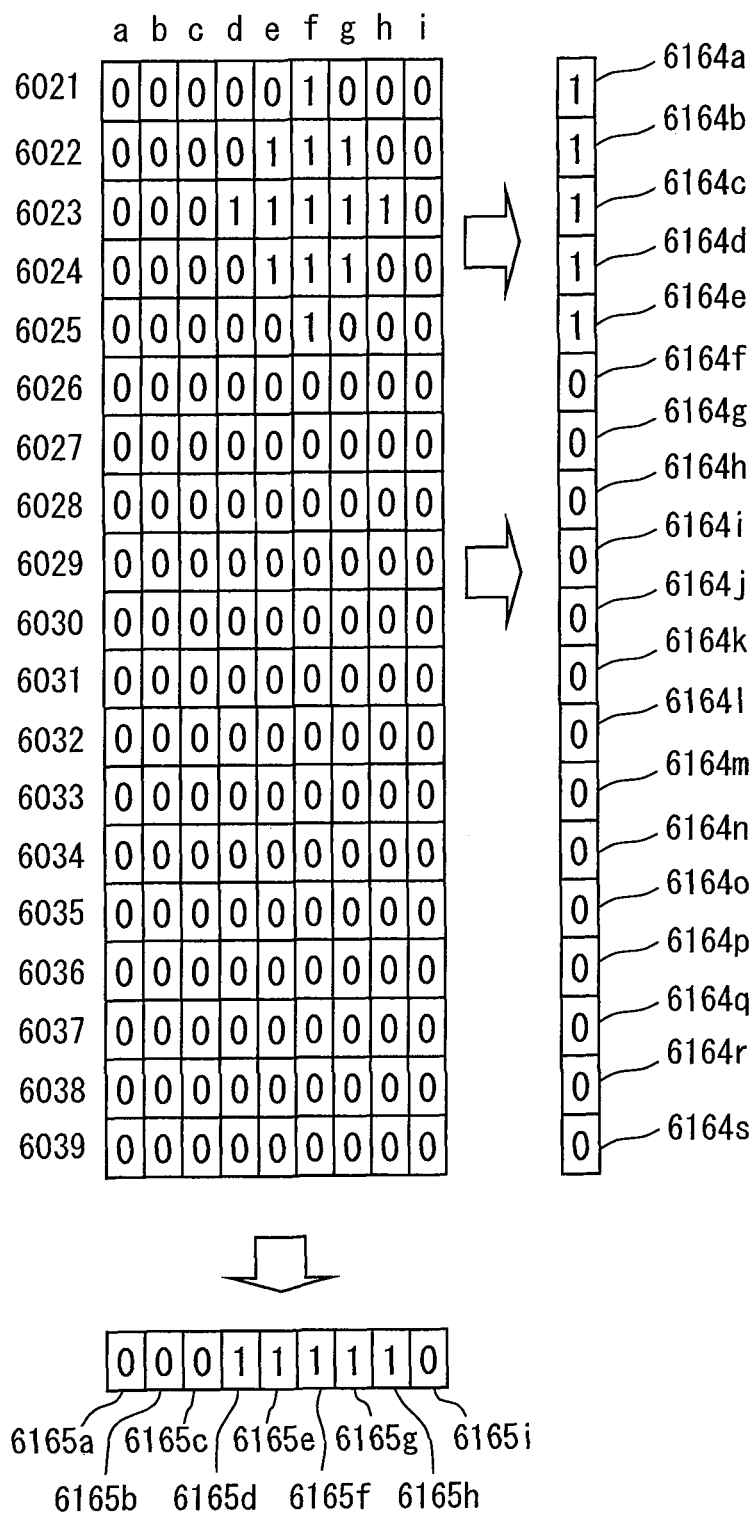
FIG. 34 is a conceptual view for illustrating output signals from the respective light receiving elements, a first matrix, and a second matrix.
Figure 35:
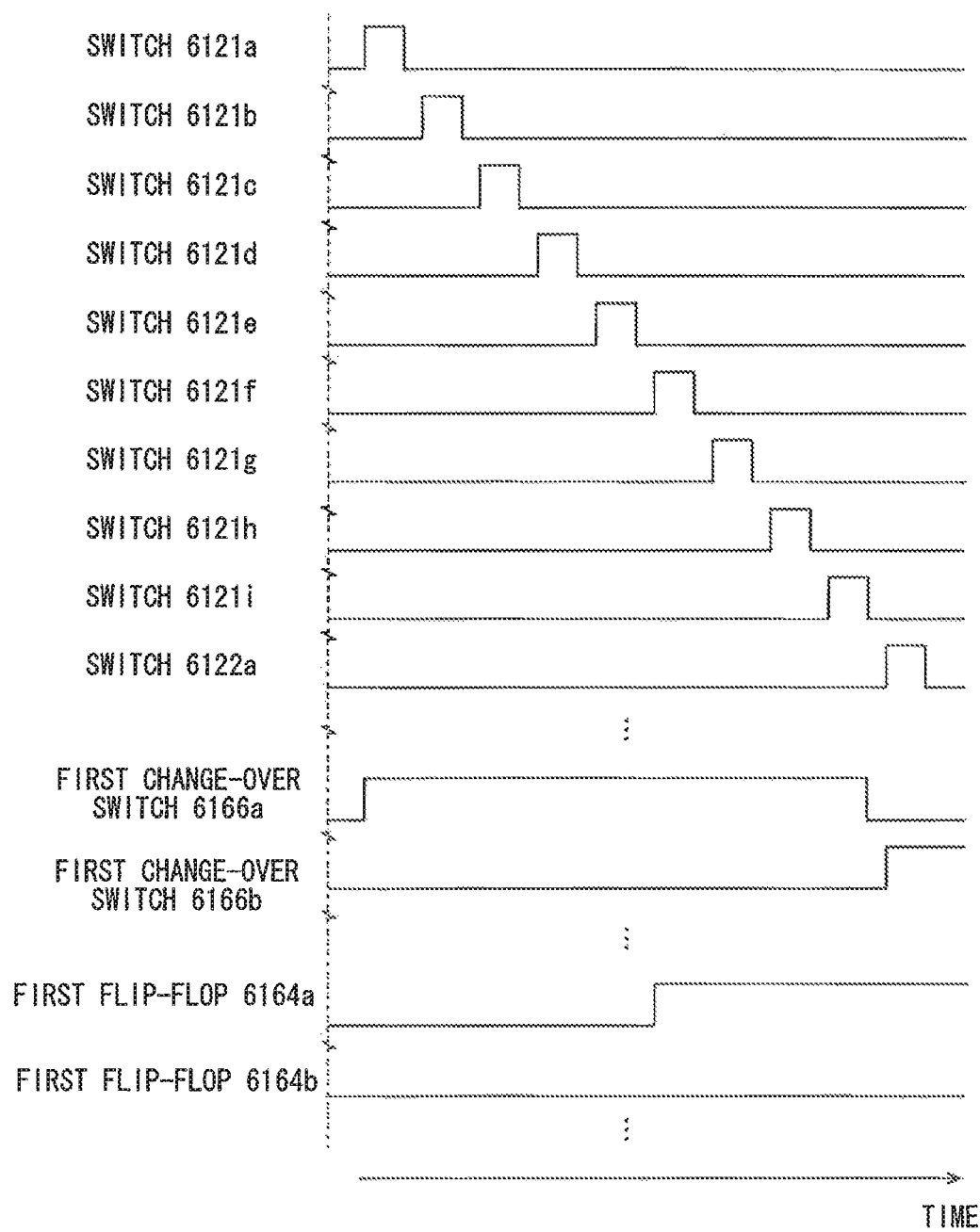
FIG. 35 is a timing chart for illustrating signals in an angle calculating unit.
Figure 36:
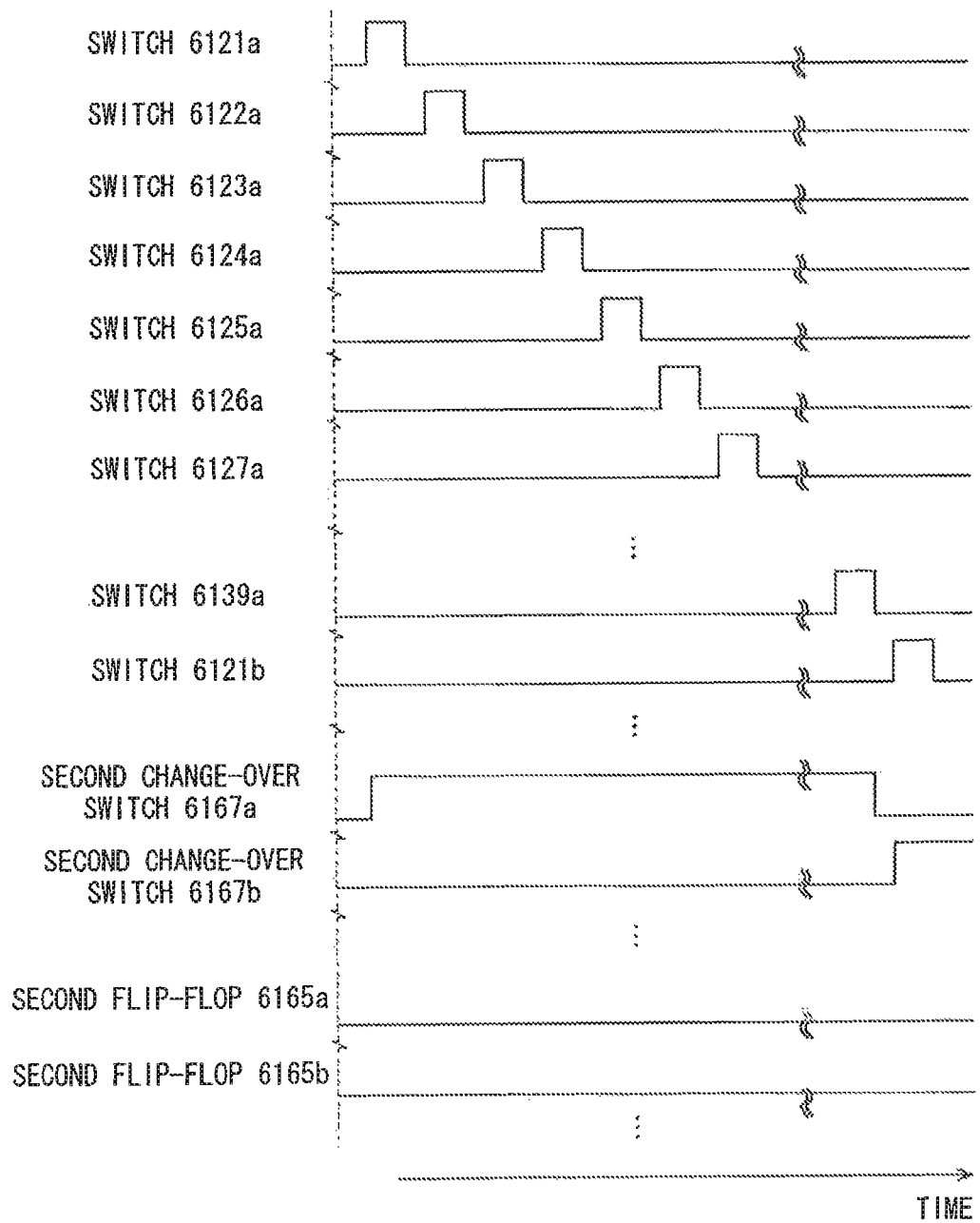
FIG. 36 is a timing chart for illustrating the signals in the angle calculating unit.

FIG. 31 is a circuit diagram showing a schematic configuration of an optical sensor device. FIG. 32 is a top view showing a distribution of light receiving elements. FIG. 33 is a cross-sectional view along the line XXXIII-XXXIII of FIG. 32. FIG. 34 is a conceptual view for illustrating output signals from the respective light receiving elements, a first matrix, and a second matrix. FIGS. 35 and 36 are timing charts each for illustrating signals in an angle calculating unit. In the following, a direction extending along a formation surface 6010a of a semiconductor substrate 6010 described later and through a vehicle between the front and rear thereof is shown as a front-rear direction, and a direction extending along the formation surface 6010a and through the vehicle between the left and right thereof is shown as a right-left direction. An angle formed between a direction parallel with a light receiving surface 6020a of each of light receiving elements 6020 and a direction in which light advances is shown as an elevation angle, and an angle around a perpendicular line perpendicular to the light receiving surface 6020a is shown as the right-left angle of light.

Note that, in FIG. 32, to avoid complication, of one hundred and seventy-one light receiving elements 6021a to 6039i, only the light receiving elements denoted by the numerals 6021a to 6021i and 6039a to 6039i are shown. Additionally, in FIG. 33, for clear illustration of the elevation angles of light defined by openings 6070, light incident on the light receiving elements 6021a to 6021i and 6039a to 6039i via the openings 6070 is shown by the solid lines.

As shown in FIG. 31, an optical sensor device 6020 includes, as main portions thereof, an optical sensor 6100, an angle calculating unit 6110, and a radiation amount calculating unit 6180. The optical sensor 6100 performs the function of converting light incident on the optical sensor device 6200 (vehicle) to an electric signal corresponding to the incident angles (elevation angle and right-left angle) thereof and the amount of radiation of the light. The angle calculating unit 6110 performs the function of calculating the angles of light incident on the optical sensor device 6200 (vehicle) based on an output signal from the optical sensor 6100. The radiation amount calculating unit 6180 performs the function of calculating the amount of radiation of the light incident on the optical sensor device 6200 (vehicle) based on the output signal from the optical sensor 6100 and an output signal from the angle calculating unit 6110.

As shown in FIGS. 32 and 33, the optical sensor 6100 includes a semiconductor substrate 6010, the light receiving elements 6020, a light transparent film 6050, light blocking films 6060, and the openings 6070. On the semiconductor substrate 6010, the light receiving elements 6020 are formed. On the surface 6010a where the light receiving elements 6020 are formed, the light transparent film 6050 is formed. In the light transparent film 6050, the light blocking films 6060 are formed. In the light blocking films 6060, the openings 6070 are formed and, via the openings 6070, light is incident on the light receiving elements 6020.

The semiconductor substrate 6010 is formed in a rectangular shape and, not only the light receiving elements 6020, but also electronic elements (not shown) forming the angle calculating unit 6110 and the radiation amount calculating unit 6180 are formed thereon. These electronic elements are electrically connected via a wiring pattern (not shown) formed in the semiconductor substrate 6010.

Each of the light receiving elements 6020 is for converting light to an electric signal, and is a photodiode having a PN junction. The light receiving elements 6020 include the one hundred and seventy-one light receiving elements 6021a to 6039i having the same light receiving areas, and one light receiving element 6040 for radiation amount detection having a light receiving area larger than that of each of the light receiving elements 6021a to 6039i. The arrangement of the light receiving elements 6021a to 6039i and 6040 is the characteristic feature of the optical sensor device 6200, and therefore will be described later in detail.

The light transparent film 6050 is made of a material having a light transparent property and an insulating property. Examples of a material having such properties include silicon dioxide $SiO_2$. The light blocking films 6060 are made of a material having a light blocking property and an electrically conductive property. Examples of a material having such properties include aluminum. In the present embodiment, the two-layer light blocking films 6060 are formed in the light transparent film 6050.

The openings 6070 are for defining the angles (elevation angles and right-left angles) of light incident on the light receiving surfaces 6020a of the light receiving elements 6020. In the present embodiment, the one hundred and seventy-two openings 6070 are formed in each of the two layers of the light blocking films 6060. The angles of light incident on the light receiving surfaces 6020a are determined by the positions of the openings 6070 and the light receiving elements 6020. The specific positional relationships therebetween are the characteristic feature of the optical sensor device 6200, and therefore will be described later in detail.

As shown in FIG. 31, the angle calculating unit 6110 includes switches 6120, a comparing portion 6140, a reference voltage generating portion 6150, a distribution forming portion 6160, and an address decoder 6170. Since the angle calculating unit 6110 is the characteristic feature of the optical sensor device 6200, a schematic configuration of each of the components 6120 to 6170 is described herein, and the operations thereof will be described later.

The switches 6120 are for controlling the opening and closing of electrical connection between the light receiving elements 6020 and the comparing portion 6140. The switches 6120 include one hundred and seventy-one switches 6121a to 6139i. One of the one hundred and seventy-one switches 6121a to 6139i is disposed between the corresponding one of the light receiving elements 6021a to 6039i and the comparing portion 6140. The switches 6120 correspond to first switches.

The comparing portion 6140 is for comparing the voltage of an output signal from each of the light receiving elements 6021a to 6039i with a threshold voltage. The comparing portion 6140 is a comparator, and outputs the Hi signal when the voltage of the output signal from each of the light receiving elements 6021a to 6039i inputted thereto is higher than the threshold voltage, and outputs the Lo signal when the voltage of the output signal inputted thereto is lower than the threshold voltage.

The reference voltage generating portion 6150 includes a reference voltage circuit 6151 for generating the threshold voltage, and a threshold adjusting circuit 6152 for controlling the threshold voltage generated by the reference voltage circuit 6151 based on an output signal from the light receiving element 6040 for radiation amount detection. The threshold adjusting circuit 6152 performs adjustment such that, when the value of the output signal from the light receiving element 6040 for radiation amount detection is larger than a predetermined value, the threshold voltage is increased and, when the value of the output signal from the light receiving element 6040 for radiation amount detection is lower than the predetermined value, the threshold voltage is reduced. Note that the predetermined value is a value half the value of the signal outputted from the light receiving element 6040 for radiation amount detection when the elevation angle of light incident on the optical sensor device 6020 (vehicle) is 90 degrees.

The distribution forming portion 6160 is for forming matrixes having the voltages of the output signals from the light receiving elements 6020 as their elements and thereby forming a distribution of the intensities of the output signals from the light receiving elements 6020 in accordance with the angles of light incident on the optical sensor device 6200. The distribution forming portion 6160 includes flip-flops 6161, change-over switches 6162 for controlling the opening and closing of electrical connection between the flip-flops 6161 and the comparing portion 6140, and an elevation angle/right-left angle processing portion 6163 for forming matrixes having the voltages of output signals from the light receiving elements 6021a to 6039i as their elements and specifying the elevation angle and the right-left angle based on the distribution represented by the matrixes. The change-over switches 6162 correspond to second switches.

Each of the flip-flops 6161 is an RS flip-flop which continues to hold a flag of "0" when the Hi signal has never been inputted thereto from the comparing portion 6140, and continues to hold a flag of "1" when the Hi signal has been inputted thereto even once until a reset signal for setting the flag to "0" is inputted thereto. The flip-flops 6161 include nineteen first flip-flops 6164a to 6164s for right-left angle detection, and nine second flip-flops 6165a to 6165i for elevation angle detection. The change-over switches 6162 include nineteen first change-over switches 6166a to 6166s corresponding to the first flip-flops 6164a to 6164s, and nine second change-over switches 6167a to 6167i corresponding to the second flip-flops 6165a to 6165i. One of the nineteen first change-over switches 6166a to 6166s is disposed between the corresponding one of the first flip-flops 6164a to 6164s and the comparing portion 6140. One of the nine second change-over switches 6167a to 6167i is disposed between the corresponding one of the second flip-flops 6165a to 6165i and the comparing portion 6140.

To the first flip-flops 6164a to 6164s, the output signals from the respective light receiving elements 6020 having the light receiving surfaces 6020a on which light is incident at the same right-left angle and at different elevation angles are inputted in succession via the comparing portion 6140. To the second flip-flops 6165a to 6165i, the output signals from the respective light receiving elements 6020 having the light receiving surfaces 6020a on which light is incident at the same elevation angle and at different right-left angles are inputted in succession via the comparing portion 6140.

As shown in FIG. 34, the elevation angle/right-left angle processing portion 6163 produces a first matrix having the flags of the first flip-flops 6164a to 6164s as its elements and having nineteen rows and one column, and produces a second matrix having the flags of the second flip-flops 6165a to 6165i as its elements and having one row and nine columns. Then, based on the produced first and second matrixes, the elevation angle/right-left angle processing portion 6163 specifies the light receiving element 6020 outputting the most intense output signal.

The address decoder 6170 is for inputting an open/close signal to each of the switches 6120 and the change-over switches 6162. The address decoder 6170 also performs the function of inputting the reset signal to each of the flip-flops 6161.

The radiation amount calculating unit 6180 includes a current-voltage conversion circuit 6181 for converting the output signal from the light receiving element 6040 for radiation amount detection from a current to a voltage, and an irradiation amount processing portion 6182 for calculating the amount of light radiation based on an output signal from the current-voltage conversion circuit 6181 and an output signal (elevation angle/right-left angle information) from the elevation angle/right-left angle processing portion 6163.

Next, a description will be given to the characteristic feature and operation of the optical sensor device 6200 according to the present embodiment. As shown in FIG. 32, the one hundred and seventy-one light receiving elements 6021a to 6039i are disposed on each of a plurality of virtual lines (not shown to avoid complexity) radially extending from a center point C1 (the cross mark shown in FIG. 32) of the light receiving element 6040 for radiation amount detection to be arranged radially. In addition, although not shown, the openings 6070 corresponding to the light receiving elements 6021a to 6039i are also disposed on the virtual lines and, from the opening 6070 corresponding to the light receiving element 6040 for radiation amount detection, the one hundred and seventy-one openings 6070 are radially arranged. In the present embodiment, the nineteen virtual lines extend from the center point C1 and, on each of the nineteen virtual lines, the nine light receiving elements are disposed. The right-left angles of the nine light receiving elements disposed on each one of the virtual lines are the same, while the elevation angles of light are different from each other. As shown in FIG. 33, the elevation angles of light incident on the light receiving surfaces of the nine light receiving elements disposed on each one of the virtual lines are defined by the corresponding openings 6070 so as to decrease by 10 degrees at a time with distance from the center point C1. An angle formed by the adjacent virtual lines around the center point C1 is 10 degrees, and the right-left angles of light incident on the light receiving surfaces of the nine light receiving elements disposed on each one of the virtual lines are different only by 10 degrees from the right-left angles of light incident on the light receiving surfaces of the nine light receiving elements disposed on the virtual line adjacent to the virtual line. As shown in FIG. 32, in the present embodiment, an angle around the center point C1 formed by the first virtual line extending leftward from the center point C1 and the nineteenth virtual line extending rightward from the center point C1 is 180 degrees. The configuration is provided which aims at detecting the angles of light incident from the front side of the vehicle.

In the following, for easy description, the nine light receiving elements disposed on the n-th virtual line (n is a natural number of 1 to 19) are shown as an n-th group of the light receiving elements. Also, the nine light receiving elements forming the n-th group are shown as k-th light receiving elements (k is a natural number of 1 to 9) such that the numbers thereof increase as the elevation angles decrease. In addition, the angle around the center point C1 formed by the first virtual line and any of the other virtual lines is shown as the right-left angle. According to the foregoing definitions, the right-left angles of the n-th group of light receiving elements are 10(n−1) degrees, and the elevation angles of the k-th light receiving elements are 10(10−k) degrees. Note that, of the nine light receiving elements disposed on each one of the virtual lines, a light receiving element group as recited in the scope of claims is formed. In the present embodiment, nineteen light receiving element groups 6021 to 6039 are formed.

Next, the operation of the optical sensor device 6200 will be described based on FIGS. 34 to 36. The matrix having nineteen rows and nine columns shown in FIG. 34 shows the output signals from the respective light receiving elements 6021a to 6039i through the comparing portion 6140. Output signals from the n-th group of light receiving elements are provided in the n-th row, and output signals from the k-th light receiving elements are provided in the k-th column. Each of the "0s" shown in the matrix shows that the output signal from the comparing portion 6140 is the Lo signal, and each of the "1s" shown in the matrix shows that the output signal from the comparing portion 6140 is the Hi signal. Note that, in the example shown in FIG. 34, the thirteen elements have "1s", while the other one hundred and fifty-eight elements have "0s". The distribution of the "1s" is point-symmetrical to center around one of the elements. This is because light incident on the optical sensor device 6200 has a peak around the light receiving element corresponding to the incident angles thereof.

FIG. 35 shows signals inputted to the switches 6120 and the first change-over switches 6166, and output signals (flags) from the first flip-flops 6164. In FIG. 35, as the representatives thereof, signals inputted to the respective switches 6121a to 6121i and 6122a and the respective first change-over switches 6166a and 6166b and output signals (flags) from the respective first flip-flops 6164a and 6164b are shown.

FIG. 36 shows signals inputted to the switches 6120 and the second change-over switches 6167, and output signals (flags) from the second flip-flops 6165. In FIG. 36, as the representatives thereof, signals inputted to the respective switches 6121a to 6139a and 6121b and the respective second change-over switches 6167a and 6167b and output signals (flags) from the respective second flip-flops 6165a and 6165b are shown.

When the optical sensor device 6200 operates, the reset signal is inputted first from the address decoder 6170 to each of the flip-flips 6161, and the flag of the flip-flop 6161 is set to "0". In addition, the threshold voltage is determined by the reference voltage generating portion 6150.

After the reset signal is outputted, the address decoder 6170 inputs the close signal to the first change-over switch 6166a to electrically connect the comparing portion 6140 to the first flip-flop 6164a, as shown in FIG. 35. In a state where the electrical connection between the comparing portion 6140 and the first flip-flop 6164a is maintained, the close signals are successively and individually inputted to the switches 6121a to 6121i corresponding to the first group of light receiving elements 6021a to 6021i. As a result, the nine output signals shown in the first row in the matrix having the nineteen rows and the nine columns shown in FIG. 34 are sequentially inputted to the first flip-flop 6164a. As shown in FIG. 35, as a result of the shifting of each of the switches 6121a to 6121e to an ON state, the output signals from the light receiving elements 6021a to 6021e are sequentially inputted to the first flip-flop 6164a. In this case, however, only the Lo signal is outputted from the comparing portion 6140 so that the flag of the first flip-flop 6164a remains "0". However, when the switch 6121f shifts to the ON state, the Hi signal is outputted from the comparing portion 6140, and the flag of the first flip-flop 6164a shifts to "1". The first flip-flop 6164a maintains this state until the reset signal is inputted thereto.

In the following, the same operation as described above is performed successively on the switches 6122a to 6139i corresponding to the second to nineteenth groups of light receiving elements 6022a to 6039i and on the first change-over switches 6166b to 6166i to thereby input the output signals from the light receiving elements 6021a to 6039i to the first flip-flops 6134a to 6164s. That is, to the first flip-flops 6164 corresponding to the elements in the n-th row in the first matrix, the output signals from the n-th group of light receiving elements are sequentially inputted. The elevation angle/right-left angle processing portion 6163 produces the first matrix based on the respective flags (output signals) from the first flip-flops 6164a to 6164s.

Thereafter, the address decoder 6170 inputs the close signal to the second change-over switch 6167a to electrically connect the comparing portion 6140 and the second flip-flop 6165a. In a state where the electrical connection between the comparing portion 6140 and the second flip-flop 6165a is maintained, the close signals are sequentially inputted from the address decoder 6170 to the switches 6121a to 6139a corresponding to the first light receiving elements 6021a to 6039a. As a result, the nineteen output signals shown in the first column in the matrix having the nineteen rows and the nine columns shown in FIG. 4 are sequentially inputted to the second flip-flop 6165a. As shown in FIG. 36, as a result of the shifting of each of the switches 6121a to 6139a to the ON state, the output signals from the light receiving elements 6021a to 6039a are sequentially inputted to the second flip-flop 6165a. In this case, however, only the Lo signal is outputted from the comparing portion 6140 so that the flag of the second flip-flop 6165a remains "0".

In the following, the same operation as described above is performed successively on the switches 6121b to 6139i corresponding to the second to ninth light receiving elements 6021b to 6039i and on the second change-over switches 6167b to 6167i to thereby input output signals from the light receiving elements 6021a to 6039i to the respective second flip-flops 6165a to 6165i. That is, to the second flip-flops 6165 each corresponding to the element in the k-th row in the second matrix, output signals from the respective k-th light receiving elements in the first to n-th groups are sequentially inputted. The elevation angle/right-left angle processing portion 6163 produces the second matrix based on the respective flags of (output signals from) the second flip-flops 6165a to 6165i.

The elevation angle/right-left angle processing portion 6163 specifies the light receiving element outputting the most intense output signal based on the distributions of "0s" and "1s" in the produced first and second matrixes. Specifically, the elevation angle/right-left angle processing portion 6163 specifies the row and column in which the centered "1" in the arrangement of "1s" in each of the first and second matrixes is located and thereby specifies the light receiving element outputting the most intense output signal. More specifically, the elevation angle/right-left angle processing portion 6163 compares the elements shown in the first and second respective matrixes with each other to thereby calculate the center of the arrangement (distribution) of "1s" and specify the light receiving element at the position corresponding to the row number and the column number. After the specification, the elevation angle/right-left angle processing portion 6163 outputs elevation angle/right-left angle information including the right-left angle and the elevation angle to the outside and to the radiation amount processing portion 6182.

As shown in FIG. 34, in the arrangement (distribution) of "1s" shown in the first matrix, the centered "1" is located in the third row and, in the arrangement (distribution) of "1s" shown in the second matrix, the centered "1" is located in the sixth column. From this, it can be seen that the light receiving element outputting the most intense output signal is the sixth light receiving element 6023f in the third group. The right-left angle of light incident on the light receiving element 6023f is 20 degrees, and the elevation angle thereof is 40 degrees. Accordingly, it can be seen that the right-left angle of light incident on the optical sensor 6100 (vehicle) is 20 degrees, and the elevation angle thereof is 40 degrees. Therefore, from the elevation angle/right-left angle processing portion 6163, the elevation angle/right-left angle information which is the right-left angle of 20 degrees and the elevation angle of 40 degrees is outputted.

The radiation amount processing portion 6182 detects the amount of light radiation based on the elevation angle/right-left angle information (the right-left angle of 20 degrees and the elevation angle of 40 degrees) inputted thereto from the elevation angle/right-left angle processing portion 6163 and on the output signal from the light receiving element 6040 for radiation amount detection which is inputted thereto via the current-voltage conversion circuit 6181, and outputs it to the outside.

Next, the operation/effect of the optical sensor device 6200 according to the present embodiment will be described. As described above, of the nine light receiving elements having the same right-left angles of light and the different elevation angles, each of the nineteen light receiving element groups 6021 to 6039 is formed. The right-left angles of the nineteen respective light receiving element groups 6021 to 6039 are different. Accordingly, the amounts of light incident on the respective light receiving elements 6021a to 6039i are different, and an output signal from the light receiving element having the light receiving surface on which light is incident at angles equal to the angles of light incident on the optical sensor device 6200 (vehicle) or closest thereto is maximum. Therefore, by comparing the intensities of the output signals from the light receiving elements 6021a to 6039i with each other, the light receiving element outputting the most intense output signal is specified. By specifying the angles of light incident on the light receiving surface of the specified light receiving element, it is possible to detect the incident direction (elevation angle and right-left angle) of the light incident on the optical sensor device 6200 (vehicle). This improves the accuracy of detection of the incident direction of light.

In the present embodiment, by forming the matrixes having the voltages of the output signals from the light receiving elements 6020, the distributions of the intensities of the optical signals from the light receiving elements 6020 in accordance with the angles of light incident on the optical sensor device 6200 are formed.

The output signals from the light receiving elements 6021a to 6039i include some noise. Accordingly, when the intensities of the output signals from the light receiving elements 6021a to 6039i are simply sequentially compared with one another, the accuracy of detection of the angles of light may deteriorate. By contrast, in the present embodiment, the distributions of the intensities of the output signals from the light receiving elements 6020 in accordance with the angles of the light incident on the optical sensor device 6200 are formed. This allows, even if noise is included in each of the output signals from the light receiving elements 6021a to 6039i, the light receiving element outputting the most intense signal to be specified. This also inhibits the accuracy of detection of the angles from deteriorating. In addition, compared to the case where the output signals from the light receiving elements 6021a to 6039i are sequentially compared with one another, the time required to detect the incident direction of light can be reduced.

In the present embodiment, the first matrix having nineteen rows and one column is produced using the flags of the first flip-flops 6164a to 6164s as its elements, and the second matrix having one row and nine columns is produced using the flags of the second flip-flops 6165a to 6165l as its elements. In the configuration, the numbers of the elements of the matrixes are smaller than in a configuration in which, after a matrix having nineteen rows and nine columns as shown in FIG. 34 is produced, the incident angles of light are detected from the distributions of "0s" and "1s" shown in the matrix. Therefore, it is possible to simplify an arithmetic operation for detecting the incident angles of light.

Depending on the amount of light radiation and an external environment (weather), it may be possible that the major part of the intensity distribution becomes "1s" or "0s", and the detection of the incident angles of light may be difficult. However, as shown in the present embodiment, by adjusting the threshold voltage based on the output signal from the light receiving element 6040 for radiation amount detection, it is possible to inhibit the major part of the intensity distribution from becoming "1s" or "0s". This inhibits the detection of the incident angles of light from becoming difficult.

The radiation amount processing portion 6182 detects the amount of light radiation based on the output signal (elevation angle/right-left angle information) from the elevation angle/right-left angle processing portion 6163 and on the output signal from the light receiving element 6040 for radiation amount detection which is inputted thereto via the current-voltage conversion circuit 6181. In the configuration, compared to the configuration in which the amount of light radiation is detected based only on the output signal from the light receiving element 6040 for radiation amount detection, the accuracy of detection of the amount of light radiation is improved.

The light receiving elements 6021a to 6039i are disposed on the nineteen virtual lines radially extending from the center point C1 to be arranged radially. The elevation angles of light defined by the respective openings corresponding to the plurality of radially arranged light receiving elements decrease with distance from the center point C1. This allows easy design of the electrical connection between the light receiving elements 6021a to 6039i and the angle calculating unit 6110. In addition, since the position of the light receiving element specified to be outputting the most intense output signal shows the elevation angle and right-left angle of light, the elevation angle and right-left angle of light are easily recognized.

From the center point C1, the nineteen virtual lines extend and the angle formed by the adjacent virtual lines around the center point C1 is 10 degrees. On each one of the virtual lines, the nine light receiving elements are disposed such that the elevation angles of light incident on the light receiving surfaces decrease by 10 degrees at a time with distance from the center point C1. This allows the right-left angle and elevation angle of light to be detected within an error range of ±5 degrees.

The two-layer light blocking films 6060 are formed in the light transparent film 6050. This inhibits light incident from a given one of the openings 6070 from being incident on the light receiving element 6020 other than the light receiving element 6020 corresponding to the given opening 6070. As a result, the output signal from each of the light receiving elements 6021a to 6039i is inhibited from including a light output (disturbance output) from the unintended opening 6070.

The present embodiment has shown the example in which the intensity distribution is formed to detect the incident angles of light. However, it may also be possible to sequentially compare the output signals from the light receiving elements 6021a to 6039i with one another to thereby specify the light receiving element outputting the most intense output signal and detect the incident angles of light.

The present embodiment has shown the example in which the intensity distribution of "0s" and "1s" (digital signals) is formed to detect the incident angles of light. However, it may also be possible to form a distribution of the intensities of analog signals, and detect the incident angles of light.

The present embodiment has shown the example in which the intensity distribution is formed using the first matrix having the nineteen rows and the one column and the second matrix having the one row and the nine columns. However, it may also be possible to produce a matrix having nineteen rows and nine columns as shown in FIG. 34, and form the intensity distribution. It will be appreciated that the respective numbers of rows and the respective numbers of columns in the first matrix and the second matrix are not limited to those in the example described above. It may also be possible to, e.g., produce a first matrix having one row and nineteen columns and a second matrix having nine rows and one column.

The present embodiment has shown the example in which the one hundred and seventy-one light receiving elements 6021a to 6039i are radially arranged. However, the number of the light receiving elements 6021a to 6039i and the arrangement thereof are not limited to those in the foregoing example. If the accuracy of detection of the incident angles of light is to be improved, the number of the light receiving elements may be increased appropriately. As the arrangement of the plurality of light receiving elements, a grid-like configuration may also be used.

The present embodiment has shown the example in which the light receiving elements 6020 include the light receiving element 6040 for radiation amount detection having the light receiving area larger than that of each of the light receiving elements 6021a to 6039i. However, it is also possible to adopt a configuration in which the light receiving elements 20 do not include the light receiving element 6040 for radiation amount detection. In this case, the radiation amount calculating unit 6180 calculates the amount of light radiation based on the output signal from the light receiving element (in the first embodiment, the output signal from the sixth light receiving element 6023f in the third group and the angles (the right-left angle of 20 degrees and the elevation angle of 40 degrees) of light incident on the light receiving surface of the light receiving elements 6023f) outputting the most intense output signal. In the configuration, compared to a configuration in which the amount of light radiation is detected based only on the output signal from the light receiving element 6023f outputting the most intense output signal, the accuracy of detection of the amount of light radiation is improved.

The present embodiment has shown the example in which the light blocking films 6060 are in two layers. However, the number of the light blocking films 60 is not limited to that in the foregoing example, and the number of the layers of the light blocking films 6060 may also be one or three or more.

The present embodiment has shown the example in which the angle formed by the adjacent virtual lines around the center point C1 is 10 degrees. However, the angle formed by the adjacent virtual lines around the center point C1 is not limited to that in the foregoing example, and may also be, e.g., 5 degrees.

The present embodiment has shown the example in which the nine light receiving elements are disposed on each one of the virtual lines such that the elevation angles of light incident on the light receiving surfaces decrease by 10 degrees at a time with distance from the center point C1. However, it is also possible to adopt a configuration in which nine light receiving elements are disposed on each one of the virtual lines such that the elevation angles of light incident on the light receiving surfaces increase by 10 degrees at a time with distance from the center point C1. Also, the number of the light receiving elements disposed on each one of the virtual lines is not limited to that in the foregoing example. It is also possible to adopt a configuration in which, e.g., eighteen light receiving elements are disposed thereon. In this case, the eighteen light receiving elements are disposed on each one of the virtual lines such that the elevation angles of the light incident on the light receiving surfaces increase or decrease by 5 degrees at a time with distance from the center point C1.

Eighth Embodiment

Figure 37:
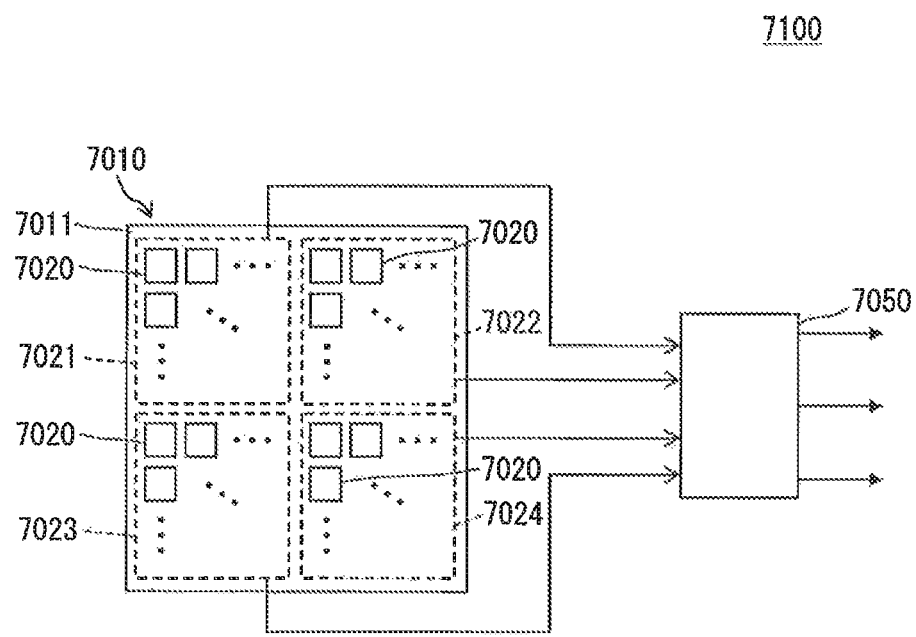
FIG. 37 is a block diagram showing a schematic configuration of an optical sensor according to an eighth embodiment.
Figure 38:
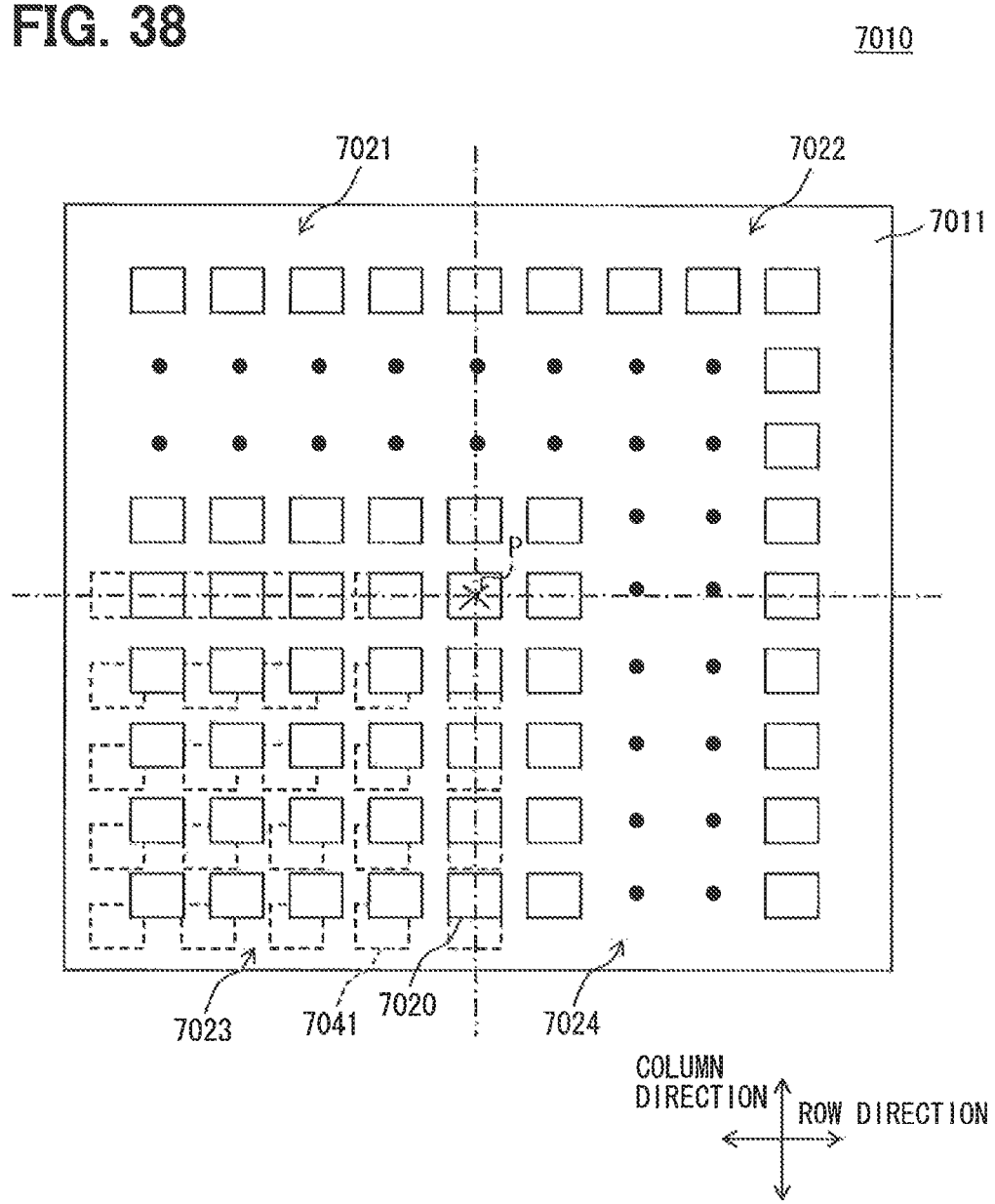
FIG. 38 is a plan view showing a schematic configuration of a sensor portion.
Figure 39:
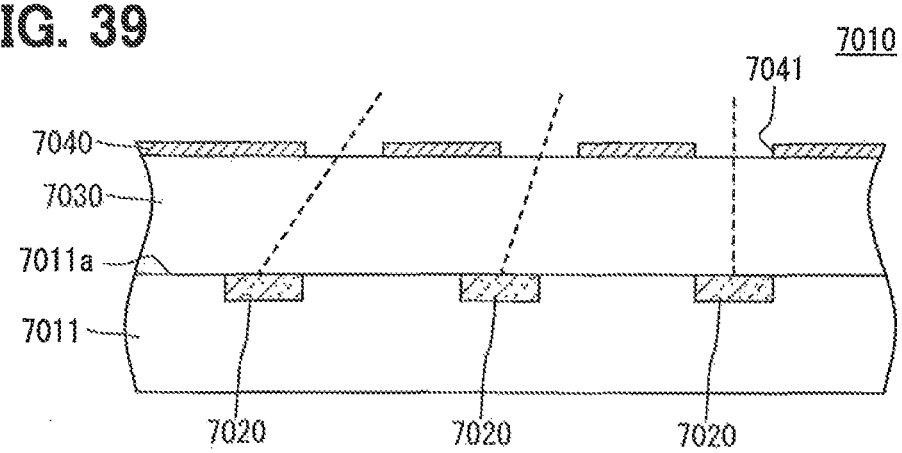
FIG. 39 is a cross-sectional view of the sensor portion.
Figure 40:
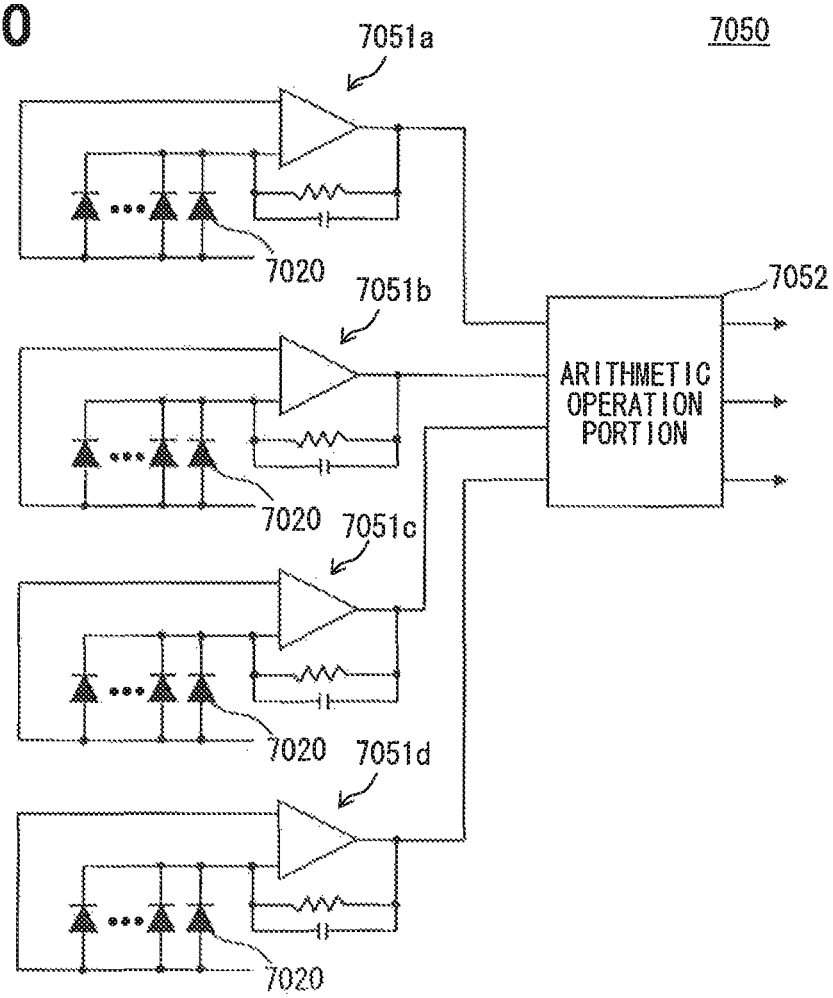
FIG. 40 is a schematic circuit diagram for illustrating a calculating portion.

FIG. 37 is a block diagram showing a schematic configuration of an optical sensor according to an eighth embodiment. FIG. 38 is a plan view showing a schematic configuration of a sensor portion. FIG. 39 is a cross-sectional view of the sensor portion. FIG. 40 is a schematic circuit diagram for illustrating a calculating portion. Note that, in FIG. 38, for clear illustration of positions at which light receiving elements 7020 are formed, the light receiving elements 7020 are shown by the solid lines, and openings 7041 are shown by the broken lines. Additionally, to avoid complication, some of the light receiving elements 7020 and the openings 7041 are not shown. Also, in FIG. 39, the virtual lines connecting the centers of the light receiving elements 7020 and the centers of the openings 7041 corresponding to the respective light receiving elements 7020 are shown by the broken lines. Note that an elevation angle shown below is an angle formed by a line parallel with the light receiving surface of each of the light receiving elements 7020 and each of directions (virtual lines of FIG. 39) in which light advances, and a right-left angle shown below is an angle around the reference point (center point P shown in FIG. 38) of a semiconductor substrate 7011.

As shown in FIG. 37, an optical sensor 7100 includes, as main portions thereof, a sensor portion 7010 and a calculating portion 7050. As shown in FIGS. 38 to 40, the sensor portion 7010 includes the semiconductor substrate 7011, the light receiving elements 7020, a light transparent film 7030, and a light blocking film 7040, while the calculating portion 7050 includes an amplifying portion 7051 and an arithmetic operation portion 7052. On one surface side of the semiconductor substrate 7011, the light receiving elements 7020 are formed. On a surface 7011a thereof where the light receiving elements 7020 are formed, the light transparent film 7030 is formed. On the light transparent film 7030, a light blocking film 7040 is formed. In the light blocking film 7040, the openings 7041 for light transmission are formed so that light is incident on the light receiving elements 7020 via the openings 7041. The light receiving elements 7020 and the calculating portion 7050 are electrically connected, and output signals from the light receiving elements 7020 are processed by the calculating portion 7050.

The semiconductor substrate 7011 is formed in a rectangular shape, and the light receiving elements 7020 described above and electronic elements (not shown) forming the calculating portion 7050 are formed thereon. These electronic elements are electrically connected via a wiring pattern (not shown) formed in the semiconductor substrate 7011.

Each of the light receiving elements 7020 is for converting light to an electric signal. Each of the light receiving elements 7020 according to the present embodiment is a photodiode having a PN junction. As shown in FIGS. 37 to 39, the plurality of light receiving elements 7020 are formed in the form of a matrix and, of the eighty-one light receiving elements 7020, a matrix having nine rows and nine columns is formed. The matrix having the nine rows and the nine columns is divided into four light receiving element groups 21 to 24 by two crisscross lines (lines shown as the dash-dot lines in FIG. 38) including one along a direction (hereinafter shown as a row direction) in which the row numbers increase/decrease and the other along a direction (hereinafter shown as a column direction) in which the column numbers increase/decrease, and crossing at a center point P of the matrix. The row numbers and column numbers of the light receiving elements 7020 forming a first light receiving element group 7021 are each small, while the row numbers of the light receiving elements 7020 forming a second light receiving element group 7022 are large and the column numbers thereof are small. On the other hand, the row numbers of the light receiving elements 7020 forming a third light receiving element group 7023 are small and the column numbers thereof are large, while the row numbers and column numbers of the light receiving elements 7020 forming a fourth light receiving element group 7024 are each large. The light receiving element groups 7021 and 7022 share the light receiving elements 7020 in the fifth column having the row numbers of not more than 5, while the light receiving element groups 7023 and 7024 share the light receiving elements 7020 in the fifth column having the row numbers of not less than 5. Also, the light receiving element groups 7021 and 7023 share the light receiving elements 7020 in the fifth row having the column numbers of not more than 5, while the light receiving element groups 7022 and 7024 share the light receiving elements 7020 in the fifth row having the column numbers of not less than 5. In FIG. 38, to avoid complication, only the third light receiving element group 7023 and the openings 7041 corresponding to the light receiving elements 7020 forming the third light receiving element group 7023 are precisely shown.

The light transparent film 7030 is made of a material having a light transparent property and an insulating property. Examples of a material having such properties include a silicon oxide film. As shown in FIG. 39, the one-layer light transparent film 7030 is formed on the formation surface 7011a.

The light blocking film 7040 is made of a material having a light blocking property and an electrically conductive property. Examples of a material having such properties include aluminum. As shown in FIG. 39, the light blocking film 7040 is formed on the light transparent film 7030, and the one-layer light blocking film 7040 is formed over the formation surface 7011a via the light transparent film 7030. In the light blocking film 7040, the eighty-one openings 7041 corresponding to the eighty-one respective light receiving elements 7020 are formed, and the aperture area of each of the openings 7041 is generally the same as the light receiving area of each of the light receiving elements 7020. As shown in FIG. 38, in the present embodiment, the eighty-one openings 7041 are formed in the light blocking film 7040 along virtual lines (not shown) radially extending from the center point P so as to go farther away from the corresponding light receiving elements 7020. The spaced-apart distance between each of the openings 7041 and the light receiving element 7020 corresponding to the opening 7041 is proportional to the distance between the center point P and the light receiving element 7020. Note that the light blocking film 7040 is electrically connected to the wiring pattern formed in the semiconductor substrate 11 to also function as wiring electrically connecting the individual electronic elements, though not shown.

The calculating portion 7050 is for calculating the elevation angle of light incident on the semiconductor substrate 7011 and the right-left angle thereof based on the output signals from the respective light receiving elements 7020. As shown in FIG. 40, the calculating portion 7050 has the four amplifying portions 7051 for amplifying the output signals from the respective light receiving elements 7020 and the arithmetic operation portion 7052 for performing an arithmetic operation on output signals from the amplifying portions 7051 to calculate the amount of light incident on the optical sensor 7100 and the elevation angle and right-left angle thereof. A first amplifying portion 7051a amplifies the output signals from the respective light receiving elements 7020 forming the first light receiving element group 7021, while performing an addition thereof. A second amplifying portion 7051b amplifies the output signals from the respective light receiving elements 7020 forming the second light receiving element group 7022, while performing an addition thereof. A third amplifying portion 7051c amplifies the output signals from the respective light receiving elements 7020 forming the third light receiving element group 7023, while performing an addition thereof. A fourth amplifying portion 7051d amplifies the output signals from the respective light receiving elements 7020 forming the fourth light receiving element group 7024, while performing an addition thereof.

When output signals from the respective amplifying portions 7051a to 7051d are inputted thereto, the arithmetic operation portion 7052 performs an addition thereof to determine the amount of incident light by the arithmetic operation, while comparing the four output signals with each other to approximately calculate the incident direction of light. For example, it can be seen that, when the output signal from the first light receiving element group 7021 is maximum, the light is incident so as to travel from the first light receiving element group 7021 toward the center point P and, when the output signal from the second light receiving element group 7022 is maximum, the light is incident so as to travel from the second light receiving element group 7022 toward the center point P. It can also be seen that, when the output signal from the third light receiving element group 7023 is maximum, the light is incident so as to travel from the third light receiving element group 7023 toward the center point P and, when the output signal from the fourth light receiving element group 7024 is maximum, the light is incident so as to travel from the fourth light receiving element group 7024 toward the center point P. Thus, the arithmetic operation portion 7052 compares the four output signals (the output signals from the respective light receiving element groups 7021 to 7024) with each other to thereby approximately calculate the incident direction of light.

The amounts of light along the row direction which is incident on the light receiving element groups 7021 and 7023 are different from the amounts of light along the row direction which is incident on the light receiving element groups 7022 and 7024, and the amounts of light along the column direction which is incident on the light receiving element groups 7021 and 7022 are different from the amounts of light along the column direction which is incident on the light receiving element groups 7023 and 7024. Accordingly, the arithmetic operation portion 7052 calculates the right-left angle of light based on the output signals from the light receiving element groups 7021 and 7022 or the output signals from the light receiving element groups 7023 and 7024, and calculates the elevation angle of light based on the output signals from the light receiving element groups 7021 and 7023 or the output signals from the light receiving element groups 7022 and 7024.

Next, the operation/effect of the optical sensor 7100 according to the present embodiment will be described. As described above, the light receiving area of each of the light receiving elements 7020 is generally the same as the aperture area of the corresponding opening 7041. Accordingly, compared to a configuration in which one opening corresponds to a plurality of light receiving elements and the aperture area is larger than the light receiving area, the angle range (directivity) of light incident on the light receiving surface of each of the light receiving elements 7020 is narrowed. As a result, the directivity characteristic of each of the light receiving elements 7020 is improved, and the accuracy of detection of the incident angles of light is improved.

The present embodiment has shown the example in which the four light receiving element groups 7021 to 7024 are formed. However, the number of the groups is appropriate as long as the number thereof is not less than 3.

The present embodiment has shown the example in which the eighty-one light receiving elements 7020 are formed on the semiconductor substrate 7011. However, the number of the light receiving elements 7020 is appropriate as long as the number thereof is not less than 3, and is not limited to that in the foregoing example.

The present embodiment has shown the example in which the light transparent film 7030 is in one layer, and the light blocking film 7040 is in one layer. However, the respective numbers of the layers of the light transparent films 7030 and the light blocking films 7040 are not limited to those in the foregoing example. For example, it is also possible to adopt a configuration in which the light transparent films 7030 are in two layers, and the light blocking films 7040 are in two layers. If the light blocking films 7040 are thus formed in multiple layers in the light transparent films 7030, compared to a configuration in which the openings 7041 are formed in the one-layer light blocking film 7040, the range of light incident on the semiconductor substrate 7011 can be narrowed. This inhibits light incident from a given one of the openings 7041 from being incident on the light receiving element 7020 other than the light receiving element 7020 corresponding to the given opening 7041, and inhibits the output signal from each of the light receiving elements 7020 from including a disturbance output.

The present embodiment has shown the example in which the light blocking film 7040 is made of a material having a light blocking property and an electrically conductive property. However, in the case where the individual electronic elements formed on the semiconductor substrate 7011 need not be electrically connected by the light blocking film 7040, the light blocking film 7040 may also be formed of a material having a light absorbing property.

Ninth Embodiment

Figure 41:
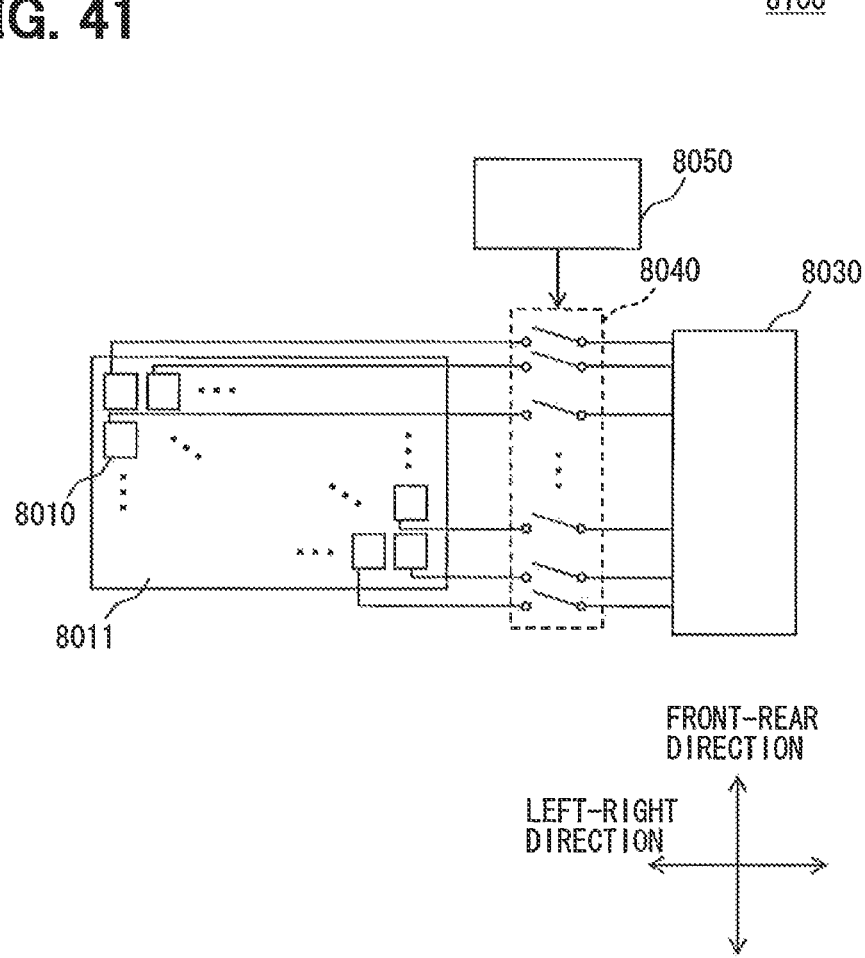
FIG. 41 is a circuit diagram showing a schematic configuration of an optical sensor according to a ninth embodiment.
Figure 42:
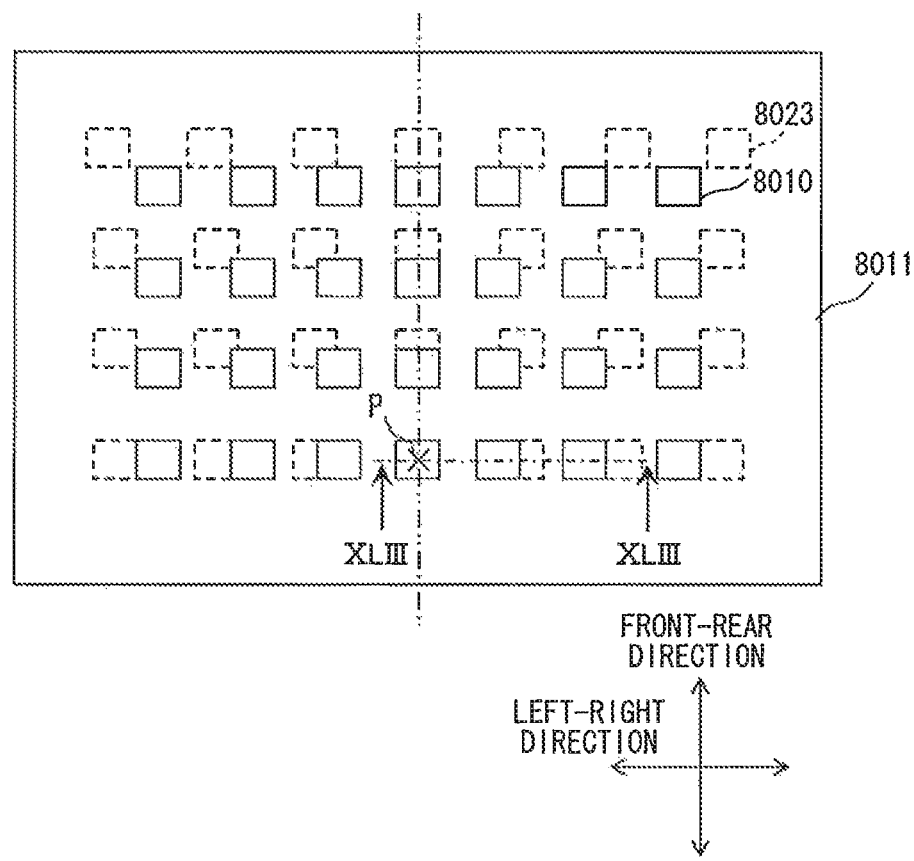
FIG. 42 is a plan view for illustrating the arrangement of light receiving elements and openings.
Figure 43:
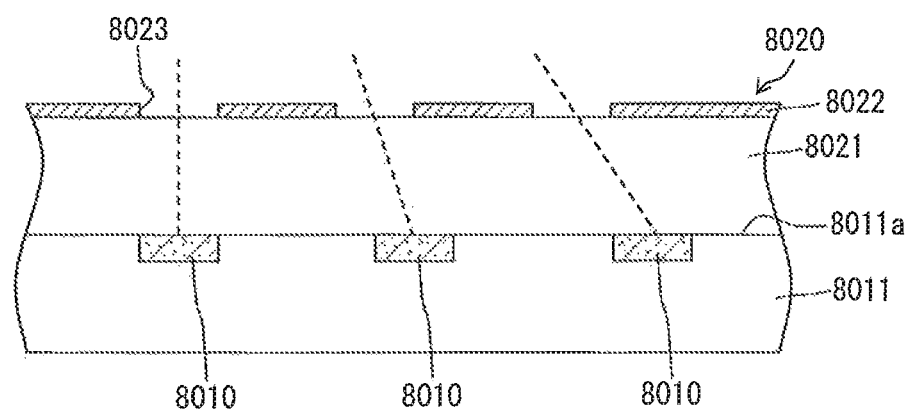
FIG. 43 is a cross-sectional view of an optical sensor along the line XLIII-XLIII of FIG. 42.
Figure 44:
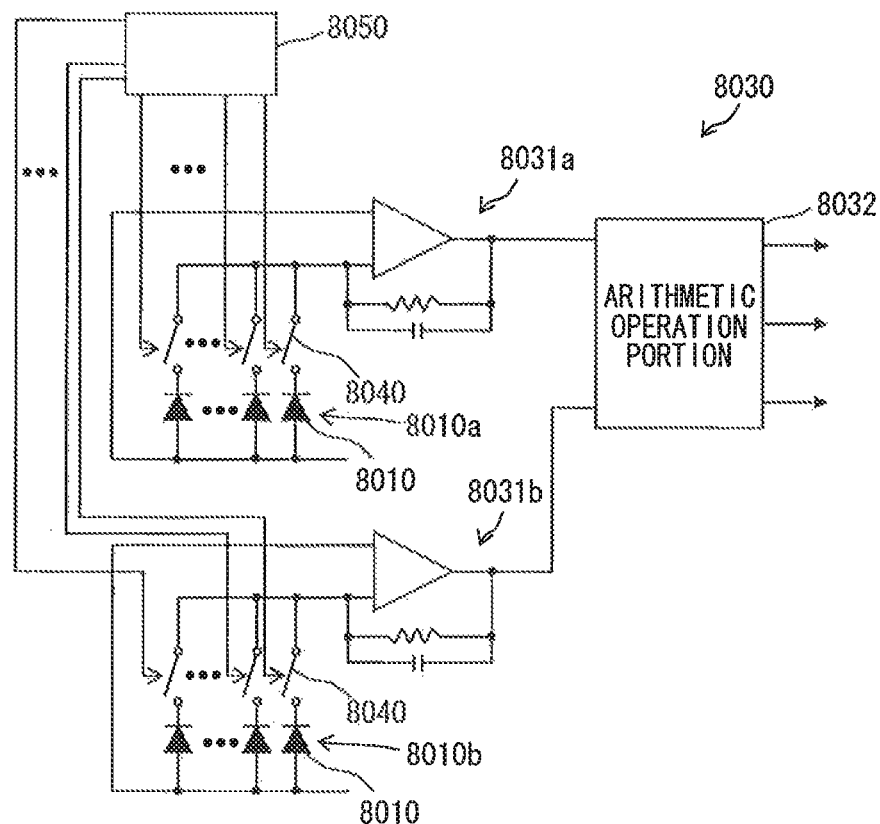
FIG. 44 is a circuit diagram for illustrating a schematic configuration of a calculating portion.

FIG. 41 is a circuit diagram showing a schematic configuration of an optical sensor. FIG. 42 is a plan view for illustrating the arrangement of light receiving elements and openings. FIG. 43 is a cross-sectional view along the line XLIII-XLIII of FIG. 42. FIG. 44 is a circuit diagram for illustrating a schematic configuration of a calculating portion. Note that, in FIG. 42, for clear illustration of positions at which light receiving elements 8010 are formed, the light receiving elements 8010 are shown by the solid lines, and openings 8023 are shown by the broken lines. Also, in FIG. 43, the virtual lines connecting the centers of the light receiving elements 8010 and the centers of the openings 8023 corresponding to the light receiving elements 8010 are shown by the broken lines.

In the following, a direction along the rows of a matrix formed of the plurality of light receiving elements 8010 is shown as a right-left direction, and a direction along the columns thereof is shown as a front-rear direction. Note that a left side shown below is a side with smaller column numbers, and a right side shown below is a side with larger column numbers. Also, a front side is a side with smaller row numbers, and a rear side is a side with larger row numbers.

As shown in FIGS. 41 to 43, an optical sensor 8100 includes, as main portions thereof, the light receiving elements 8010, defining portions 8020, a calculating portion 8030, selection switches 8040, and a control portion 8050. The light receiving elements 8010 and the calculating portion 8030 are electrically connected via the selection switches 8040. Output signals from the light receiving elements 8010 are inputted to the calculating portion 8030 via the selection switches 8040 brought into a closed state by the control portion 8050.

Each of the light receiving elements 8010 is for converting light to an electric signal, and is a photodiode having a PN junction. As shown in FIGS. 42 and 43, the twenty-eight light receiving elements 8010 are formed on one surface 8011a side of the semiconductor substrate 8011 to form a matrix having four rows and seven columns. In the present embodiment, the matrix is halved by a division line (line shown by the two-dot-dash line in FIG. 42) into a first light receiving element group 8010a formed of the light receiving elements 8010 in the first to fourth columns and a second light receiving element group 8010b formed of the light receiving elements 8010 in the fourth to seventh columns. Note that, on a semiconductor substrate 8011, the components 8030 to 8050 of the optical sensor 8100 are formed, and electrically connected via a wiring pattern formed in the semiconductor substrate 8011, though not shown.

The defining portions 8020 are each for defining the incident angles of light incident on the light receiving surfaces of the twenty-eight respective light receiving elements 8010 such that the incident angles of the light are different. As shown in FIG. 43, each of the defining portions 8020 includes a light transparent film 8021 formed on the one surface 8011a, a light blocking film 8022 formed on the light transparent film 8021, and the openings 8023 for projecting light formed in the light blocking film 8022. As shown by the broken lines in FIG. 43, the inclinations of the lines connecting the centers of the light receiving surfaces of the respective light receiving elements 8010 and the centers of the corresponding openings 8023 are different, and the angles of light incident on the respective light receiving elements 8010 are different. The light transparent film 8021 is made of a material having an insulating property and a light transparent property. Examples of a material having such properties include silicon dioxide $SiO_2$. The light blocking film 8022 is made of a material having a light blocking property and an electrically conductive property. Examples of a material having such properties include aluminum.

As shown in FIG. 42, the plurality of defining portions 8020 are formed in the light blocking film 8022 and along virtual lines (not shown) radially extending from the light receiving element 8010 (reference point P) located in the fourth row and the fourth column so as to go farther away from the corresponding light receiving elements 8010. The spaced-apart distance between each of the openings 8023 and the light receiving element 8010 corresponding to the opening 8023 is proportional to the distance between the reference point P and the light receiving element 8010. Accordingly, in the first light receiving element group 8010a, light incident from the left side is easy to detect, and light incident from the right side is hard to detect. Conversely, in the second light receiving element group 8010b, light incident from the right side is easy to detect, and light incident from the left side is hard to detect. Also, in each of the light receiving elements 8010, light incident from the rear side is hard to detect and, as the column numbers increase/decrease from the light receiving elements 8010 in the fourth column, light incident from the front side is harder to detect. As shown above, the light receiving elements 8010 forming the first light receiving element group 8010a easily detect light incident from the left side, the light receiving elements 8010 forming the second light receiving element group 8010b easily detect light incident from the left side, and the light receiving elements 8010 in the fourth column easily detect light incident from the front side.

The calculating portion 8030 calculates the incident angles of light based on the output signals from the light receiving elements 8010. As shown in FIG. 44, the calculating portion 8030 includes two amplifying portions 8031a and 8031b for amplifying the output signals from the light receiving element groups 8010a and 8010b, and an arithmetic operation portion 8032 for performing an arithmetic operation on output signals from the amplifying portions 8031a and 8031b to thereby calculate the incident direction of light incident on the optical sensor 8100. The first amplifying portion 8031a amplifies the output signals from the respective light receiving elements 8010 forming the first light receiving element group 8010a, while performing an addition thereof. The second amplifying portion 8031b amplifies the output signals from the respective light receiving elements 8010 forming the second light receiving element group 8010b, while performing an addition thereof.

When the output signals from the respective amplifying portions 8031a and 8031b are inputted thereto, the arithmetic operation portion 8032 performs an addition thereof to determine the amount of incident light by the arithmetic operation, while comparing the two output signals with each other to approximately calculate the incident direction of light. For example, it can be seen that, when the output signal from the first light receiving element group 8010a is higher than the output signal from the second light receiving element group 8010b, the light is incident from the left side. It can also be seen that, conversely, when the output signal from the second light receiving element group 8010b is higher than the output signal from the first light receiving element group 8010a, the light is incident from the right side. By thus comparing the output signals from the two respective light receiving element groups 8010a and 8010b with each other, the incident direction of light can be approximately be calculated.

The arithmetic operation portion 8032 according to the present embodiment calculates a value obtained by dividing the output signal from the first light receiving element group 8010a by the total sum of the output signals from the two light receiving element groups 8010a and 8010b and a value obtained by dividing the output signal from the second light receiving element group 8010b by the total sum of the output signals from the two light receiving element groups 8010a and 8010b, and determines a ratio between the two values to detect how much light is incident on the optical sensor 8100 from each of the left and right directions.

The selection switches 8040 are for controlling the opening and closing of the connection between the light receiving elements 8010 and the calculating portion 8030, and are provided between the respective light receiving elements 8010 and the calculating portion 8030. The selection switches 8040 according to the present embodiment are N-channel MOSFETs.

The control portion 8050 is for controlling the opening and closing of the selection switches 8040, and is an address decoder. The control portion 8050 is provided with a storage portion such as a ROM and, based on information stored in the storage portion, to which one of the selection switches a signal on a Hi voltage level is constantly outputted and which one of the light receiving elements 8010 is electrically connected to the calculation portion 8040 has been determined. The information in the storage portion is determined according to the use purpose thereof. For example, when light of which the angles (elevation angles) formed by the light receiving surfaces of the light receiving elements 8010 and the virtual lines shown as the broken lines in FIG. 43 are large is to be detected, only the selection switches 8040 corresponding to the light receiving elements 8010 in the third to fifth columns are constantly held in the closed state and, when light of which the angles described above are small is to be detected, only the selection switches 8040 corresponding to the light receiving elements 8010 in the first, second, sixth, and seventh columns are constantly held in the closed state. Thus, the selection switches 8040 are selected so as to be symmetrical with respect to the division line. If represented in a numerical expression wherein n is a natural number of 1 to 4 and m is a natural number of 1 to 3, the selection switches 8040 corresponding to the light receiving elements 8010 in the n-th row and the (4−m)-th column and the selection switches 8040 corresponding to the light receiving elements 8010 in the n-th row and the (4+m)-th column are selected.

Next, the operation/effect of the optical sensor 8100 will be described. As described above, the light receiving elements 8010 and the calculating portion 8030 are electrically connected via the selection switches 8040, and the opening and closing of the selection switches 8040 are controlled by the control portion 8050. Accordingly, even when there is an angle of light particularly desired to be detected, it is sufficient to rewrite the information in the storage portion of the control portion 8050 based on the use purpose thereof. As a result, compared to a configuration in which defining portions are produced again based on the use purpose thereof, versatility is improved.

The light receiving elements 8010 are formed on the one surface 8011a side of the semiconductor substrate 8011, and each of the defining portions 8020 is formed of the plurality of thin films 8021 and 8022 formed over the one surface 8011a. Therefore, compared to a configuration in which a shielding plate formed with an opening window or the like is provided over a semiconductor substrate, an increase in the scale of the optical sensor 8100 is suppressed.

The present embodiment has shown the example in which the twenty-eight light receiving elements 8010 are formed on the semiconductor substrate 8011. However, the number of the light receiving elements 8010 is not limited to that in the foregoing example.

The present embodiment has shown the example in which the plurality of light receiving elements 8010 are arranged in the form of a matrix. However, the example of the arrangement of the light receiving elements 8010 is not limited to the foregoing example. For example, it is also possible to adopt a configuration in which the light receiving elements 8010 are arranged in the form of virtual lines radially extending from the reference point P.

The present embodiment has shown the example in which, as shown in FIG. 42, the plurality of light receiving elements 8010 having the light receiving areas equal to each other are formed on the semiconductor substrate 8011. However, it is also possible to adopt a configuration in which, to detect the amount of incident light, a light receiving element for detecting the amount of incident light having a light receiving area larger than that of each of the other light receiving elements 8010 is formed on the semiconductor substrate 8011.

Figure 45:
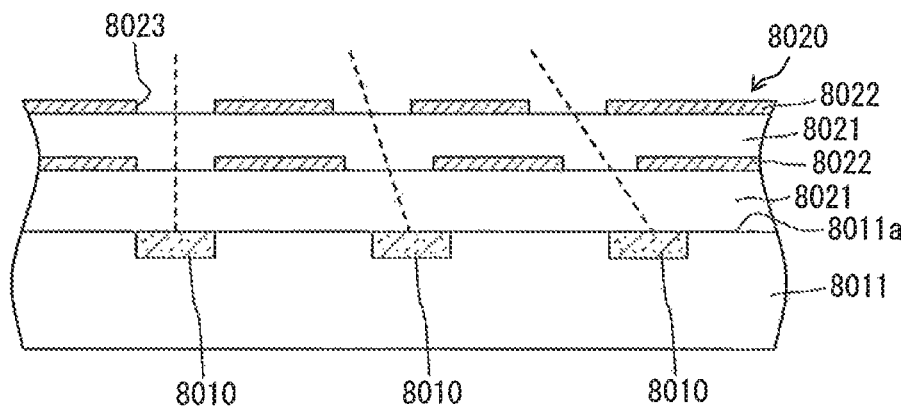
FIG. 45 is a cross-sectional view for illustrating the deformable property of a defining portion.

The present embodiment has shown the example in which, as shown in FIG. 42, the light transparent film 8021 is in one layer, and the light blocking film 8022 is in one layer. However, the respective numbers of the layers of the light transparent films 8021 and the light blocking films 8022 are not limited to those in the foregoing example. For example, as shown in FIG. 45, it is also possible to adopt a configuration in which the light transparent films 8021 are in two layers, and the light blocking films 8022 are in two layers. If the light blocking films 8022 are thus formed in multiple layers in the light transparent films 8021, compared to a configuration in which the openings 2023 are formed in the one-layer light blocking film 8022, the range of light incident on the semiconductor substrate 8011 can be narrowed. This inhibits light incident from a given one of the openings 8023 from being incident on the light receiving element 8010 other than the light receiving element 8010 corresponding to the given opening 8023, and inhibits the output signal from the light receiving element 8010 from including a light output (disturbance output) from the unintended opening 8023. FIG. 45 is a cross-sectional view for illustrating the deformable property of the defining portions.

While the present invention has been disclosed with reference to the preferred embodiments, it will be understood that the present invention is not limited to the preferred embodiments and the structures thereof. The present invention is intended to include various modifications and equivalent arrangements. In addition, preferred or various other combinations and forms merely including a larger or smaller number of one of the components also fall within the scope and range of the present invention.

The invention claimed is:

1. An optical sensor comprising:
a plurality of light receiving elements disposed on one surface side of a semiconductor substrate and converting light to an electric signal;
a light transparent film disposed on the one surface of the semiconductor substrate and having a light transparent property;
a light blocking film disposed on the one surface of the semiconductor substrate via the light transparent film and having a light blocking property; and
a plurality of openings disposed in the light blocking film for introducing light into respective light receiving elements,
wherein the light receiving elements include a first light receiving element and a second light receiving element,
wherein the openings include a first opening corresponding to the first light receiving element and a second opening corresponding to the second light receiving element,
wherein a first virtual line is defined so as to extend from a center of the first light receiving element and to pass through a center of the first opening,
wherein a second virtual line is defined so as to extend from a center of the second light receiving element and to pass through a center of the second opening,
wherein the first virtual line and the second virtual line are different in at least one of an elevation angle and a right-left angle, and
wherein a light receiving area of the first light receiving element is larger than an aperture area of the first opening, and a light receiving area of the second light receiving element is larger than an aperture area of the second opening.

2. The optical sensor according to claim 1,
wherein the light receiving elements further include a third light receiving element,
wherein the openings further include a third opening corresponding to the third light receiving element,
wherein a third virtual line is defined so as to extend from a center of the third light receiving element and to pass through a center of the third opening,
wherein the third virtual line, the first virtual line, and the second virtual line are different in at least one of an elevation angle and a right-left angle, and
wherein a light receiving area of the third light receiving element is larger than an aperture area of the third opening.

3. The optical sensor according to claim 2,
wherein the light receiving elements further include a fourth light receiving element,
wherein the openings further include a fourth opening corresponding to the fourth light receiving element,
wherein a fourth virtual line is defined so as to extend from a center of the fourth light receiving element and to pass through a center of the fourth opening,
wherein the fourth virtual line and the first to third virtual lines are different in at least one of an elevation angle and a right-left angle, and
wherein a light receiving area of the fourth light receiving element is larger than an aperture area of the fourth opening.

4. The optical sensor according to claim 2, further comprising:
a calculating portion for calculating the elevation angle and the right-left angle of light incident on the semiconductor substrate and an amount of the incident light according to an output signal from each light receiving element.

5. The optical sensor according to claim 1,
wherein each of the light blocking film and the light transparent film has a multilayer structure,
wherein an opening disposed in each layer of the light blocking film defines the elevation angle of light, and
wherein an aperture area of an opening disposed in each layer of the light blocking film gradually increases with approach to the semiconductor substrate.

6. An optical sensor comprising:
a plurality of light receiving elements disposed on one surface side of a semiconductor substrate and converting light to an electric signal;
a light blocking film disposed over the light receiving elements on the semiconductor substrate via a light transparent film;
a plurality of openings for transmitting light disposed in the light blocking film and corresponding to the light receiving elements, respectively; and
a light blocking portion,
wherein each opening defines an elevation angle of light,
wherein the elevation angle is an angle between a line parallel with a light receiving surface of a corresponding light receiving element and a traveling direction of light,
wherein the light blocking portion prevents light incident from one of the openings corresponding to a respective light receiving element from entering into another light receiving element adjacent to the respective light receiving element, and
wherein the light blocking portion is disposed in the light transparent film between the openings adjacent to each other.

7. The optical sensor according to claim 6,
wherein the light blocking portion has a light blocking wall extending from the one surface side of the semiconductor substrate and reaching the light blocking film.

8. The optical sensor according to claim 7,
wherein the light blocking wall has an annular shape, and
wherein each of the openings is surrounded by the light blocking wall having the annular shape.

9. The optical sensor according to claim 7,
wherein each of the light blocking film and the light blocking wall has an electrically conductive property.

10. The optical sensor according to claim 6,
wherein the light blocking portion has a light absorbing film having a property of absorbing light, and
wherein the light absorbing film is disposed on a surface of the light blocking film.

11. The optical sensor according to claim 10,
wherein the light absorbing film is disposed on an edge of each of the openings.

12. The optical sensor according to claim 11,
wherein an end portion of the light blocking film disposed on the edge of each opening is inclined along an incident direction of light.

13. The optical sensor according to claim 6,
wherein each of the light blocking film and the light transparent film has a multilayer structure, and
wherein an opening disposed in each layer of the light blocking film defines the elevation angle.

14. An optical sensor comprising:
a plurality of light receiving elements disposed on one surface side of a semiconductor substrate and converting light to an electric signal;
a light blocking film disposed over the light receiving elements on the semiconductor substrate via a light transparent film; and
a plurality of openings for transmitting light disposed in the light blocking film and corresponding to the light receiving elements, respectively,
wherein the light receiving elements include a light receiving element for detecting an intensity of light, and a light receiving element for detecting an incident angle of light, and
wherein each of the light transparent film and the light blocking film located over the light receiving element for detecting the intensity of light is removed.

15. The optical sensor according to claim 14,
wherein each of the light transparent film and the light blocking film located over the light receiving element for detecting the incident angle of light remains.

16. The optical sensor according to claim 14,
wherein a recessed portion is provided by a light receiving surface of the light receiving element for detecting the intensity of light as a bottom surface thereof and the light transparent film and the light blocking film as side walls thereof, and
wherein the side walls of the recessed portion are inclined such that an aperture area of the recessed portion gradually increases upwardly along the light receiving element for detecting the intensity of light.

17. The optical sensor according to claim 14,
wherein a light receiving area of the light receiving element for detecting the intensity of light is larger than a light receiving area of the light receiving element for detecting the incident angle of light.

18. The optical sensor according to claim 14, further comprising:
a light-transparent protective film disposed on the one surface side of the semiconductor substrate and protecting a light receiving surface of each light receiving element,
wherein the light transparent film and the light blocking film are disposed over the protective film.

19. The optical sensor according to claim 14, further comprising:
a calculating portion,
wherein the calculating portion calculates an angle of light incident on the semiconductor substrate based on an output signal from the light receiving element for detecting the incident angle of light, and
wherein the calculating portion further calculates the intensity of light based on a calculated angle of light and an output signal from the light receiving element for detecting the intensity of light.

20. The optical sensor according to claim 19,
wherein a virtual line connecting between a center of one light receiving element for detecting the incident angle of light and a center of the opening corresponding to the one light receiving element is defined, and
wherein at least three virtual lines are different in at least one of an elevation angle and a right-left angle.

21. The optical sensor according to claim 20,
wherein the calculating portion calculates the incident angle of light by calculating ratios between output signals from at least three light receiving elements for detecting the incident angle of light.

22. The optical sensor according to claim 14,
wherein each of the light blocking film and the light transparent film has a multilayer structure, and,
wherein each of the openings disposed in a respective layer of the light blocking film defines the elevation angle of light.

23. An optical sensor comprising:
a plurality of light receiving elements disposed on one surface side of a semiconductor substrate and converting light to an electric signal;
a light blocking film disposed over the light receiving elements on the semiconductor substrate via a light transparent film; and
a plurality of openings disposed in the light blocking film and corresponding to the light receiving elements, respectively,
wherein the plurality of light receiving elements include a pair of the light receiving elements, which are located line-symmetrical with respect to a virtual line,
wherein the virtual line is disposed along the one surface side of the semiconductor substrate,
wherein a pair of the openings corresponding to the pair of the light receiving elements are located line-symmetrical with respect to the virtual line,
wherein each of the pair of the light receiving elements has a recessed shape, which extends from one end of the virtual line toward the other end of the virtual line, and is recessed in a middle of the recessed shape,
wherein the recessed shape has a lateral width, which increases with distance from one end portion of the recessed shape toward the other end portion of the recessed shape,
wherein each of the pair of the openings provides a projected portion, which is prepared by projecting a respective opening by light, incident on the one surface side of the semiconductor substrate, onto the one surface side of the semiconductor substrate, and
wherein at least one part of the projected portion is located in a region enclosed by a corresponding light receiving element and a line connecting between one end portion of the corresponding light receiving element and the other end portion of the corresponding light receiving element.

24. The optical sensor according to claim 23,
wherein the plurality of light receiving elements include at least two pairs of the light receiving elements, and
wherein the openings include two pairs of the openings corresponding to the at least two pairs of the light receiving elements.

25. The optical sensor according to claim 24,
wherein a distance between one of one pair of the light receiving elements and a respective opening corresponding to the one of the one pair of the light receiving elements is different from a distance between one of the other pair of the light receiving elements and a respective opening corresponding to the one of the other pair of the light receiving elements.

26. The optical sensor according to claim 23,
wherein a curved line passing through respective centers of the one pair of the light receiving elements in a lateral width has an arc shape having a predetermined radius, and
wherein the projected portion of each of the openings is located at a center of the arc-shaped curved line.

27. The optical sensor according to claim 26,
wherein a fan is provided by a line connecting the arc-shaped curved line and a center of the arc shape, and
wherein a center angle of the fan is not less than 180 degrees.

28. The optical sensor according to claim 23,
wherein each of the pair of the light receiving elements has a shape, which continuously widens with distance from the one end portion of the light receiving element toward the other end portion of the light receiving element.

29. The optical sensor according to claim 28,
wherein each of the pair of the light receiving elements has the other end portion having a line shape, and
wherein each of the pair of light receiving elements has a horn shape.

30. The optical sensor according to claim 28,
wherein each of the pair of light receiving elements has the other end portion having a curved shape, and
wherein each of the pair of light receiving elements has a comma-shaped bead shape.

31. The optical sensor according to claim 23,
wherein each of the light blocking film and the light transparent film has a multilayer structure,
wherein each of the openings disposed in a respective layer of the light blocking film defines the elevation angle of light,
wherein each of the openings except for one of the openings in a layer farthest away from the one surface side of the semiconductor substrate has a recessed shape,
wherein the recessed shape extends from the one end of the virtual line toward the other end of the virtual line, and is recessed in a middle of the recessed shape, and
wherein a lateral width of the recessed shape widens with distance from one end portion of the recessed shape toward the other end portion of the recessed shape.

32. The optical sensor according to claim 31,
wherein each of the openings except for one of the openings in a layer farthest away from the one surface side of the semiconductor substrate has a shape, which continuously widens with distance from one end portion of the shape to the other end portion of shape.

33. The optical sensor according to claim 32,
wherein each of the openings except for one of the openings in a layer farthest away from the one surface side of the semiconductor substrate has the other end portion having a line shape, and
wherein each of the openings has a horn shape.

34. The optical sensor according to claim 32,
wherein each of the openings except for one of the openings in a layer farthest away from the one surface side of the semiconductor substrate has the other end portion having a curved shape, and
wherein each of the openings has a comma-shaped bead shape.

35. An optical sensor device comprising:
an optical sensor; and
an angle calculating unit,
wherein the optical sensor includes: a plurality of light receiving elements disposed on a semiconductor substrate and converting light to an electric signal; a light transparent film disposed over the light receiving elements on the semiconductor substrate and having a light transparent property; a light blocking film disposed on the light transparent film and having a light blocking property; and a plurality of openings disposed in the light blocking film, corresponding to the light receiving elements, respectively, and defining angles of light incident on light receiving surfaces of the light receiving elements, respectively, wherein the angle calculating unit calculates elevation angles of light and right-left angles of light based on output signals from the light receiving elements, respectively, wherein the plurality of light receiving elements include a plurality of groups of light receiving elements having the right-left angles of light equal to each other, and the elevation angles of light different from each other, wherein the plurality of light receiving element groups have different right-left angles, wherein the angle calculating unit compares intensities of the output signals from the light receiving elements with each other so that the light receiving element outputting the most strong output signal is specified, and wherein the angle calculating unit specifies the angle of the light incident on the light receiving surface of a specified light receiving element.

36. The optical sensor device according to claim 35, wherein the angle calculating unit includes a distribution forming portion for forming a matrix having voltages of the output signals from the light receiving elements as elements of the matrix so as to form a distribution of the intensities of the output signals from the light receiving elements in accordance with the angles of the light incident on the light receiving surfaces, wherein the distribution forming portion provides a first matrix and a second matrix, wherein, in the first matrix, the output signals from the light receiving elements having the light receiving surfaces on which the light is incident at the different right-left angles are arranged such that the right-left angles increase or decrease as row numbers or column numbers increase, and, wherein, in the second matrix, the output signals from the light receiving elements having the light receiving surfaces on which the light is incident at the different elevation angles are arranged such that the elevation angles increase or decrease as row numbers or column numbers increase.

37. The optical sensor device according to claim 36, wherein the angle calculating unit further includes a comparing portion, wherein the comparing portion outputs a high signal when a voltage of the output signal from one light receiving element is higher than a threshold voltage, and outputs a low signal when the voltage of the output signal from the one light receiving element is lower than the threshold voltage, wherein the distribution forming portion has a plurality of flip-flops, wherein each of the flip-flops continues to hold a flag of "0" when the high signal has never been input to the flip-flop, wherein each of the flip-flops continues to hold a flag of "1" when the high signal has been input to the flip-flop even once until a reset signal for setting the flag to "0" is input to the flip-flop, wherein a value of each of the elements of the first matrix and the second matrix is the flag of one of the flip-flops, wherein each of the first matrix and the second matrix is a matrix having one column or one row, wherein the output signals from the light receiving elements having the light receiving surfaces on which light is incident at the same right-left angle and at the different elevation angles are sequentially input to the flip-flops providing the first matrix via the comparing portion, and, wherein the output signals from the respective light receiving elements having the light receiving surfaces on which the light is incident at the same elevation angle and at the different right-left angles are sequentially input to the flip-flops providing the second matrix via the comparing portion.

38. The optical sensor device according to claim 37, wherein the angle calculating unit includes:
  a plurality of first switches for controlling electrical connection between the respective light receiving elements and the comparing portion to open and close;
  a plurality of second switches for controlling electrical connection between the respective flip-flops and the comparing portion to open and close; and
  an address decoder for sequentially switching each of the plurality of first switches into a closed state one by one, and switching the second switch corresponding to the first switch, which is switched to the closed state, into the closed state.

39. The optical sensor device according to claim 37, further comprising:

a light receiving element for radiation amount detection having a light receiving area larger than that of each of the plurality of light receiving elements, wherein the light receiving element for radiation amount detection is disposed on the semiconductor substrate, and wherein the angle calculating unit has a reference voltage generating portion for generating the threshold voltage based on an output signal from the light receiving element for radiation amount detection.

40. The optical sensor device according to claim 39, further comprising:

a radiation amount calculating unit for calculating an amount of radiation of light radiated toward the semiconductor substrate based on the output signal from the light receiving element for radiation amount detection and the angle of the light incident on the light receiving surface of one of the plurality of light receiving elements, which outputs the most intense output signal.

41. The optical sensor device according to claim 35, further comprising:

a radiation amount calculating unit for calculating an amount of radiation of light radiated toward the semiconductor substrate based on the output signal from one of the plurality of light receiving elements outputting the most intense output signal and the angle of the light incident on the light receiving surface of the one of the plurality of light receiving elements.

42. The optical sensor device according to claim 35, wherein the plurality of light receiving elements are disposed on each of a plurality of virtual lines radially extending from an arbitrary point at the semiconductor substrate so that the plurality of light receiving elements are arranged radially, and wherein the elevation angles of light defined by the respective openings corresponding to the plurality of light receiving elements radially arranged decrease or increase with distance from the arbitrary point.

43. The optical sensor device according to claim 42, wherein nineteen virtual lines extend from the arbitrary point, wherein an angle formed by adjacent two virtual lines is 10 degrees around the arbitrary point, and wherein nine light receiving elements are disposed on each of the virtual lines such that the elevation angles of light incident on the light receiving surfaces decrease or increase by 10 degrees every element with distance from the arbitrary point.

44. The optical sensor device according to claim 35, wherein each of the light blocking film and the light transparent film has a multilayer structure, and
wherein the openings formed in each layer of the light blocking film define the angles of the light incident on the light receiving surfaces, respectively.

45. An optical sensor comprising:
a plurality of light receiving elements disposed on one surface side of a semiconductor substrate and converting light to an electric signal;
a light blocking film disposed over one surface of the semiconductor substrate via a light transparent film; and
a plurality of openings transmitting light, disposed in the light blocking film, and corresponding to the respective light receiving elements, wherein
at least one of elevation angles and right-left angles of three virtual lines, which connect centers of three light receiving elements and centers of the openings corresponding to the three light receiving elements, are different,
a light receiving area of each of the light receiving elements is substantially the same as an aperture area of the corresponding opening,
the plurality of light receiving elements are arranged in a matrix manner on the one surface side of the semiconductor substrate,
the plurality of openings are disposed in the light blocking film such that the openings is spaced apart from the respective light receiving elements along a virtual line radially extending from a center point of the matrix, and
a space distance between each of the openings and the light receiving element corresponding to the opening is proportional to a distance between the center point and the light receiving element.

46. The optical sensor according to claim 45, further comprising:
a calculating portion for calculating an elevation angle and a right-left angle of light incident on the semiconductor substrate based on output signals from the respective light receiving elements,
wherein the plurality of light receiving elements are divided into four light receiving element groups by two cross lines including one cross line disposed along a direction in which row numbers increase or decrease and the other cross line disposed along a direction in which column numbers increase or decrease, the one cross line and the other cross line cross at the center point,
wherein the four light receiving element groups include a first light receiving element group having small row numbers and small column numbers, a second light receiving element group having large row numbers and small column numbers, a third light receiving element group having small row numbers and large column numbers, and a fourth light receiving element group having large row numbers and large column numbers, and
wherein the calculating portion compares output signals from the respective four light receiving element groups with each other in order to approximately calculate an incident direction of light.

47. The optical sensor according to claim 46, wherein the calculating portion calculates the right-left angle of light based on the output signals from the first light receiving element group and the second light receiving element group or based on the output signals from the third light receiving element group and the fourth light receiving element group, and
wherein the calculating portion calculates the elevation angle of light based on the output signals from the first light receiving element group and the third light receiving element group or based on the output signals from the second light receiving element group and the fourth light receiving element group.

48. An optical sensor comprising:
a plurality of light receiving elements disposed on one surface side of a semiconductor substrate and converting light to an electric signal;
a light blocking film disposed over one surface of the semiconductor substrate via a light transparent film; and
a plurality of openings transmitting light, disposed in the light blocking film, and corresponding to the respective light receiving elements, wherein
at least one of elevation angles and right-left angles of three virtual lines, which connect centers of three light receiving elements and centers of the openings corresponding to the three light receiving elements, are different,
a light receiving area of each of the light receiving elements is substantially the same as an aperture area of the corresponding opening,
each of the light blocking film and the light transparent film has a multilayer structure, and
each of the openings disposed in each layer of the light blocking film defines the elevation angle of light.

49. An optical sensor comprising:
a plurality of light receiving elements;
a plurality of defining portions for defining incident angles of light incident on light receiving surfaces of the respective light receiving elements such that the incident angles of light are different from each other;
a calculating portion for calculating the incident angles of light based on output signals from the light receiving elements;
a plurality of selection switches provided between the respective light receiving elements and the calculating portion; and
a control portion for controlling each of the selection switches to open and close.

50. The optical sensor according to claim 49, wherein the light receiving elements are disposed on one surface side of a semiconductor substrate, and
wherein each of the defining portions includes a light transparent film disposed on the one surface side, a light blocking film disposed over the one surface side via the light transparent film, and an opening projecting light and disposed in the light blocking film.

51. The optical sensor according to claim 50, wherein the plurality of light receiving elements are arranged in a matrix manner on the one surface side of the semiconductor substrate,
wherein the plurality of openings are disposed in the light blocking film such that the openings is spaced apart from the respective light receiving elements along a virtual line radially extending from a reference point located on a division line which divides the matrix in half, and
wherein a space distance between each of the openings and the light receiving element corresponding to the opening is proportional to a distance between the reference point and the light receiving element.

52. The optical sensor according to claim 51, wherein the matrix is divided in half by the division line into a first light receiving element group and a second light receiving element group, and wherein the calculating portion compares respective output signals from the first light receiving element group and the second light receiving element group with each other in order to approximately calculate an incident direction of light.

53. The optical sensor according to claim 50,
wherein each of the light blocking film and the light transparent film has a multilayer structure, and
wherein the openings formed in each layer of the light blocking film define the angles of light incident on the respective light receiving surfaces.

54. The optical sensor according to claim 49,
wherein the control portion is an address decoder.

* * * * *